United States Patent
Yamazaki et al.

(10) Patent No.: US 7,776,667 B2
(45) Date of Patent: Aug. 17, 2010

(54) SEMICONDUCTOR DEVICE AND MANUFACTURING METHOD THEREOF, LIQUID CRYSTAL TELEVISION SYSTEM, AND EL TELEVISION SYSTEM

(75) Inventors: Shunpei Yamazaki, Tokyo (JP); Yukie Suzuki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 150 days.

(21) Appl. No.: 12/044,658

(22) Filed: Mar. 7, 2008

(65) Prior Publication Data

US 2008/0166860 A1 Jul. 10, 2008

Related U.S. Application Data

(63) Continuation of application No. 11/052,548, filed on Feb. 8, 2005, now Pat. No. 7,371,625.

(30) Foreign Application Priority Data

Feb. 13, 2004 (JP) ............................. 2004-037461

(51) Int. Cl.
*H01L 21/00* (2006.01)
(52) U.S. Cl. ............... 438/158; 438/780; 257/E21.028
(58) Field of Classification Search ................ 438/158, 438/159, 780; 257/E21.028
See application file for complete search history.

(56) References Cited

U.S. PATENT DOCUMENTS

| | | | |
|---|---|---|---|
| 5,304,407 A | 4/1994 | Hayashi et al. | |
| 5,438,241 A | 8/1995 | Zavracky et al. | |
| 5,580,801 A | 12/1996 | Maegawa et al. | |
| 5,827,775 A | 10/1998 | Miles et al. | |
| 6,013,542 A | 1/2000 | Yamazaki et al. | |
| 6,183,937 B1 | 2/2001 | Tsai et al. | |
| 6,580,212 B2 | 6/2003 | Friend | |
| 6,838,361 B2 * | 1/2005 | Takeo | 438/493 |

(Continued)

FOREIGN PATENT DOCUMENTS

CN 1388574 1/2003

(Continued)

OTHER PUBLICATIONS

Office Action for Chinese Patent Application No. 200510064080.8 dated Nov. 9, 2007, Applicant: Semiconductor Energy Laboratory Co., Ltd., pp. 1-9.

*Primary Examiner*—Chandra Chaudhari
(74) *Attorney, Agent, or Firm*—Nixon Peabody, LLP; Jeffrey L. Costellia

(57) ABSTRACT

It is an object of the present invention to provide a method for manufacturing a semiconductor device that has high driving ability (that is, large W/L) according to a method in which the use efficiency of a material is improved and the throughput and yield are enhanced. The present invention provides a method for a semiconductor device, which comprises the steps of forming a first conductive layer in contact with a semiconductor region, forming an insulating layer on the first conductive layer by one of droplet discharge and application, irradiating a portion of the insulating layer with laser light to form a mask pattern, and forming divided first conductive layers by etching with the use of the mask pattern as a mask.

15 Claims, 42 Drawing Sheets

U.S. PATENT DOCUMENTS

| | | |
|---|---|---|
| 6,989,333 B2 | 1/2006 | Watanabe et al. |
| 7,033,951 B2 | 4/2006 | Kido |
| 7,244,669 B2 * | 7/2007 | Sirringhaus et al. ......... 438/535 |
| 7,332,432 B2 | 2/2008 | Nakamura et al. |
| 7,439,086 B2 | 10/2008 | Yamazaki et al. |
| 2002/0105688 A1 | 8/2002 | Katagami et al. |
| 2002/0128515 A1 | 9/2002 | Ishida et al. |
| 2002/0163300 A1 | 11/2002 | Duineveld et al. |
| 2003/0030689 A1 | 2/2003 | Hashimoto et al. |
| 2003/0080436 A1 | 5/2003 | Ishikawa |
| 2003/0083203 A1 | 5/2003 | Hashimoto et al. |
| 2003/0129321 A1 | 7/2003 | Aoki |
| 2004/0005739 A1 | 1/2004 | Furusawa |
| 2004/0141023 A1 | 7/2004 | Nakamura |
| 2005/0043186 A1 | 2/2005 | Maekawa et al. |
| 2005/0095356 A1 | 5/2005 | Nakamura et al. |
| 2005/0158665 A1 | 7/2005 | Maekawa et al. |
| 2005/0163938 A1 | 7/2005 | Yamazaki et al. |
| 2005/0164423 A1 | 7/2005 | Maekawa et al. |
| 2007/0132377 A1 | 6/2007 | Yamazaki et al. |

FOREIGN PATENT DOCUMENTS

| | | |
|---|---|---|
| JP | 8-330595 | 12/1996 |
| JP | 09-260808 | 10/1997 |
| JP | 11-029873 | 2/1999 |
| JP | 11-251259 | 9/1999 |
| JP | 11-321073 | 11/1999 |
| JP | 11-326951 | 11/1999 |
| JP | 11-340129 | 12/1999 |
| JP | 2000-089213 | 3/2000 |
| JP | 2000-188251 | 7/2000 |
| JP | 2000-275678 | 10/2000 |
| JP | 2002-215065 | 7/2002 |
| JP | 2002-273869 | 9/2002 |
| JP | 2003-109794 | 4/2003 |
| JP | 2003-133691 | 5/2003 |
| JP | 2003-178872 | 6/2003 |
| JP | 2003-209339 | 7/2003 |
| JP | 2003-209340 | 7/2003 |
| JP | 2003-318133 | 11/2003 |
| JP | 2004-167488 | 6/2004 |
| JP | 2004-188410 | 7/2004 |
| WO | WO 2005-047967 | 5/2005 |

* cited by examiner

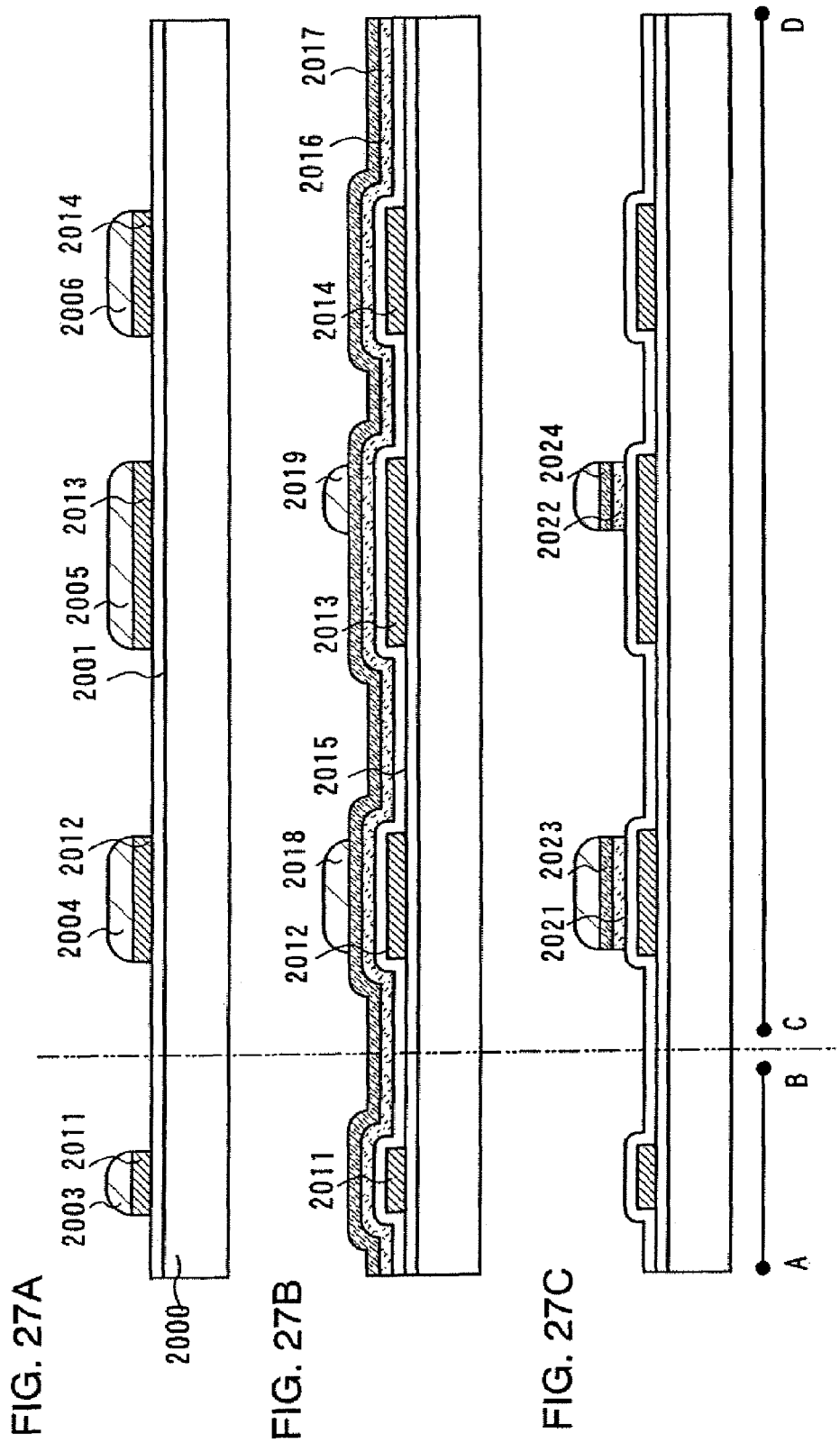

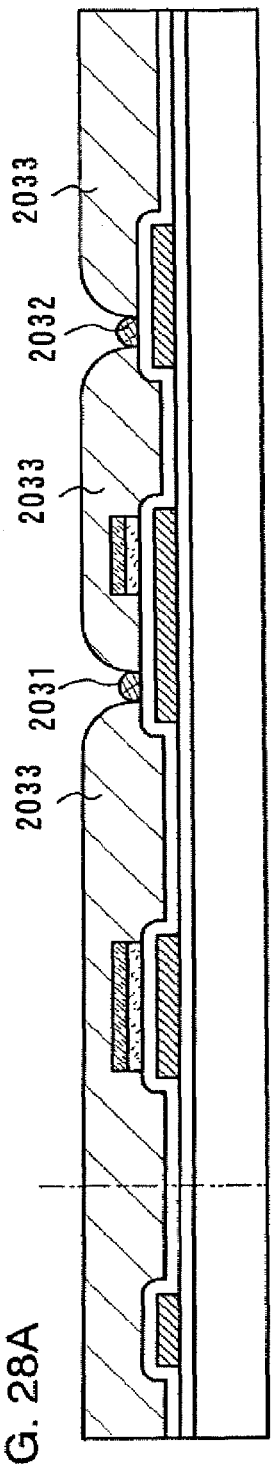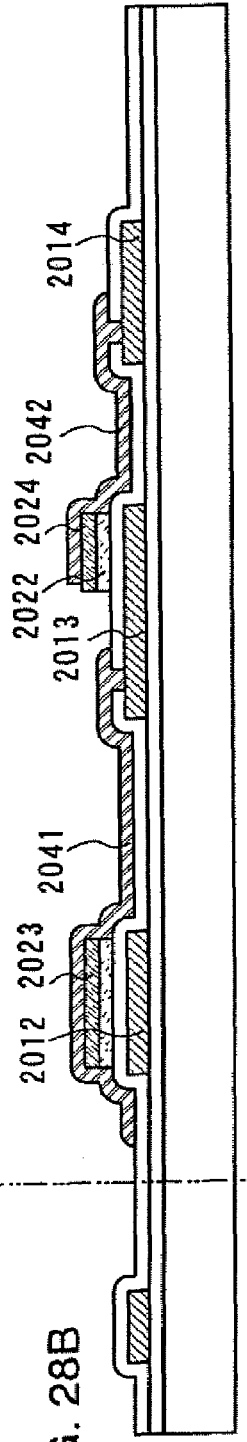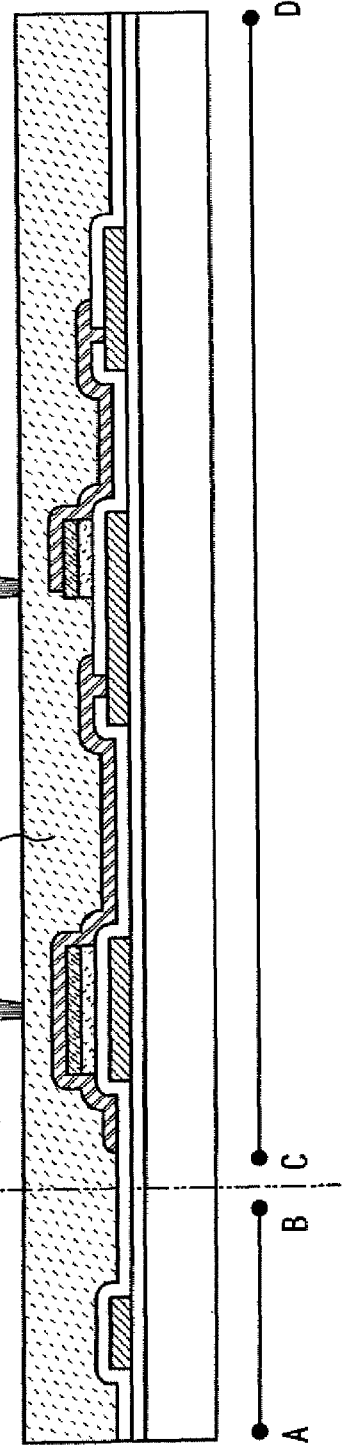

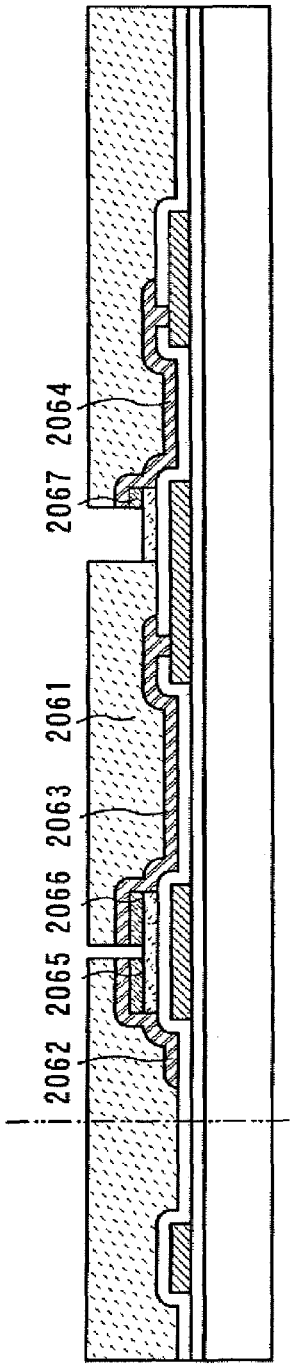
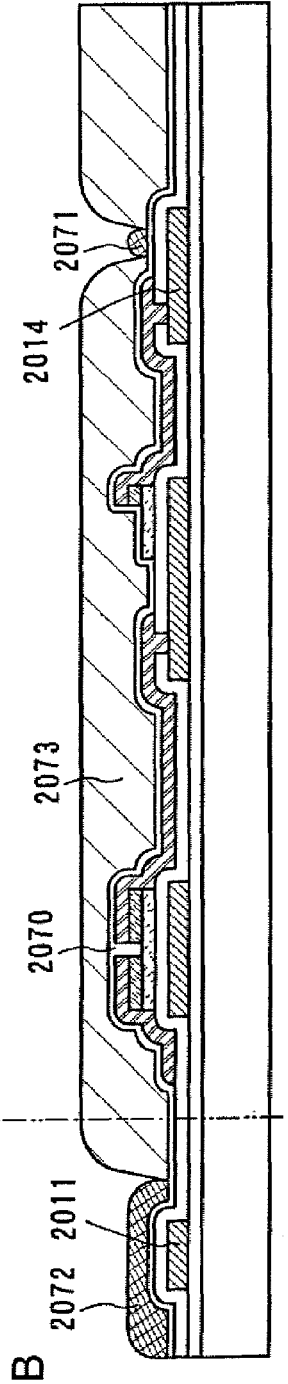
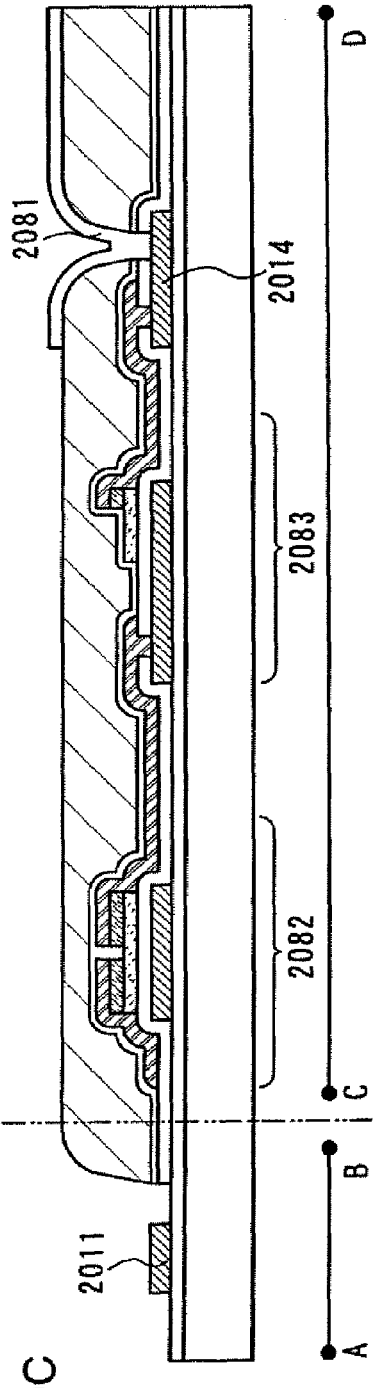
FIG. 29A
FIG. 29B
FIG. 29C

SEMICONDUCTOR DEVICE AND MANUFACTURING METHOD THEREOF, LIQUID CRYSTAL TELEVISION SYSTEM, AND EL TELEVISION SYSTEM

BACKGROUND OF THE INVENTION

1. Field of the Invention

The present invention relates to a method for manufacturing a semiconductor device by using droplet discharge typified by ink-jet.

2. Description of the Related Art

In manufacture of semiconductor devices, the use of droplet discharge has been examined for development of producing technologies by which a plurality of display panels is taken from one mother glass substrate for efficient mass production.

In order to form a film pattern for a conventional semiconductor device, a method for forming a film pattern is used, where a film (a film comprising a semiconductor material, an insulator material, or a conductive material) at a portion to be the film pattern is removed by etching with a resist pattern as a mask pattern after a photolithography process of forming the resist pattern by applying a resist on the whole area of a substrate, pre-baking the applied resist, and then, irradiation with light such as ultraviolet through a photomask and development of the irradiated resist.

On the other hand, in order to improve current-voltage characteristics, that is, driving ability, by increasing drain current of a TFT in a linear region and saturation region, for example, the electron mobility is improved, the capacitance of a gate insulating film is increased, and the ratio of a channel width to a channel length (hereinafter, referred to as W/L) is increased (refer to Patent Reference 1).

(Patent Reference 1) Japanese Patent Laid-Open No. 2000-275678

However, the process of forming a film pattern by using the conventional photolithography process has problems that most of the materials of the film pattern and resist are wasted and the number of processes for forming the mask pattern is large to decrease the throughput.

As one of methods for increasing W/L in order to improve current-voltage characteristics of a TFT, a method of expanding the channel width (W) can be given. However, this structure has a problem that the area of the TFT is increased. In the case of using a TFT as a switching element for a pixel of a transmissive display device, there are one or more TFTs in a pixel of a display portion. Therefore, the increase of the area of the TFT has a problem that the display region of the pixel region is limited to decrease the aperture ration of the display device.

In addition, as another method for increasing W/L, a method of reducing the channel length (L) can be given. However, in order to reduce the channel length (L) with the use of a droplet discharge system, it is necessary that a solution that has a small droplet size be discharged with the use of a small discharge nozzle in diameter to form a film pattern (a gate electrode or source and drain regions). However, in the case of a droplet discharge system that has a small discharge nozzle in diameter, the composition of a discharge solution adheres the tip of the discharge nozzle, dries, and solidifies to cause clogging makes it difficult to discharge a specific amount of discharge solution continuously and stably. Consequently, the method using the droplet discharge system has a problem that decrease in throughput and yield is caused.

SUMMARY OF THE INVENTION

The present invention is made in view of the foregoing situation, and it is an object of the present invention to provide a method for manufacturing a semiconductor device that has high driving ability (that is, large W/L) by a method in which the use efficiency of a material is improved and the throughput and yield are enhanced.

The present invention provides a semiconductor device formed according to a method that is capable of selectively forming one or more of patterns necessary for manufacturing the semiconductor, such as a conductive layer forming a wiring layer or an electrode, a semiconductor layer, a mask layer for forming a predetermined pattern, where the distance between a source electrode and a drain electrode or the distance between a source region and a drain region is 0.1 μm or more and 10 μm or less.

As the method, which is capable of selectively forming a pattern, droplet discharge (also referred to as ink-jet depending on the type) is used. The droplet discharge is capable of forming a predetermined pattern by selectively discharging droplets of a composition prepared for specific purpose to form a conductive layer, a semiconductor layer, an insulating layer, or the like.

The present invention further provides a method for manufacturing a semiconductor device, which comprises the steps of forming a first conductive layer in contact with a semiconductor region, forming an insulating layer on the first conductive layer by one of droplet discharge and application, irradiating a portion of the insulating layer with laser light to form a mask pattern, and forming divided first conductive layers by etching with the use of the mask pattern as a mask. Since the divided first conductive layers serve as source and drain regions or source and drain electrodes, the channel length roughly coincides with the width of the mask pattern. The insulating layer is a layer including a photosensitive resin or a liquid-repellent surface. By irradiating the insulating layer with laser light (also referred to as a laser beam), a portion irradiated with the laser light is reacted so that a modified mask pattern can be formed. Therefore, reduction of the beam width of the laser light makes the channel length more microscopic.

In addition, the semiconductor device in the present invention includes an integrated circuit, a display device, a wireless tag, an IC tag that comprise a semiconductor element, for example, a TFT. The display typically includes a liquid crystal display device, a light-emitting display device, a DMD (Digital Micromirror Device), a PDP (Plasma Display Panel), an FED (Field Emission Display), and an electrophoretic display device (an electronic paper). Note that the TFT in the preset invention is a staggered TFT, an inverted-staggered TFT (a channel etch type TFT or a channel protective TFT), or a coplanar TFT.

The display device in the present invention indicates a device using a display element, that is, an image display device. In addition, the display device includes all of a module to which a connector, for example, a flexible printed circuit (FPC), a (TAB Tape Automated Bonding) tape, or a TCP (Tape Carrier Package) is attached, a module in which a printed wiring board is attached to a tip of a TAB tape or a TCP, and a module in which an IC (integrated circuit) and a CPU (Central Processing Unit) are directly mounted on a display element by a COG (Chip On Glass) method.

The present invention includes structures below.

The present invention provides a semiconductor device comprising a gate electrode, a gate insulating film, a semiconductor region, a source electrode, and a drain electrode, where at least one of the gate electrode, the semiconductor region, the source electrode, and the drain electrode is formed by droplet discharge, and where the distance between the source electrode and the drain electrode is 0.1 µm or more and 10 µm or less.

In addition, a conductive layer can be provided between the semiconductor region and the source and drain electrodes. In this case, the conductive layer serves as a source region and a drain region.

Further, opposed edge portions of the source and drain electrodes, and source and drain regions may be bent or curved with a certain distance kept therebetween. In this case, the edge portions are linearly bent or curved, or have a line and a curve.

The present invention further provides a method for manufacturing a semiconductor device, which comprises the steps of forming a first conductive layer in contact with a semiconductor region, forming an insulating layer on the first conductive layer by one of droplet discharge and application, irradiating a portion of the insulating layer with laser light to form a mask pattern, and forming divided first conductive layers by etching with the use of the mask pattern as a mask.

The insulating layer is formed by using a photosensitive resin or a material for forming a liquid-repellent surface. In the case of forming the insulating layer by using the material for forming the liquid-repellent surface, the mask pattern is formed around the insulating layer by using a liquid-attracting material.

The divided first conductive layers serve as a source region and a drain region, and a second conductive layer may be formed on the divided first conductive layers by droplet discharge.

In addition, the first conductive layer can be formed by droplet discharge. In this case, the divided first conductive layers serve as a source electrode and a drain electrode.

The divided first conductive layers may serve as a source electrode, a drain electrode, a source region, and a drain region.

The present invention further provides a method for manufacturing a semiconductor device, which comprises the steps of forming a conductive semiconductor region on one of a conductive layer and a semiconductor region, applying or dropping a photosensitive material on the conductive semiconductor region, exposing the photosensitive material with laser light and developing the exposed photosensitive material to form a first mask pattern and dividing the conductive semiconductor region with the use of the mask pattern as a mask.

The present invention further provides a method for manufacturing a semiconductor device, which comprises the steps of forming a conductive semiconductor region on one of a conductive layer and a semiconductor region, forming a conductive film on the conductive semiconductor region, applying or dropping a photosensitive material on the conductive film, exposing the photosensitive material with laser light and developing the exposed photosensitive material to form a first mask pattern, and dividing the conductive semiconductor region after dividing the conductive film with the use of the mask pattern as a mask.

The divided conductive semiconductor regions serve as a source region and a drain region.

The present invention further provides a method for manufacturing a semiconductor device, which comprises the steps of forming a semiconductor region on one of a conductive layer and an insulating film, forming a film with a liquid-repellent surface on the semiconductor region by one of droplet discharge and application, forming a film with a liquid-attracting surface by irradiating a portion of the film with the liquid-repellent surface with laser light, and forming a conductive semiconductor region on the film with the liquid-attracting surface.

The present invention further provides a method for manufacturing a semiconductor device, which comprises the steps of forming a first semiconductor region on an insulating film, forming a conductive semiconductor region on the first semiconductor region, forming a first film with a liquid-repellent surface on the conductive semiconductor region by one of droplet discharge and application, forming a second film having a region with a liquid-repellent surface and a liquid-attracting surface by irradiating a portion of the first film with the liquid-repellent surface with laser light, forming a second insulating film on the second film having the region with liquid-attracting surface, forming a second semiconductor region by etching the second film having the region with liquid-repellent surface and the conductive semiconductor region using the second insulating film, and forming a conductive layer in contact with the second semiconductor region.

The present invention further provides a method for manufacturing a semiconductor device, which comprises the steps of forming a semiconductor region on an insulating film, forming a first film with a liquid-repellent surface on the semiconductor region by one of droplet discharge and application, forming a second film having a region with a liquid-repellent surface and a liquid-attracting surface by irradiating a portion of the first film with the liquid-repellent surface with laser light, forming a second insulating film on the second film having a region with liquid-attracting surface, forming a conductive semiconductor region by removing the second film with a liquid-repellent surface and forming a conductive film in contact with the conductive semiconductor region.

The present invention further provides a liquid crystal television system or an EL television system formed according to the method described abode, which has a device in which the distance between the source electrode and the drain electrode is 0.1 µm or more and 10 µm or less.

As in the present invention, when a film pattern such as a wiring layer for a device, a conductive layer for forming an electrode, a semiconductor layer, or a mask layer for forming a predetermined pattern is formed by using droplet discharge, droplets can be discharged on any position by changing a nozzle that is a discharge nozzle for droplets including the material of the film and a substrate in relative position. In addition, depending on the nozzle size, the discharge amount of droplet, and the relative relation between the mobility speeds of the nozzle and a substrate on which discharged droplets are formed, the thickness and width of the pattern to be formed can be controlled. Therefore, also on a large-area substrate over 1 to 2 m on side, a film pattern can be formed by discharge accurately at a desired position.

In addition, by forming source and drain regions or source and drain electrodes for an element with the use of a mask pattern formed by exposure with a laser beam and development, an element that has a microscopic structure and an increased W/L can be formed while omitting exposure and development processes with the use of a photomask, namely, photolithography process. Therefore, a semiconductor device that has higher driving ability can be manufactured at lower cost with higher throughput and yield.

BRIEF DESCRIPTION OF THE DRAWINGS

In the accompanying drawings:

FIGS. 27A to 27C are cross-sectional views illustrating a process for manufacturing a semiconductor device according to the present invention;

FIGS. 28A to 28C are cross-sectional views illustrating the process for manufacturing a semiconductor device according to the present invention;

FIGS. 29A to 29C are cross-sectional views illustrating the process for manufacturing a semiconductor device according to the present invention;

DETAILED DESCRIPTION OF THE INVENTION

Figure 1A:
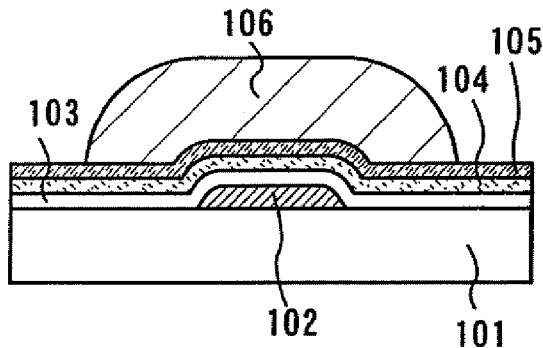
FIGS. 1A to 1E are cross-sectional views illustrating a process for manufacturing a semiconductor device according to the present invention.

Embodiment modes and embodiments are hereinafter described with reference to drawings. Since the present invention can be embodied in various modes, it is to be understood by those skilled in the art that the modes and the details of the present invention can be changed and modified within the content and the scope of the present invention. Therefore, the present invention is not limited to the description of the embodiment modes and the embodiments. The same reference numerals are given to the same parts throughout the drawings and the detailed explanation to such parts is not repeated.

Embodiment Mode 1

In this embodiment mode, a process will be described with reference to FIGS. 1A to 1E, where a mask pattern that is formed by irradiation with a laser beam (hereinafter, also referred to as laser light) is used to form a TFT with a short channel length.

Specifically, a process for forming a channel etch type TFT, which is one of inverted-staggered TFTs, as a semiconductor element will be described in this embodiment.

As shown in FIG. 1A, a first conductive layer 102 is formed over a substrate 101. As a method for forming the first conductive layer 102, droplet discharge, printing, electrolytic plating, PVD, or CVD is used. For example, in the case of employing PVD or CVD, the first conductive layer 102 can be formed in such a way that a conductive layer is formed over the substrate 101, a photosensitive resin is formed thereon, the photosensitive resin is irradiated with laser light and developed to form a mask pattern, and then the conductive layer is etched into a desired shape by using the mask pattern. Moreover, when the first conductive layer 102, which serves as a gate electrode later, is formed so as to have a plurality of conductive layers, a multi-gate electrode can be formed. In this embodiment mode, by using droplet discharge, a composition including a conductive material is selectively discharged over the substrate 101 to form the first conductive layer 102. In this case, since an etching process with the use of a mask pattern is not necessary, the manufacturing process can be simplified considerably.

As the substrate 101, a glass substrate, a quartz substrate, a substrate comprising an insulating material, for example, a ceramic such as alumina, a heat-resistant plastic substrate that can withstand a processing temperatures in the following processes, a silicon wafer; a metal plate, or the like can be used. Moreover, the substrate 101 may have a large size, for example, 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm.

As the first conductive layer 102, a single layer comprising an element selected from the group consisting of titanium (Ti), aluminum (Al), tantalum (Ta), tungsten (W), molybdenum (Mo), copper (Cu), chromium (Cr), neodium (Nd), iron (Fe), nickel (Ni), cobalt (Co), ruthenium (Ru), rhodium (Rh), palladium (Pd), Osmium (Os), iridium (Ir), silver (Ag), gold (Au), platinum (Pt), cadmium (Cd), zinc (Zn), silicon (Si), germanium (Ge), zirconium (Zr), and barium (Ba) or comprising an alloy material mainly including any the element, or a lamination layer of these may be used.

In the case of forming the first conductive layer 102 by droplet discharge, a conductor dissolved or diffused in a solvent is used as a composition discharged from a nozzle. As the conductor, metal particles such as Ag, Au, Cu, Ni, Pt, Pd, Ir, Rh, W, Al, Ta, Mo, Cd, Zn, Fe, Ti, Si, Ge, Zr, or Ba, fine particles of metal halide, or dispersive nanoparticles can be used. Alternatively, indium tin oxide (ITO), zinc oxide (ZnO), indium zinc oxide (IZO), gallium-doped zinc oxide (GZO), indium tin oxide including silicon oxide, organic indium, organic tin, or the like, which is used as a transparent conductive film, can be used. Furthermore, the first conductive layer 102 can be formed by laminating conductive layers comprising these materials.

As the composition discharged from the nozzle, in consideration of the specific resistance value, it is preferable to use one material of gold, silver, and copper dissolved or diffused in a solvent. More preferably, silver or copper, which has lower resistance and is less expensive, is used. However, when copper is used, a barrier film is preferably provided in combination as a countermeasure against impurities. As the solvent for the composition, organic solvents, for example, esters such as butyl acetate and ethyl acetate, alcohols such as isopropylalcohol and ethylalcohol, methyl ethyl ketone, and acetone, may be used.

For the barrier film in the case of using copper as the composition, an insulating or conductive material including nitrogen, such as silicon nitride, silicon oxynitride, aluminum nitride, titanium nitride, or tantalum nitride (TaN), is preferably used, which may be formed by droplet discharge.

The viscosity of the composition to be used in droplet discharge, is preferably in the range of 5 to 20 mPa·s in order to prevent drying of the composition and to discharge the composition smoothly from the nozzle. The surface tension thereof is preferably 40 N/m or less. The viscosity and the like of the composition may be adjusted appropriately in accordance with the solvent to be used and the intended purpose.

It is preferable that each particle diameter of the conductor is small as much as possible in order to prevent the clogging of the nozzle and to manufacture an extremely-fine pattern although the particle diameter depends on the diameter of the nozzle, the shape of a desired pattern, and the like. Preferably, the particle diameter is 0.1 μm or less be composition is formed by a known method such as an electrolytic method, an atomizing method, or a wet reduction method to have a particle diameter in the range of approximately 0.5 to 10 μm generally. However, when the composition is formed by a gas evaporation method, each nanoparticle protected with a dispersing agent is as fine as approximately 7 nm in size. Furthermore, when a coating agent is used to cover the surface of these nanoparticle, the nanoparticles are not aggregated in the solvent and are uniformly dispersed in the solvent at room temperature, and a similar behavior to that of liquid is exhibited. Accordingly, the coating agent is preferably used.

The composition may be discharged under reduced pressure. This is because the following process of drying and baking can be omitted or shortened due to volatilization of the solvent of the composition after the discharge of the composition before landing on an object to be processed. After the discharge of the composition, depending on the material of the composition, one or both processes of drying and baking are performed under normal pressure or reduced pressure by laser irradiation, rapid thermal annealing, a heating furnace, or the like. Although the both processes of drying and baking require heat treatment, the purpose, temperature, and time for drying are different from those for baking. For example, the drying process is performed at 100° C. for 3 minutes, and the baking process is performed at 200 to 350° C. for 15 to 120 minutes. In order to perform the drying and the baking processes well, the substrate may be heated at temperatures from 100 to 800° C., preferably from 200 to 350° C., although the temperature depends on the material of the substrate or the like. This process volatilizes the solvent in the composition or removes the diffusing agent chemically so as to cure and shrink the peripheral resin, by which fusion and welding are accelerated. The atmosphere for the process is an oxygenic atmosphere, a nitrogenous atmosphere, or the air. However, it is preferable to employ an oxygenic atmosphere under which the solvent in which the metal element is decomposed or the diffused is easily removed.

The laser light irradiation may be performed by using a continuous wave or pulsed gas laser or using a continuous wave or pulsed solid-state laser. The gas laser includes an excimer laser, and the solid-state laser includes a laser using a crystal such as YAG or YVO$_4$ doped with Cr, Nd, or the like. Note that a continuous wave laser is preferably used in point of the absorption ratio of the laser light. Alternatively, so-called hybrid laser irradiation in which a continuous wave laser is used in combination with a pulsed laser may be used. However, depending on the heat resistance of the substrate, the heat treatment by the laser irradiation is preferably as short as several microseconds to several tens seconds. The rapid thermal annealing (RTA) is performed in such a way that an infrared lamp or a halogen lamp emitting ultraviolet to infrared light is used under an inert gas atmosphere to increase temperature rapidly so that heat is added instantaneously for several microseconds to several minutes. This treatment, which is performed instantaneously, can heat substantially only a thin film in an upper part, and has the advantage having no effect on the other film in the lower part.

The conductive layer formed by droplet discharge has a structure in which the particles irregularly overlap each other in three dimensions. Namely, the conductive layer includes three-dimensional aggregation particles. Therefore, the surface of the conductive layer has fine irregularity (concavity and convexity). Moreover, by heating the conductive layer, the particles are baked to increase the grain diameter. Accordingly, the surface of the conductive layer has a larger difference between the top and the bottom of the irregularity. Depending on the heating temperature, atmosphere, and the time in the heating, a binder including an organic material remains in the conductive layer.

In this embodiment mode, the first conductive layer 102 from 600 to 800 nm in thickness is formed by discharging the composition including Ag (hereinafter, referred to as a Ag paste) selectively and appropriately performing a heat treatment or laser beam irradiation as described above for drying and baking. When the baking is performed under an O$_2$ atmosphere, an organic material in the Ag paste such as a binder (a thermosetting resin) is decomposed so that a Ag film hardly including an organic material can be obtained. Moreover, the surface of the film can be made flat and smooth.

Before forming the first conductive layer 102, it is preferable to form a base layer by a method such as sputtering or evaporation on the surface of the substrate 101, which is formed by using a metal material selected from the group consisting of Ti (titanium), W (tungsten), Cr (chromium), Ta (tantalum), Ni (nickel), and Mo (molybdenum) or by using an oxide of the metal material. The base layer may be formed to have a thickness of 0.01 to 10 μm. Since the formed base layer may be quite thin, it is not always necessary that the base layer have a multilayer structure. Since the base layer is formed to form the first conductive layer 102 with sufficient adhesiveness, the base layer may not be formed when the sufficient adhesiveness can be obtained. When the base layer is a conductive layer, the first conductive layer 102 may be used as the mask pattern so as to etch the base layer.

Moreover, the first conductive layer 102 can be formed also in such a way that an insulating layer with a depressed portion is formed first and a droplet including a conductive material is discharged so as to fill the depressed portion. In this case, it is preferable that the insulating film has the same height as the first conductive layer filling in the depressed portion of the insulating film. With this structure, a first insulating layer and a semiconductor layer, which will be formed later, also have flatness, and a breakdown in these layers due to a step therebetween can be prevented. Moreover, miniaturization of wirings can be achieved by controlling the width of the depressed portion. Furthermore, the wirings can be made thicker by controlling the depth of the depressed portion. When a coloring layer is provided in the insulating film with the depressed portion, it is possible to manufacture a display device capable of full-color displaying without using a color filter.

Next, a first insulating film 103, a first semiconductor film 104, a second semiconductor film 105 are formed sequentially over the substrate 101 and the gate electrode (first conductive layer 102). In a TFT to be formed later, the first insulating film 103, the first semiconductor film 104, and the second semiconductor layer 105 serve as a gate insulating film, a channel-forming region, and source and drain regions, respectively.

The first insulating film 103 is formed by using a thin-film forming method such as plasma CVD or sputtering to have a single-layer structure of silicon nitride, silicon oxide, or another insulating film including silicon, or a laminated structure thereof. It is preferable that the first insulating film 103 is made to have a laminated structure of a silicon nitride film (a silicon nitride oxide film), a silicon oxide film, and a silicon nitride film (a silicon nitride oxide film) formed in this order from the side of the gate electrode. In this structure, since the gate electrode is in contact with the silicon nitride film, deterioration due to oxidation can be prevented.

As the first semiconductor film 104, a film including any selected from the groups consisting of an amorphous semiconductor, a semi-amorphous semiconductor (also referred to as an SAS) in which an amorphous state and a crystalline state are mixed, a microcrystalline semiconductor (μc) in which an amorphous semiconductor includes a crystal grain from 0.5 to 20 nm, and a crystalline semiconductor, is formed. In any case, a semiconductor film mainly including silicon, silicon germanium (SiGe), or the like can be formed to have a thickness from 10 to 60 nm.

The SAS has an intermediate structure between an amorphous structure and a crystalline structure (including a single crystal and a polycrystal) and has a third state that is stable in free energy. Moreover, the SAS includes a crystalline region that has a short-range order and a lattice distortion. At least in a region of a SAS film, a crystalline region from 0.5 to 20 nm can be observed, and the raman spectrum is shifted to a lower wavenumber than 520 cm$^{-1}$ in the case of including silicon as a main component. According to X-ray diffraction, diffraction peaks of (111) and (220), which are considered peaks due to a silicon crystal lattice, are observed. As a terminating agent for dangling bonds, hydrogen or halogen is included at 1 atomic % or more in the SAS.

The SAS can be obtained by glow discharge decomposition of a silicide gas typified by SiH$_4$. In addition, gasses such as Si$_2$H$_6$, SiH$_2$Cl$_2$, SiHCl$_3$, SiCl$_4$, and SiF$_4$ can be used as the silicide gas. The SAS can be easily formed by using the silicide gas diluted with hydrogen, fluorine, or one of hydrogen and fluorine and one or more of rare gas elements selected from the group consisting of helium, argon, krypton, and neon. In this case, it is preferable that the silicide gas is diluted to have a dilution ratio from 10 to 1000 times. Moreover, the SAS can be formed by using Si$_2$H$_6$ and GeF$_4$ diluted with helium. It is preferable to form the film by glow discharge decomposition under reduced pressure in the range of approximately 0.1 to 133 Pa. In order to generate glow discharge, high-frequency electric power from 1 to 120 MHz, preferably 13 to 60 MHz, may be applied. The substrate heating temperature is preferably 300° C. or less, more preferably in the range of 100 to 250° C.

The crystalline semiconductor film can be formed by crystallizing an amorphous semiconductor film or a SAS by heating or laser irradiation. Alternatively, the crystalline semiconductor film may be formed directly, where a fluorinated gas such as $GeF_4$ or $F_2$ and a silane gas such as $SiH_4$ or $Si_2H_6$ are used and heat or plasma is used.

The second semiconductor film 105 is conductive, and doped with a Group 15 element, typically phosphorus or arsenic in the case of forming an n-channel TFT. In the case of forming a p-channel TFT, the second semiconductor film 105 is doped with a Group 13 element typified by boron. The second semiconductor film 105 is formed by plasma CVD using a silicide gas to which a gas including a Group 13 or 15 element such as boron, phosphorus, or arsenic is added. Alternatively, after forming a semiconductor film, the conductive second semiconductor film 105 can be formed by applying a solution including a Group 13 or 15 element to the semiconductor film and irradiating the semiconductor film with a laser beam. As the laser beam, a laser beam emitted from a known pulsed laser or a continuous wave laser is appropriately used.

Next, a first mask pattern 106 is formed on the second semiconductor film 105. It is preferable to form the first mask pattern 106 by using a heat-resistant polymer material, for example, by droplet discharge of a polymer material that has an aromatic ring or a heterocyclic ring as a principal chain and includes a highly-polar hetero atom group with a small aliphatic portion. As typical examples of the polymer material, there are polyimide, polybenzoimidazole, and the like. In the case of using polyimide, the first mask pattern 106 can be formed by discharging a composition including polyimide from a discharge nozzle to the second semiconductor film 105 and baking the composition at 200° C. for 30 minutes.

Alternatively, the first mask pattern 106 can be formed by forming a mask pattern with a liquid-repellent surface in advance and applying or discharging a polymer material to a region that is not covered with the mask pattern with the liquid-repellent surface.

Figure 1B:
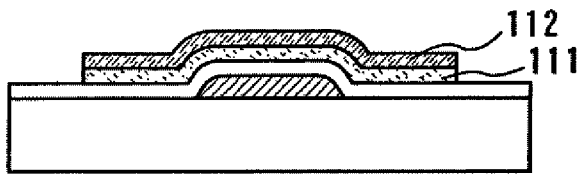

Next, as shown in FIG. 1B, the second semiconductor film 105 and the first semiconductor film 104 are etched with the use of the first mask pattern 106 to form a first semiconductor region 111 and a second semiconductor region 112. After that, the first mask pattern 106 is removed.

The first semiconductor film 104 and the second semiconductor film 105 can be etched by using a chlorinated gas typified by $Cl_2$, $BCl_3$, $SiCl_4$, or $CCl_4$, a fluorinated gas such as $CF_4$, $SF_6$, $NF_3$, or $CHF_3$, or $O_2$.

The first semiconductor region 111 can be formed with the use of an organic semiconductor material by a method such as printing, spraying, or spin coating, droplet discharge. In this case, since the etching process is not necessary, the number of processes can be reduced. As the organic semiconductor material to be used in the present invention, a π-electron conjugated polymer material that has skeleton including a conjugated double bond is preferable. Specifically, soluble polymer materials such as polythiophene, poly (3-alkylthiophene), polythiophene derivatives, and pentacene can be used.

In addition, there is a material as the organic semiconductor material, which can be used in the present invention. In this case, the first semiconductor region 111 can be formed by forming a soluble precursor of the material and then performing a process. The organic semiconductor material through a precursor includes polythienylenevinylene, poly (2,5-thienylenevinylene), polyacetylene, polyacetylene derivatives, polyallylenevinylene.

The precursor is changed into the organic semiconductor not only by performing a heat treatment but also by adding a reaction catalyst such as a hydrogen chloride gas. Moreover, as a typical solvent for dissolving the soluble organic semiconductor material, toluene, xylene, chlorobenzene, dichlorobenzene, anisole, chloroform, dichloromethane, γ-butyrolactone, butylcellosolve, cyclohexane, N-methyl-2-pyrrolidone (NMP), cyclohexanone, 2-butanon, dioxane, dimethylformamide (DMF), tetrahydrofuran (THF), and the like can be applied.

When an organic semiconductor is used for the first semiconductor region 111, a conductive layer (a contact layer) comprising an organic conductive material such as polyacetylene, polyaniline, poly-ethylenedioxythiophene (PEDOT), or poly-styrene sulfonate (PSS) can be formed instead of the conductive second semiconductor region 112. The conductive layer serves as a source region and a drain region.

As the conductive layer in contact with the organic semiconductor layer, a conductive layer comprising a metal element can be used instead of the conductive layer comprising the organic material. In this case, since many of the organic semiconductor materials are included in a p-type semiconductor that transports a hole as a carrier, it is desirable to use a metal with a large work function in order to have an ohmic contact with the semiconductor layer.

Specifically, it is desirable to use a metal selected from the group consisting of gold, platinum, chromium, palladium, aluminum, indium, molybdenum, and nickel, or an alloy thereof (including one or more of the metals mentioned above), or the like. The conductive layer can be formed with the use of a conductive paste including the metal or the alloy by printing, roll coating, or droplet discharge.

Moreover, the organic semiconductor layer, the conductive layer comprising the organic conductive material, and the conductive layer comprising the metal element may be laminated.

Figure 1C:
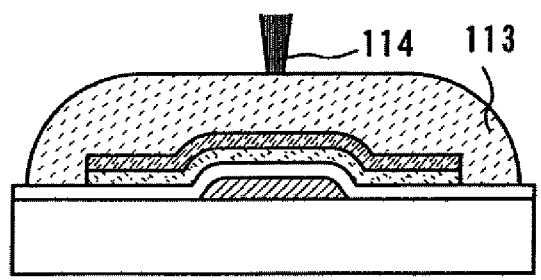

Next, as shown in FIG. 1C, a photosensitive resin 113 is applied over the substrate. As a method for applying the photosensitive resin 113, a coating method using a liquid, for example, droplet discharge, ink-jet, spin coating, roll coating or slot coating can be used. As the photosensitive resin, a negative photosensitive resin or a positive photosensitive resin that is sensitive to light from ultraviolet to infrared.

As the photosensitive resin, a photosensitive resin material such as an epoxy resin, an acrylic resin, a phenol resin, a novolak resin, an acrylic resin, a melamine resin, or an urethane resin is used. Moreover, a photosensitive organic material such as benzocyclobutene, parylene, flare, or polyimide can be used. As a typical positive photosensitive resin, there is a photosensitive resin including a novolak resin and a naphthoquinonediazide compound that is a photosensitizing agent. As a negative photosensitive resin, there is a photosensitive resin including a base resin, diphenylsilanediol, and an oxygen generator. In this embodiment mode, a positive photosensitive resin is used.

Next, for exposure, the photosensitive resin 113 is irradiated with a laser beam (hereinafter, also referred to as laser light) 114 with the use of a laser direct image system.

Figure 39:
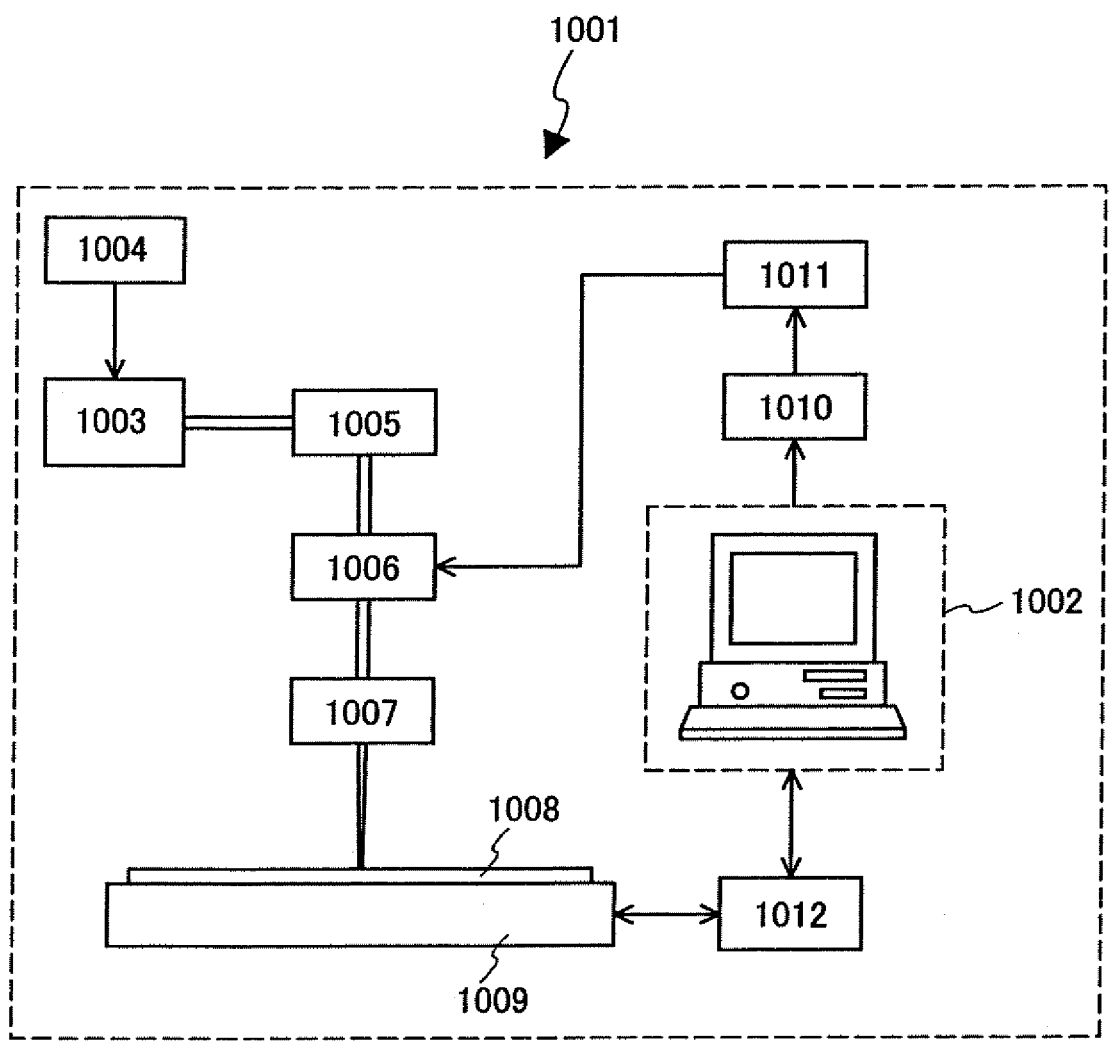
FIG. 39 is a schematic view illustrating a laser direct image system according to the present invention.

The laser direct imaging system will be described with reference to FIG. 39. As shown in FIG. 39, a laser direct imaging system 1001 includes a personal computer (hereinafter, referred to as a PC) 1002 that executes various controls in irradiation with a laser beam, a laser oscillator 1003 that outputs a laser beam, a power supply 1004 for the laser oscillator 1003, an optical system (ND filter) 1005 for attenuating a laser beam, an acousto-optic modulator (AOM) 1006 for modulating the intensity of a laser beam, an optical system

1007 including a lens for expanding or reducing the cross section of a laser beam and a mirror for changing the optical path of the laser beam, a substrate-moving mechanism 1009 including an X stage and a Y stage, a D/A converter 1010 for digital/analog conversion of control data output from the PC, a driver 1011 that controls the acousto-optic modulator 1006 in accordance with the analog voltage output from the D/A converter, and a driver 1012 that outputs a driving signal for driving the substrate-moving mechanism 1009.

As the laser oscillator 1003, a laser oscillator capable of emitting ultraviolet, visible, or infrared light can be used. As the laser oscillator, an excimer laser oscillator using a material such as KrF, ArF, KrF, XeCl, Xe, or the like, a gas laser oscillator using a material such as He, He—Cd, Ar, He—Ne, HF, or the like, a solid-state laser oscillator using a crystal such as YAG, GdVO$_4$, YVO$_4$, YLF, or YAlO$_3$ doped with Cr, Nd, Er, Ho, Ce, Co, Ti, or Tm, and a semiconductor laser oscillator using GaN, GaAs, GaAlAs, InGaAsP, or the like can be used. When the solid-state laser is used, it is preferable to use the second harmonic to the fifth harmonic of the fundamental wave.

Next, a method for exposing the photosensitive resin by using the laser direct imaging system will be described. When a substrate 1008 is loaded on the substrate moving-mechanism 1009, the PC 1002 detects the position of a marker given to the substrate 1008 with the use of a camera (not shown). Next, the PC 1002 produces data for moving the substrate-moving mechanism 1009 based on positional data of the detected marker and image pattern data input in advance. Then, after a laser beam emitted from the laser oscillator 1003 is attenuated by the optical system 1005, the PC 1002 controls the output light intensity of the acousto-optic modulator 1006 through the driver 1011 to control the light intensity so as to be a predetermined amount by the acousto-optic modulator 1006. After that, the optical path and the beam shape of the laser beam emitted from the acousto-optic modulator 1006 are changed by the optical system 1007, the laser beam is condensed by the lens, and then, the photosensitive resin applied on the substrate 1008 is exposed by irradiation with the laser beam. On this occasion, the substrate-moving mechanism 1009 is controlled to move in the X direction and the Y direction based on the data for moving produced by the PC 1002. Thus, the predetermined region is irradiated with the laser beam to expose the photosensitive resin.

Figure 1D:
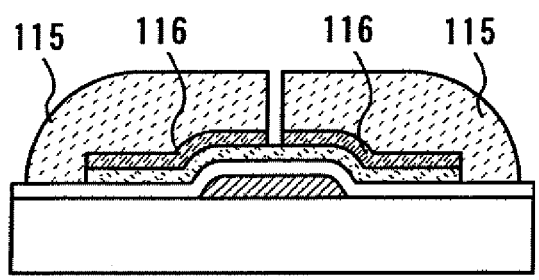

After that, the photosensitive resin is developed to form a second mask pattern 115 as shown in FIG. 1D. In this embodiment mode, since the positive photosensitive resin is used, a portion of the resist, which is irradiated with the laser beam, is removed to expose the second semiconductor region 112. Since the energy of the laser light is partly converted into heat on the resist to react a portion of the resist, the exposed width becomes slightly larger than the width of the beam spot. Moreover, as the wavelength of the laser beam is shorter, the laser beam can be condensed to have a shorter beam diameter. Therefore, in order to form the second mask pattern to have a more microscopic opening in width, it is preferable to perform the irradiation with a laser beam with a shorter wavelength.

The beam spot on the surface of the photosensitive resin is shaped by the optical system to be a dot, a circle, an ellipse, a rectangle, or a line (a long rectangle in the strict sense). Although the beam spot may be circular, a linear beam spot is preferable since a resist mask with a uniform width can be formed.

Although the system illustrated in FIG. 39 shows an example in which irradiation with the laser beam for exposure is performed from a side above the surface of the substrate, the irradiation with the laser beam for exposure may be performed from a side below the rear surface of the substrate by changing the optical system and the substrate-moving mechanism appropriately.

Although the irradiation with the laser beam is performed selectively by moving the substrate in this embodiment mode, the present invention is not limited to this. The irradiation with the laser beam may be performed by scanning the laser beam in the X—Y directions. In this case, it is preferable to use a polygon mirror, a galvanometer mirror, or an acoust-optic deflector (AOD) for the optical system 1007.

Next, the second semiconductor region 112 is etched by using the second mask pattern 115 to form source and drain regions 116 (also referred to as a contact layer). After that, the second mask pattern 115 is removed by a process using a peeling solution or an ashing process using oxygen. Since the second mask pattern 115 has a microscopic opening in width, the width of the etched second semiconductor region is minute so that the space between the source region and the drain region is small. Namely, a TFT with a short channel length can be formed without using a photomask.

In the case where the first semiconductor region 111 is formed by using an SAS, in addition to a structure in which the gate electrode is covered with the source and drain regions as shown in this embodiment mode, a structure in which an edge portion of the source and drain regions is aligned with an edge portion of the gate electrode, which is so-called self-aligning structure, and a structure in which the source and drain regions are formed with a certain distance kept from the gate electrode without covering the gate electrode can also be employed.

Figure 1E:
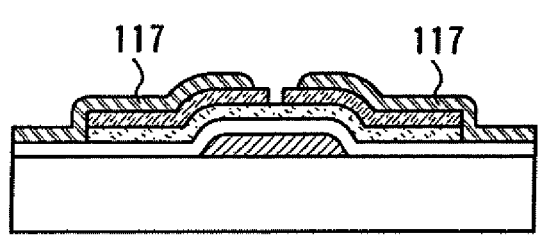

Next, as shown in FIG. 1E, a second conductive layer 117 that serves as a source electrode and a drain electrode is formed on the source and drain regions by discharging a conductive material according to droplet discharge. As the conductive material, the same material as the material used for the first conductive layer 102, which is dissolved or diffused in a solvent, can be used. In this present embodiment mode, an Ag paste is selectively discharged, and then, drying and baking are appropriately performed by laser beam irradiation as described above or a heat treatment to form each electrode from 600 to 800 nm in film thickness.

In the TFT formed in this embodiment mode, the distance between the source and drain regions, which are opposed to each other is slightly different from the distance between the source and drain electrodes, which are opposed each other, and the distance between the source and drain regions is shorter. In addition, the distance between the source and drain regions is a channel length.

The source and drain electrodes may be formed in such a way that a conductive layer is formed in advance by a method such as droplet discharge or sputtering, a negative or positive photosensitive resin is formed by droplet discharge, the photosensitive resin is irradiated with laser light for exposure and developed to form a mask pattern, and the conductive film is etched with the use of the mask pattern.

It is preferable to form a passivation film on the second conductive layer 117, which serves as the source and drain electrodes. The passivation film may be formed by using a thin-film forming method such as plasma CVD or sputtering and using silicon nitride, silicon oxide, silicon nitride oxide, silicon oxynitride, aluminum oxynitride, aluminum oxide, diamond-like carbon (DLC), carbon nitride (CN), or another insulating material.

According to the process described above, a channel etch type TFT with a short channel length can be manufactured without using a photomask.

Embodiment Mode 2

In this embodiment mode, with reference to FIGS. 2A to 2D, a process for forming a channel etch type TFT as in Embodiment Mode 1 will be described. This embodiment mode is different from Embodiment Mode 1 in the process for manufacturing the source electrode and the drain electrode.

Figure 2A:
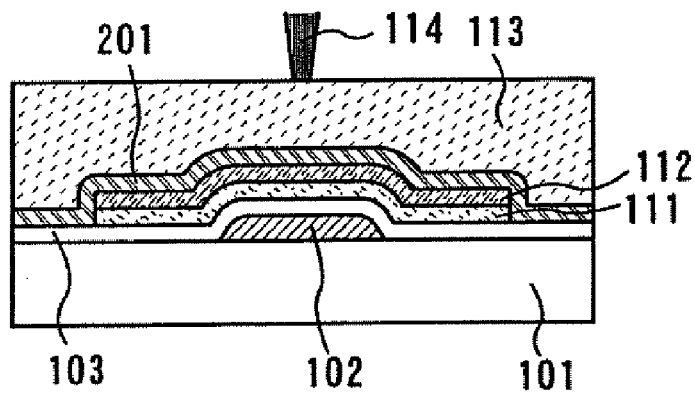
FIGS. 2A to 2D are cross-sectional views illustrating a process for manufacturing a semiconductor device according to the present invention.

As shown in FIG. 2A, a first conductive layer 102, a first insulating layer 103, a first semiconductor region 111, and a second semiconductor region 112 are formed over a substrate 101 in the same way as in Embodiment Mode 1.

Next, a second conductive film 201 is formed on the second semiconductor region 112 and the first insulating film 103. The material and manufacturing process of the second conductive film 201 can be the same as those of the first conductive layer 102 in the Embodiment Mode 1.

Figure 2B:
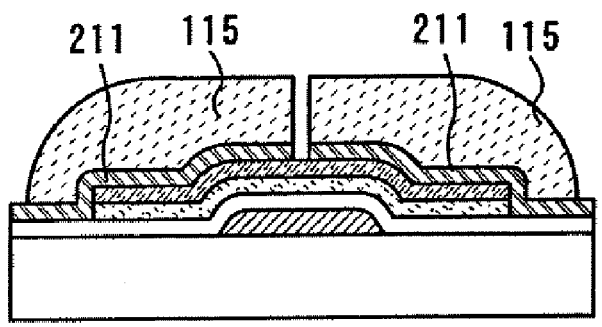

Next, a photosensitive resin 113 is applied or discharged over the substrate, and then the photosensitive resin 113 is irradiated with laser light 114 for exposure in the same way as in Embodiment Mode 1. After that, the exposed photosensitive resin is developed to form a first mask pattern 115 as shown in FIG. 2B. Since the photosensitive resin is exposed by irradiation with the laser light to form the first mask pattern 115, the mask pattern can be formed to have a microscopic opening in width.

Subsequently, the second conductive film 201 is etched by using the first mask pattern 115 as mask to form source and drain electrodes 211.

Figure 2C:
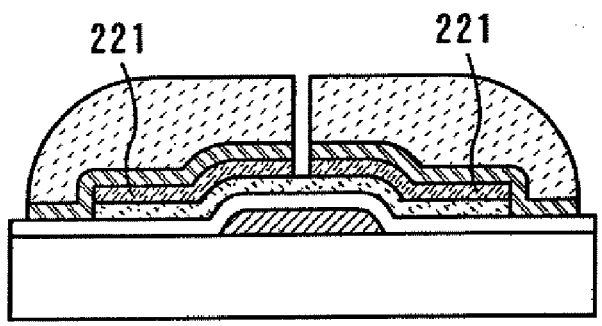

Next, as shown in FIG. 2C, the second semiconductor region 112 is etched by using the first mask pattern 115 as a mask to form a third semiconductor region 221 that serves as source region the drain regions. Although the second semiconductor region 112 is etched with the use of the first mask pattern 115 in this embodiment mode, the second semiconductor region 112 can be etched alternatively by using the source and drain electrodes 211 as a mask after removing the first mask pattern 115. After that, a passivation film is preferably formed.

According to the process described above, as shown in FIG. 2D, a channel etch type TFT with a short channel length can be manufactured without using a photomask. Note that one of inner edge portions of the source and drain electrodes is aligned with one of inner edge portions of the source and drain regions in this TFT.

Embodiment Mode 3

In this embodiment mode, with reference to FIGS. 3A to 3E, a process for forming a channel etch type TFT with a short channel length by using a material forming a liquid-repellent surface will be described. In this embodiment mode, source and drain regions are formed by forming a mask pattern on a second semiconductor film that is conductive and etching the second semiconductor film with the use of this mask pattern.

As shown in FIG. 2A, a first conductive layer 102, a first insulating layer 103, and a first semiconductor film are formed over a substrate 101 in the same way as in Embodiment Mode 1. After that, a first semiconductor region 111 is formed by forming a first mask pattern 106 as shown in Embodiment Mode 1 and etching the first semiconductor film.

Next, a second semiconductor film 301 is formed on the first semiconductor region 111 and the first insulating film 103. The material and manufacturing method of the second semiconductor film 301 can be the same as those of the second semiconductor film 105 shown in Embodiment Mode 1.

Next, a region 302 with a liquid-repellent surface is formed on the second semiconductor film 301. The region with the liquid-repellent surface is a region where the contact angle of the surface with respect to a liquid is large. On this surface, the liquid is shed to be a hemispheric shape. On the other hand, a region with a liquid-attracting surface is a region where the contact angle of the surface and with respect to a liquid is small. On this surface, the liquid spreads to wet the surface.

For this reason, when two regions that are different in contact angle come in contact, one of the regions, which has a relatively larger contact angle, serves as a region with a liquid-repellent surface, and the other, which has a smaller contact angle, serves as a region with a liquid-attracting surface. When a liquid is applied or discharged on these two regions, the liquid spreads to wet the liquid-attracting surface while the liquid is shed to be a hemispheric shape on the liquid-repellent surface.

When the regions have irregularity, the contact angle of the region with liquid-repellent surface is made further larger, which means that the liquid-repellent property is enhanced, while the contact angle of the region with the liquid-attracting surface is made further smaller, which means the liquid-attracting property is enhanced. Therefore, when a liquid including a composition is applied or discharged on the surfaces with irregularity and baked, a layer that has a uniform edge portion can be formed.

In this present embodiment mode, a liquid for forming the liquid-repellent surface is discharged or applied to form a region with a liquid-repellent surface. As an example of the composition included in the solution for forming the liquid-repellent surface, a silane coupling agent represented by a chemical formula of $R_n$—Si—$X_{(4-n)}$ (n=1, 2, or 3) is used, where R includes a comparatively inactive group such as an alkyl group, and X includes a hydrolytic group such as halogen, a methoxy group, an ethoxy group, or an acetoxy group, which can be bound to adsorption water or a hydroxyl group at the surface of a base by condensation.

The liquid-repellent property can be more enhanced by using a fluorinated silane coupling agent (fluoroalkylsilane (FAS)) including a fluoroalkyl group as R, which is a typical example of the silane-coupling agent. R of FAS has a structure represented by $(CF_3)(CF_2)_x(CH_2)_y$ (x: one of integers of 0 to 10, y: one of integers of 0 to 4). When a plurality of Rs or Xs is bound to Si, all of the Rs or Xs may be identical or one or more of them are different. As a typical FAS, there is fluoroalkylsilane (hereinafter, referred to as FAS) such as heptadefluorotetrahydrodecyltriethoxysilane, heptadecafluorotetrahydrodecyltrichlorosilane, tridecafluorotetrahydrooctyltrichlorosilane, or trifluoropropyltrimethoxysilane.

As the solvent of the solution for forming the liquid-repellent surface, a solvent for forming the liquid-repellent surface, for example, a hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, or squalene, or tetrahydrofuran is used.

In addition, as an example of the composition of the solution for forming the liquid-repellent surface, a material including fluorine-carbon chain (fluorocarbon resin) can be used. As the fluorocarbon resin, polytetrafluoroethylene (PTFE; 4-fluorinated ethylene resin), perfluoroalkoxy alkane (PFA; 4-fluorinated ethylene perfluoroalkylvinylether copolymer resin), perfluoroethylenepropene copolymer (PFEP; 4-fluorinated ethylene-6-fluorinated propylene copolymer resin), ethylene-tetrafluoroethylene copolymer (ETFE; 4-fluorinated ethylene-ethylene copolymer resin), polyvinylidene fluoride (PVDF; fluorinated vinylidene resin), polychlorotrifluoroethylene (PCTFE; 3-fluorinated ethylene chloride resin), ethylene-chlorotrifluoroethylene copolymer (ECTFE; 3-fluorinated ethylene chloride-ethylene copolymer resin), polytetrafluoroethylene-perfluorodioxole copolymer (TFE/PDD), polyvinyl fluoride (PVF; fluorinated vinyl resin), and the like can be used.

Subsequently, when the surface to which the solution for forming the liquid-repellent surface is adhering is washed with ethanol, an extremely thin liquid-repellent surface can be formed.

As the mask pattern, a liquid-repellent surface may be formed by using an organic material for forming no liquid-repellent surface (that is, for forming a liquid-attracting surface) and performing a process by $CF_4$ plasma or the like thereafter. For example, a material in which a water-soluble resin such as polyvinyl alcohol (PVA) is mixed into a solvent such as $H_2O$ may be used. Moreover, PVA may be used in combination with another water-soluble resin. Furthermore, when the mask pattern has a liquid-repellent surface, the liquid-repellent property can be improved further by the plasma treatment.

The plasma treatment can be performed in such a way that an electrode with a dielectric provided is prepared, and plasma is generated with the use of air, oxygen, or nitrogen so that the dielectric is exposed to the plasma. In this case, it is not necessary that the entire surface of the electrode is covered with the dielectric. When a dielectric including fluorine such as Teflon (registered trademark) is used as the dielectric, a $CF_2$ bond is formed at the surface where the dielectric is provided to result in a surface modification and thus a liquid-repellent property.

Figure 3A:
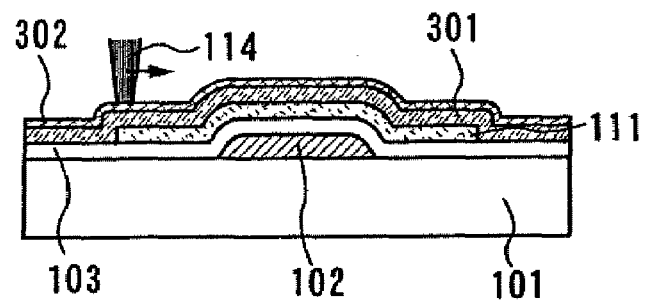
FIGS. 3A to 3E are cross-sectional views illustrating a process for manufacturing a semiconductor device according to the present invention.
Figure 3B:
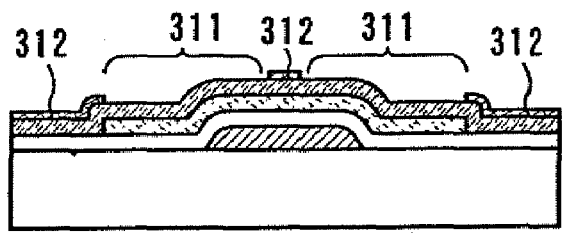

Next, the region 302 with the liquid-repellent surface is irradiated with laser light 114. As the laser light 114, the laser light described in Embodiment Mode 1 can be used appropriately. In this embodiment mode, a region for forming source and drain regions is irradiated with the laser light 114. By irradiation with light of a wavelength that has higher energy than the bond energy of the substituent showing the liquid-repellent property in the material forming the liquid-repellent surface, typically a fluoroalkyl group or an alkyl group bound to the fluoroalkyl group, the bond of the substituent showing the liquid-repellent property is cut. Namely, the liquid-repellent property of the region irradiated with the laser light 114 is reduced to show a liquid-attracting property. In FIG. 3B, the region irradiated with the laser light 114 serves as a region 311 with a liquid-attracting surface, and the region irradiated with no laser light serves as a region 312 with the liquid-repellent surface.

Figure 3C:
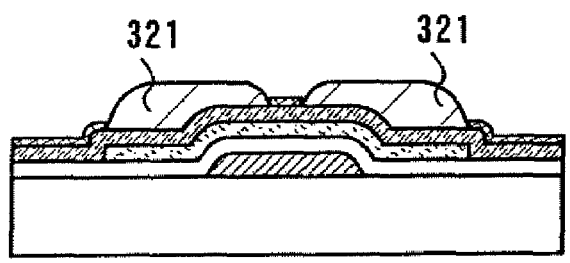

Next, as shown in FIG. 3C, a second mask pattern 321 is formed on the region 311 with the liquid-attracting surface. In this case, since the material for the second mask pattern 321 is shed by the region 312 with the liquid-repellent surface, no mask pattern is formed on the region 312. As the second mask pattern 321, the same as the first mask pattern 106 described in Embodiment Mode 1 can be formed. By irradiating the region with the liquid-repellent surface with the laser beam to form the liquid-attracting surface, the mask pattern can be formed without using a photomask. Since the irradiated region can be controlled by the scanning method of the laser light, it is possible to form a mask pattern with a microscopic space.

Figure 3D:
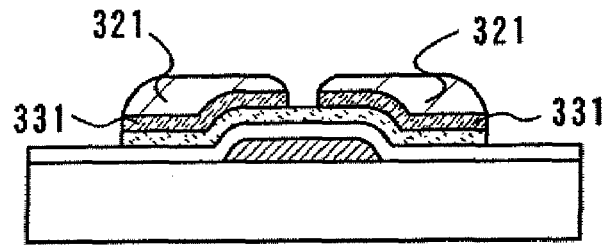

Next, as shown in FIG. 3D, the second semiconductor film 301 is etched by using the second mask pattern 321 as a mask to form a second semiconductor region 331. As the method for etching the second semiconductor film 301, the method for etching the second semiconductor film 105, which is described in Embodiment Mode 1, is appropriately applied.

In this etching process, the region 312 with the liquid-repellent surface is also etched. Noted that the second semiconductor region 331 serves as source region and drain regions. After that, the second mask pattern 321 is removed.

Figure 3E:
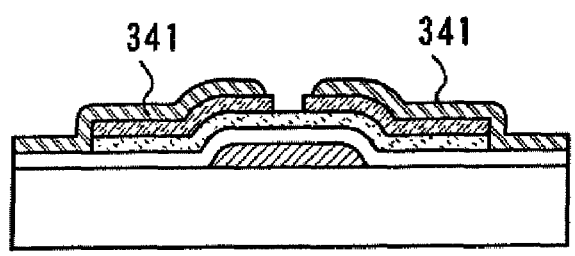

Next, as shown in FIG. 3E, by discharging a conductive material so as to come in contact with the source and drain regions, source and drain electrodes 341 are formed. The source and drain electrodes 341 can be formed by the same material and manufacturing process as those of the second conductive film 117 shown in Embodiment Mode 1, which serve as the source and drain electrode.

Figure 2D:
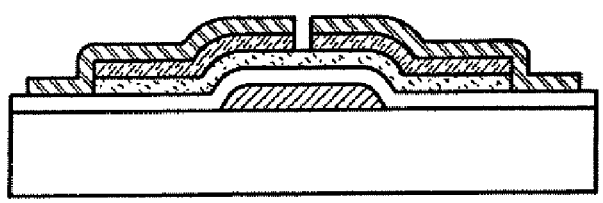

According to the process described above, a channel etch type TFT with a short channel length as shown in FIG. 2D can be manufactured without using a photomask.

Embodiment Mode 4

In this present embodiment mode, with reference to FIGS. 4A to 4E, a process for forming a channel protective TFT by using a material for forming a liquid-repellent surface will be described. In this embodiment mode, a mask pattern is formed on a first semiconductor film that serves as a base film, and the mask pattern is used to form source region and drain regions. In addition, a region not to serve as the source or drain region is irradiated with laser light to form a liquid-attracting surface.

Figure 4A:
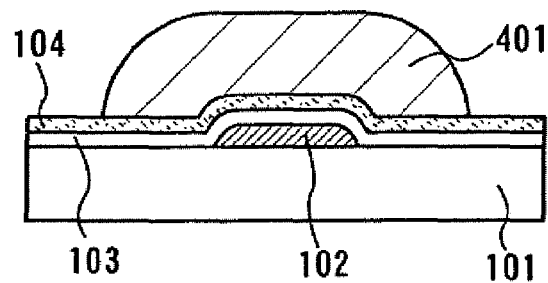
FIGS. 4A to 4E are cross-sectional views illustrating a process for manufacturing a semiconductor device according to the present invention.
Figure 4B:
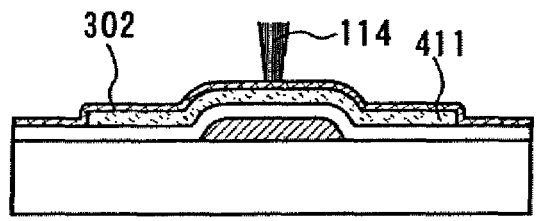

As shown in FIG. 4A, a first conductive layer 102, a first insulating film 103, a first semiconductor film 104 are formed over a substrate 101 in the same way as in Embodiment Mode 1. After that, a first mask pattern 401 just like the first mask pattern 106 in Embodiment Mode 1 is formed, and the first semiconductor film 104 is etched by using the first mask pattern 401 to form a first semiconductor region 411 shown in FIG. 4B.

Figure 4C:
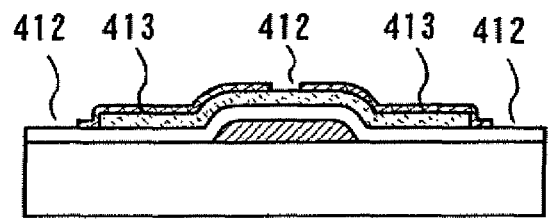

Next, a region 302 with a liquid-repellent surface is formed by discharging or applying a material for forming a liquid-repellent surface over the first semiconductor region 411. Then, a portion of the region 302 with the liquid-repellent surface is irradiated with laser light 114. Here, an outer edge of a region where the source region drain regions will be formed later is irradiated with the laser light 114. As a result, the region irradiated with the laser light serves as a region with a liquid-attracting surface. In FIG. 4C, the region irradiated with the laser light serves a region 412 with a liquid-attracting surface. The region, which is not irradiated with the laser light, serves as a region 413 with a liquid-repellent surface.

Figure 4D:
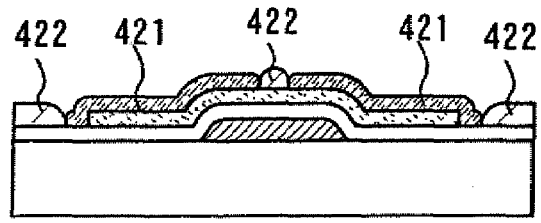

Next, as shown in FIG. 4D, a second mask pattern 422 is formed on the liquid-attracting surface. A portion of the second mask pattern 422, formed on a channel-forming region, serves as a channel protective film. The material and manufacturing process of the second mask pattern 422 can be the same as those of the first mask pattern 401. Since the irradiated region can be controlled by the scanning method of the laser light, it is possible to form a microscopic mask pattern (channel protective film) in width.

Next, a second conductive layer 421 is formed by discharging or applying a conductive material to a region surrounded by the second mask pattern 422. As the second conductive layer 421, a conductive layer including an organic conductive material such as polyacetylene, polyaniline, poly-ethylene-dioxythiophene (PEDOT), or poly-styrenesulfone (PSS) can be formed. The second conductive layer serves as a source region and a drain region.

It is desirable that the second conductive layer 421 is formed by using a metal such as gold, platinum, chromium, palladium, aluminum, indium, molybdenum, or nickel, or an alloy including the metal. A conductive paste including the metal or alloy can be used to form the second conductive layer 421 by printing, a roll coating, or droplet discharge.

Figure 4E:
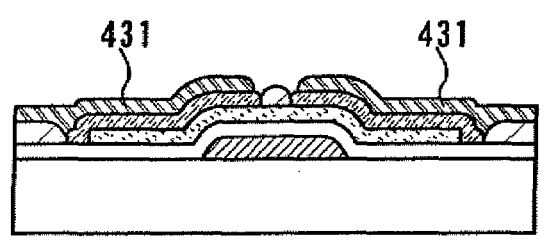

Next, as shown in FIG. 4E, a third conductive layer 431 (source electrode and drain electrode) is formed on the second conductive layer 421. In this case, it is preferable to form the third conductive layer by using a conductive material that is low in resistance. The material and manufacturing process of the third conductive layer 431 can be the same as those of the second conductive layer 117 in Embodiment Mode 1. Although the third conductive layer is formed without removing the second mask pattern 422 in this embodiment mode, the present invention is not limited to this process. The third conductive layer can be formed after removing the second mask pattern as described in the following Embodiment Mode 5.

According to the above process, a channel protective TFT with a short channel length can be formed without using a photomask.

Embodiment Mode 5

In this embodiment mode, with reference to FIGS. 5A to 5C, a process for forming a channel protective TFT with a short channel length by using a material for forming a liquid-repellent surface will be described. In this embodiment mode, a mask pattern is formed on a first semiconductor film that serves as a base film, and a source region and a drain region are formed by using the mask pattern. Moreover, a region with a liquid-attracting surface is formed by irradiating a portion for the source region and the drain region in a layer formed by the material for forming the liquid-repellent surface.

Figure 5A:
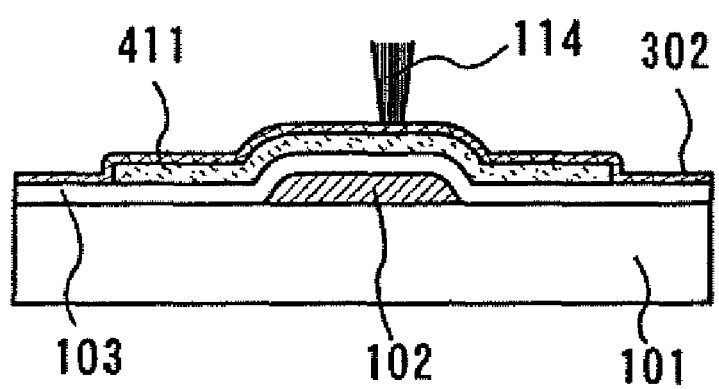
FIGS. 5A to 5C are cross-sectional views illustrating a process for manufacturing a semiconductor device according to the present invention.

As shown in FIG. 5A, a first conductive layer 102, a first insulating layer 103, and a first semiconductor region 411 are formed over a substrate 101 in the same way as in Embodiment Mode 4, and a material for forming a liquid-repellent surface is applied or discharged on the first semiconductor region 411.

Next, the material for forming the liquid-repellent surface is irradiated with laser light 114. In this embodiment mode, a region for source and drain regions is irradiated with the laser light to form a region with a liquid-attracting surface. Since the irradiated region can be controlled by the scanning method of the laser light, a microscopic mask pattern (channel protective film) in width can be formed.

Figure 5B:
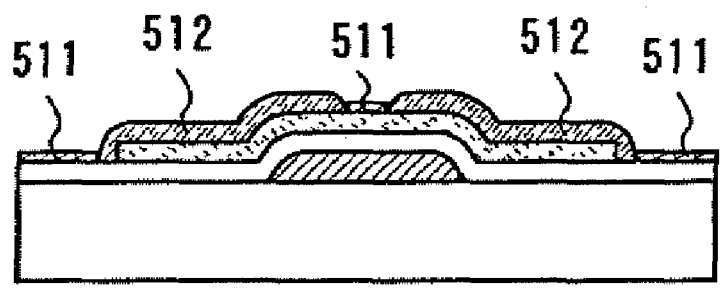

Next, as shown in FIG. 5B, a conductive material is applied or discharged on the region with the liquid-attracting surface so as to form a second conductive layer (a source region and a drain region) 512. Noted that the region, which is not irradiated with the laser light, remains as a region 511 with a liquid-repellent surface.

Figure 5C:
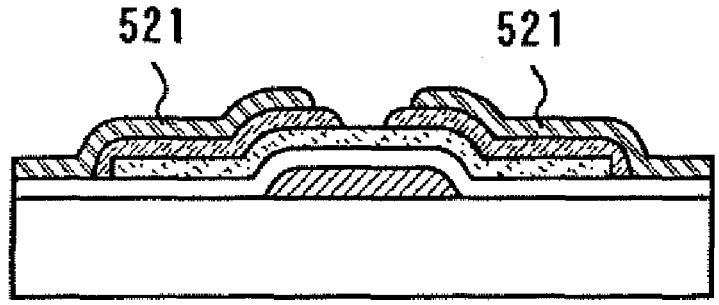

Next, as shown in FIG. 5C, a third conductive layer 521 (a source electrode and a drain electrode) is formed after removing the region 511 with the liquid-repellent surface by ashing with the use of oxygen.

According to the process described above, a TFT with a short channel length can be formed without using a photomask.

Embodiment Mode 6

In this embodiment mode, a process for manufacturing a staggered TFT with a short channel length will be described with reference to FIGS. 6A to 6F. Although a process for forming a source region and a drain region is described with reference to Embodiment Mode 3 in this embodiment mode, the process is not limited to this, and the other embodiment modes can be employed appropriately.

Figure 6A:
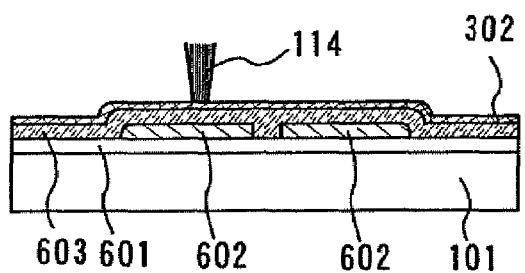
FIGS. 6A to 6F are cross-sectional views illustrating a process for manufacturing a semiconductor device according to the present invention.

As shown in FIG. 6A, a first insulating film 601 is formed over a substrate 101, and a first conductive layer 602 is formed thereon. The first conductive layer 602 will serve as a source electrode and a drain electrode later. The material and a manufacturing method of the first conductive layer 602 can be the same as those of the first conductive layer 102 described in Embodiment Mode 1.

Figure 6B:
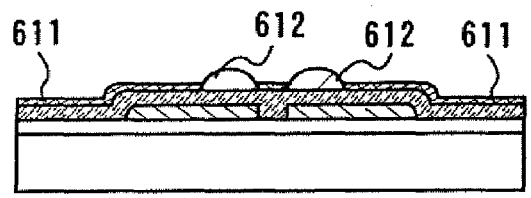

Next, a first semiconductor film 603 that is conductive is formed over the substrate. The first semiconductor film 603 may be formed by using the same material as that of the second semiconductor film 105 described in Embodiment Mode 1. Next, a material for forming a liquid-repellent surface is applied or discharged on the first semiconductor film 603 to form a region 302 with a liquid-repellent surface. After that, a portion of the region with the liquid-repellent surface is irradiated with laser light 114. In this embodiment mode, a region for source and drain regions is irradiated with the laser light to form a region with a liquid-attracting surface. The region, which is not irradiated with the laser light, remains as a region 611 with a liquid-repellent surface as shown in FIG. 6B. Next, a first mask pattern 612 is formed on the region with the liquid-attracting surface, which is irradiated with the laser light. The first mask pattern 612 can be formed by using the same material as that of the first mask pattern 106 described in Embodiment Mode 1. Since the irradiated region can be controlled by the scanning method of the laser light, a mask pattern with a microscopic space can be formed.

Figure 6C:
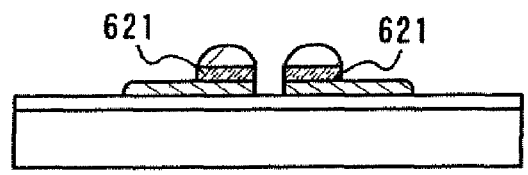

Next, as shown in FIG. 6C, a first semiconductor region 621 is formed by etching the first semiconductor film 603 with the use of the first mask pattern 612 as a mask. The first semiconductor region 621 serves as a source region and a drain region. After that, the first mask pattern 612 is removed.

Figure 6D:
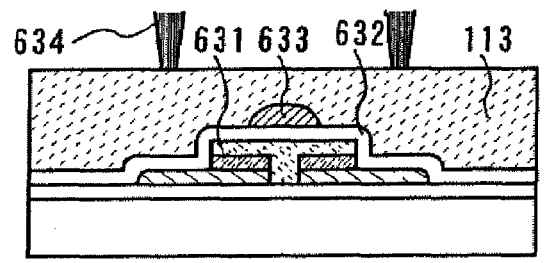

Next, as shown in FIG. 6D, a second semiconductor region 631, a second insulating film 632, and a second conductive layer 633 are formed. The second semiconductor region 631 serves as a channel forming region, the second insulating film 632 serves as a gate insulating film, and the second conductive layer 633 serves as a gate electrode.

Figure 6E:
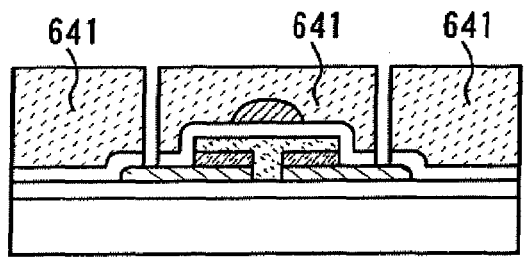

Next, a positive or negative photosensitive resin 113 is applied or discharged over the substrate, and then, subjected to exposure by irradiation with laser light 634 and developed. In this embodiment mode, a positive photosensitive resin is used, and a region for forming a contact hole is irradiated with laser light. Accordingly, as shown in FIG. 6E, a second mask pattern 641 can be formed.

Next, the second insulating film 632 is etched by using the second mask pattern 641 as a mask so as to form a contact hole and expose a portion of the first conductive layer 602. After that, the second mask pattern 641 is removed.

Figure 6F:
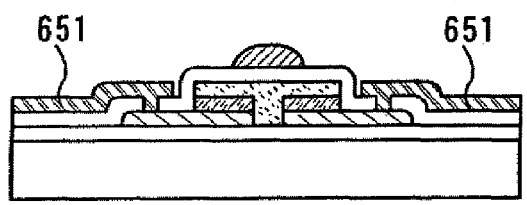

Next, as shown in FIG. 6F, a third conductive layer 651 is formed to connect with the first conductive layer 602 in the contact hole. The same material as that of the second conductive layer 117 described in Embodiment Mode 1 can be used to form the third conductive layer 651. o process described, a staggered TFT with a short channel length can be formed without using a photomask.

Embodiment Mode 7

In this embodiment mode, a process for forming a contact hole, which is different from the process described in Embodiment Mode 6, will be described with reference to FIGS. 8A to 8E.

Figure 8A:
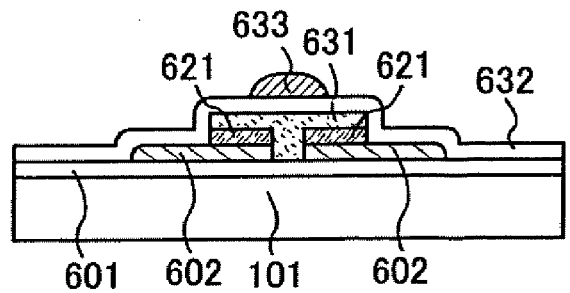
FIGS. 8A to 8E are cross-sectional views illustrating a process for manufacturing a semiconductor device according to the present invention.

A staggered TFT shown in FIG. 8A is formed in accordance with Embodiment Mode 6. The staggered TFT in this embodiment mode includes a first insulating film 601, a first conductive layer 602, a first semiconductor region 621, a second semiconductor region 631 formed between a source electrode and a drain electrode and over the first semiconductor region 621, a second insulating film 632, and a second conductive layer 633.

Figure 8B:
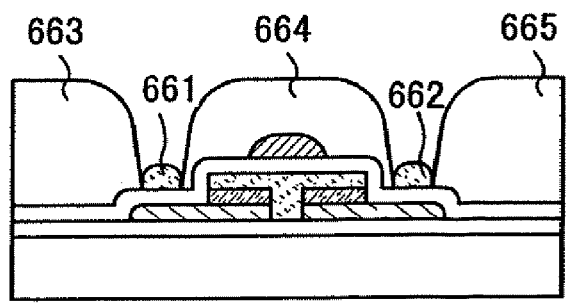

Next, as shown in FIG. 8B, a solution for forming a liquid-repellent surface is discharged to a region where the first conductive layer 602 and the second insulating film 632 are overlapped. Then, first mask patterns 661 and 662 are formed by a droplet discharge.

Next, a solution for forming a liquid-attracting surface are applied or discharged. Then, second mask patterns 663 to 665 are formed. As typical examples of the liquid-attracting solution, there are organic resins such as an acrylic resin, a polyimide resin, a melamine resin, a polyester resin, a polycarbonate resin, a phenol resin, an epoxy resin, polyacetal, polyether, polyurethane, polyamide (nylon), a furan resin, and a diallylphthalate resin; siloxane; and polysilazane. Moreover, a solution using a polar solvent such as water, alcohol, ether, dimethylformaldehyde, dimethylacetamide, dimethylsulfoxide, N-methylpyrrolidone, hexamethylphosphamid, chloroform, or methylene chloride can be used. For applying the solution for forming the liquid-attracting surface, a method such as droplet discharge, ink-jet, spin coating, roll coating, or slot coating can be applied.

Since each of the first mask patterns 661 and 662 has a liquid-repellent surface, the second mask patterns 663 to 665 are formed at an outer edge of the first mask patterns 661 and 662, that is, a region where the first mask patterns are not formed.

Instead of the process described above, the second mask patterns 663 to 665 may be formed by applying the solution for forming a liquid-attracting surface after drying the solvent of the first mask patterns 661 and 662. Also in this case, since each of the first mask patterns 661 and 662 has a liquid-repellent surface, the second mask patterns 663 to 665 are formed at an outer edge of the first mask patterns 661 and 662, that is, a region where the first mask patterns are not formed.

Figure 8C:
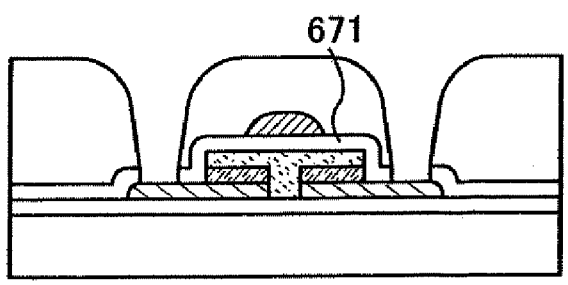

Next, as shown in FIG. 8C, the first mask patterns 661 and 662 and the second insulating film 632 are etched by using the second mask patterns 663 to 665 so as to expose a portion of the source and drain electrodes. Here, the etched second insulating film 632 is denoted with a reference numeral 671.

Figure 8D:
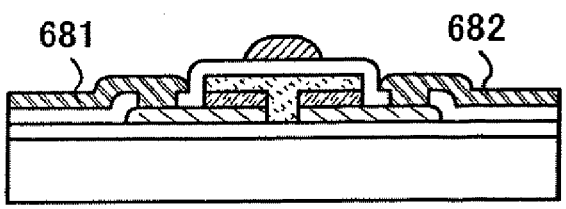

Next, third conductive films 681 and 682 are formed as shown in FIG. 8D.

Figure 8E:
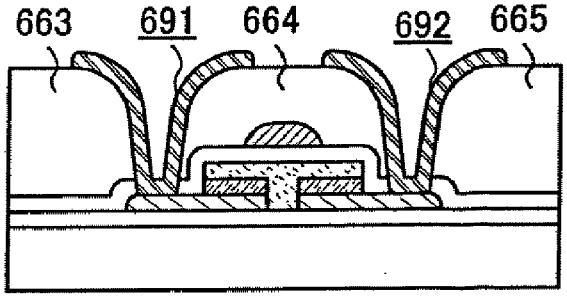

Note that, as shown in FIG. 8E, third conductive films 691 and 692 can be formed without removing the second mask patterns 663 to 665. In this case, the second mask patterns 663 to 665 are used as an interlayer insulating film.

According to the process described above, a contact hole can be formed without using a photomask.

Embodiment Mode 8

In this embodiment mode, the structure of a TFT with a large W/L will be described with reference to FIGS. 7A to 7F.

Figure 7A:
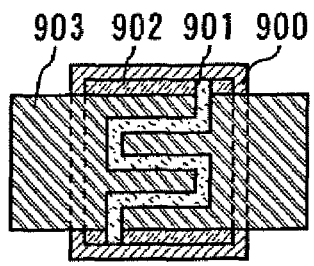
FIGS. 7A to 7F are illustrating structures of semiconductor devices according to the present invention.

FIG. 7A is a top view of the inverted-staggered TFT formed in Embodiment Mode 2, where a semiconductor region 901, source and drain regions 902, and source and drain electrodes 903 are laminated over a gate electrode 900.

Opposed edge portions of the source and drain electrodes are linearly bent. In this case, a laser beam or the substrate is scanned so as to bend at a right angle, that is, to zigzag orthogonally, and the formed mask pattern is used to form the source and drain regions or the source and drain electrodes of the element. Accordingly, a channel forming region that has a linearly bent shape or an orthogonally zigzag shape can be formed. For this reason, it is possible to narrow the channel length and enlarge the channel width even in the case of a microscopic semiconductor region.

Figure 7B:
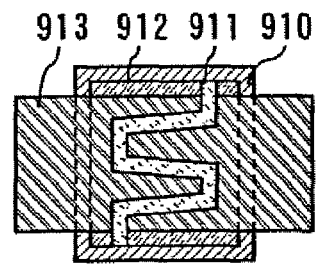

FIG. 7B is also a top view of a TFT. In this case, when a mask pattern for forming source and drain regions 912 and source and drain electrodes 913 is formed, a laser beam or a substrate is scanned so as to linearly bend at an angle between 90° and 180°, that is, to zigzag at an angle between 90° and 180°. Accordingly, a channel-forming region has a shape linearly bent at an angle between 90° and 180°, that is, a zigzag shape at an angle between 90° and 180°.

Here, reference number 910 denotes a gate electrode, and reference number 911 denotes a semiconductor region.

Figure 7C:
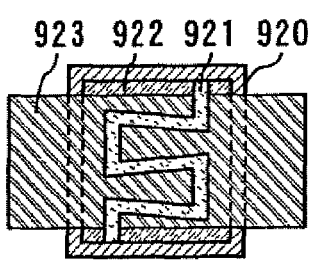
Figure 7D:
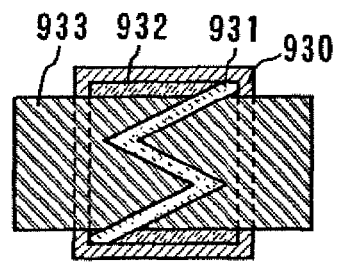

FIGS. 7C and 7D are also top views of TFTs. In these cases, when mask patterns for forming source and drain regions 922 and 932 and source and drain electrodes 923 and 933 are formed respectively, a laser beam or a substrate is scanned so as to linearly bend at an angle between 0° and 90°, that is, zigzag at an angle between 0° and 90°. Therefore, a channel forming region has a shape linearly bent at an angle between 0° and 90° or a zigzag shape at an angle between 0° and 90°. Here, reference numbers 920 and 930 denote a gate electrode, respectively, and reference numbers 921 and 931 denote a semiconductor region, respectively.

Note that the channel forming region of the TFT shown in FIG. 7C and FIG. 7D are symmetric with respect to a point.

Figure 7E:
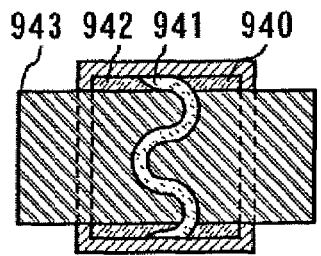

FIG. 7E is also a top view of a TFT. In this case, when a mask pattern for forming source and drain regions 942 and source and drain electrodes 943 by etching is formed, a laser beam or a substrate is scanned so as to draw a curve. Therefore, a channel-forming region has a curved shape. Here, reference number 940 denotes a gate electrode, and reference number 941 denotes a semiconductor region.

Figure 7F:
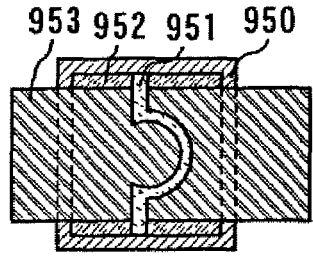

FIG. 7F is also a top view of a TFT. In this case, when a mask pattern for forming source and drain regions 952 and source and drain electrodes 953 by etching is formed, a laser beam or a substrate is scanned so as to draw a straight line and a curve. Therefore, a channel-forming region has a straight line and a curve. Here, reference number 950 denotes a gate electrode, and reference number 951 denotes a semiconductor region.

This embodiment mode can be applied to not only Embodiment Mode 2 but also Embodiment Modes 1 to 7. In such a case, edge portions of source and drain regions are not aligned with those of source and drain electrodes.

According to the process described above, an element that has a microscopic structure and increased W/L can be formed without using a photomask. In this embodiment mode, since the source and drain regions or the source and drain electrodes of the element are formed with the use of the mask pattern formed by irradiation with the laser beam, it is possible to form a channel forming region in any shape. Therefore, the element that has a microscopic structure increased W/L can be formed while omitting a photolithography process. Accordingly, a semiconductor device with high driving ability can be manufactured at lower cost with high throughput and high yield.

Embodiment Mode 9

Figure 24:
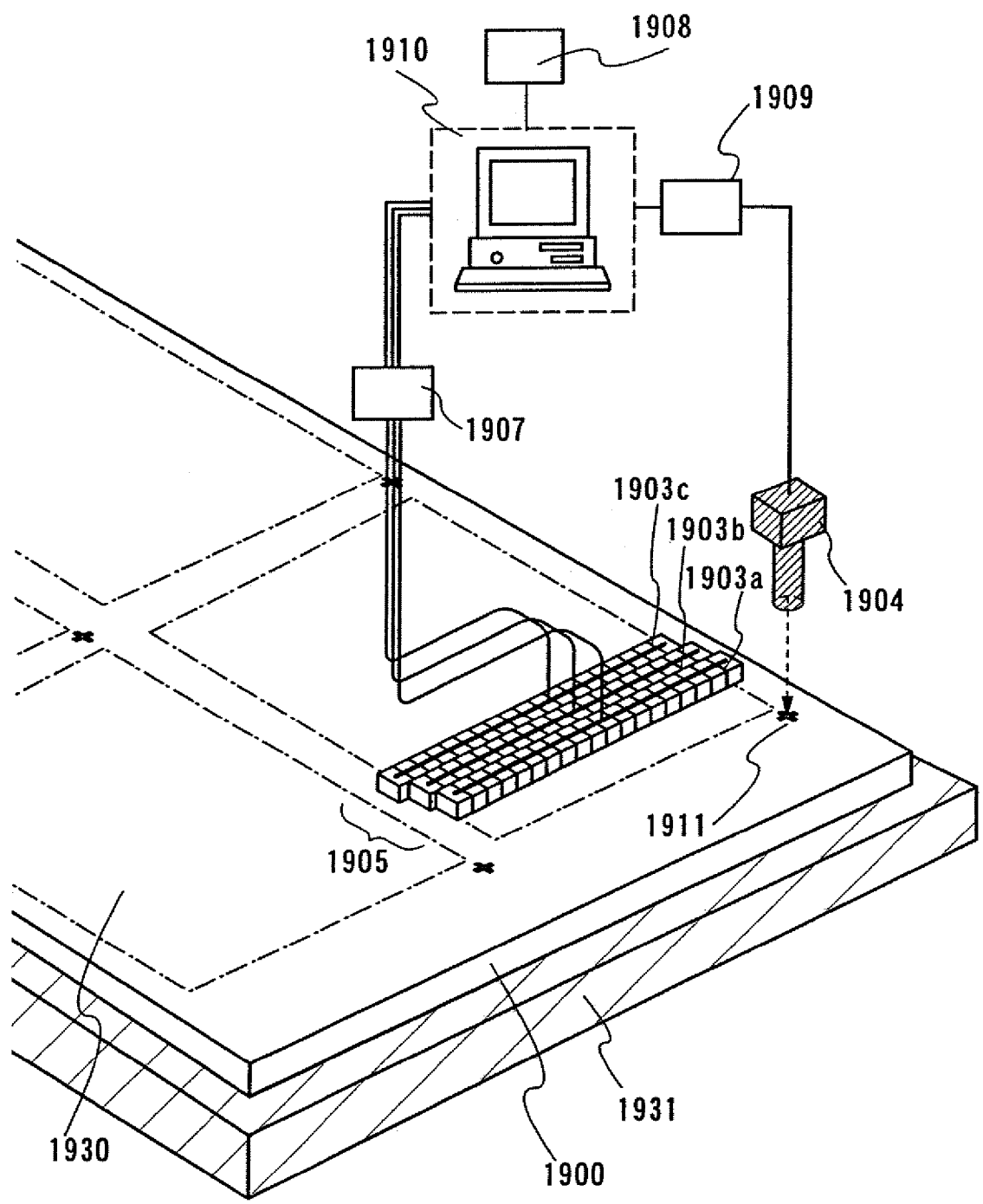
FIG. 24 is a diagram illustrating the structure of a droplet discharge system that can be applied to the present invention.

In this embodiment mode, a droplet discharge system that can be used for forming the mask pattern in the embodiment modes described. In FIG. 24, on a substrate 1900, a region 1930 in which one panel is formed is shown with a chain line.

FIG. 24 shows an example of a droplet discharge system to be used for forming patterns of a wiring and the like. Droplet discharge means 1905 includes a head that has a plurality of nozzles. Although an example in which each of three heads (1903a, 1903b, and 1903c) includes ten nozzles is described in the present embodiment mode, the number of nozzles and the number of heads can be determined depending on an area to be processed, a process, and the like.

The heads are connected to control means 1907, and the control means 1907 is controlled by a computer 1910 so that a predetermined pattern can be drawn. The timing of drawing may be determined based on a reference point, for example, a marker 1911 formed on the substrate 1900 fixed on a stage 1931. Alternatively, an edge portion of the substrate 1900 may be the reference point. The reference point is detected by imaging means 1904 such as CCD and converted into a digital signal by image processing means 1909. The digital signal is recognized by the computer 1910 to produce a control signal, which is sent to the control means 1907. When the pattern is drawn in this way, the distance between a top of the nozzle and a surface on which the pattern is drawn may range from 0.1 to 5 cm, preferably from 0.1 to 2 cm, more preferably about 0.1 cm. When the distance is made shorter in this way, the accuracy of landing a droplet is improved.

In this case, information of the pattern to be formed on the substrate 1900 is stored in a recording medium 1908, and the control signal is sent to the control means 1907 based on this information so that respective heads 1903a, 1903b, and 1903c can be controlled separately. Namely, a droplet including a different material can be discharged from nozzles of each of the beads 1903a, 1903b, and 1903c. For example, while discharging droplets including an insulating material from the nozzles of the heads 1903a and 1903b, droplets including a conductive material can be discharged from the nozzles of the head 1903c.

Moreover, each nozzle of the head can be separately controlled. Since the nozzles are controlled separately, a droplet including a different material can be discharged from a specific nozzle. For example, the head 1903a can have a nozzle for discharging a droplet including a conductive material and a nozzle for discharging a droplet including an insulating material.

In the case of performing a droplet discharge process to a large area, for example, a process of forming an interlayer insulating film, droplets including a material for an interlayer insulating film may be discharged from all the nozzles. Moreover, droplets including a material for an interlayer insulating may be discharged from all nozzles of a plurality of heads. As a result, the throughput can be improved. Of course, in a process of forming an interlayer insulating film, a droplet discharge process may be performed to a large area in such a way that a droplet including a material for the interlayer insulating film is discharged from a nozzle while scanning the nozzle or the substrate multiple times.

Then, the pattern can be formed on a large mother glass by zigzagging or moving back and forth the head. In this case, the head and the substrate may be scanned relatively multiple times. When the head is scanned with respect to the substrate, the head may be tilted to the scanning direction.

The head is preferably as wide as a panel when a plurality of panels are manufactured from a large mother glass. This is because a pattern can be formed by scanning once with respect to the region 1930 where a panel is formed and high throughput can be expected.

The width of the head may be smaller than that of the panel. In this case, a plurality of narrow heads is arranged serially to be equal to the width of one panel. By arranging the plurality of narrow heads serially, bending of the heads, which is more likely caused as the width of the head is increased, can be prevented from being generated. Of course, a pattern may be formed by scanning a narrow head multiple times.

It is preferable to perform the process of discharging droplets of a solution by droplet discharge under reduced pressure. This is because the solvent for the composition evaporates after discharging the solution before landing on the object to be processed so that a process for drying and baking the composition can be omitted, and also because an oxide film or the like is not formed over a conductor. Moreover, the process of dropping the composition may be performed under a nitrogenous atmosphere or an organic gas atmosphere.

For the droplet discharge process, a piezo method can be used. The piezo method, which is superior in controllability of droplets and freedom degree of selecting ink, is also employed for an ink-jet printer. The piezo method includes types of MLP (Multi Layer Piezo) and MLChip (Multi Layer Ceramic Hyper Integrated Piezo Segments). Depending on the solvent for the composition, a thermal method in which a heat generator is made to generate heat so that a bubble is generated for pushing a solution forward may be performed for the droplet discharge process.

Embodiment Mode 10

In this embodiment mode, a manufacturing process of a gate electrode in a multigate TFT will be described with reference to FIGS. 40A to 42D. The process after forming a gate insulating film is described with reference to Embodiment Mode 2 in this embodiment mode. However, the process is not limited to this. Any one of Embodiment Modes 1 to 9 can be used appropriately.

Figure 40A:
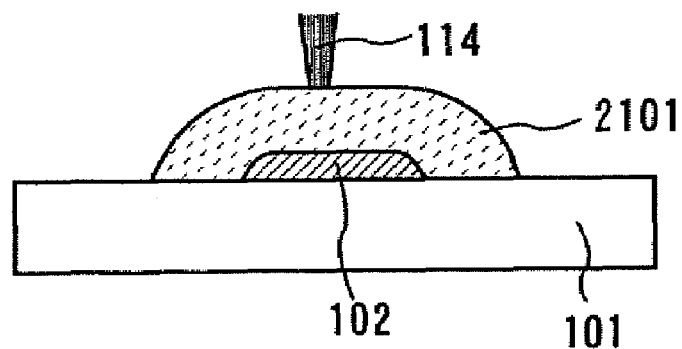
FIGS. 40A to 40D are cross-sectional views illustrating a process for manufacturing a semiconductor device according to the present invention.
Figure 40B:
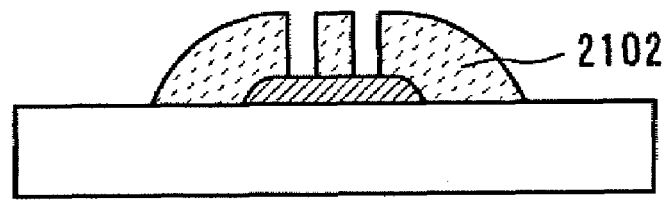

A first conductive layer 102 is formed over a substrate 101. Next, a photosensitive material 2101 is discharged or applied so as to cover the first conductive layer 102. Then, the photosensitive material 2101 is irradiated with laser light 114 for exposure. After that, the exposed photosensitive material is developed to form a first mask pattern 2102 as shown in FIG. 40B. Since a positive photosensitive resin is used as the photosensitive material 2101 in this embodiment mode, a region to be etched later is irradiated with the laser light 114. Moreover, the first mask pattern 2102 has an opening in the region irradiated with the laser light 114.

Figure 40C:
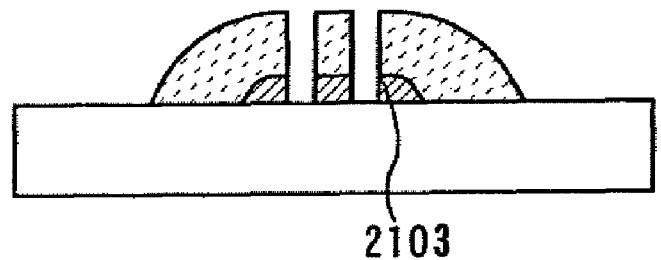

Next, as shown in FIG. 40C, the first conductive layer 102 is etched with the use of the first mask pattern 2102 to form a gate electrode 2103. After that, the first mask pattern 2102 is removed to form a gate wiring. A top view of the substrate at this stage is illustrated in FIGS. 42A and 42B.

Figure 42A:
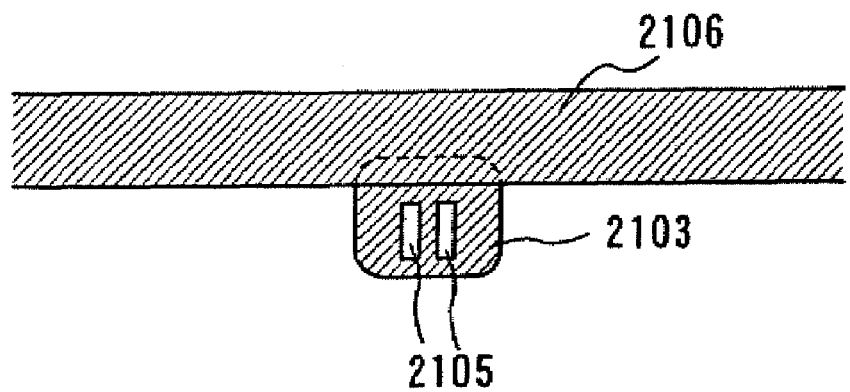
FIGS. 42A to 42D are top views illustrating the processes for manufacturing the semiconductor devices according to the present invention.
Figure 42B:
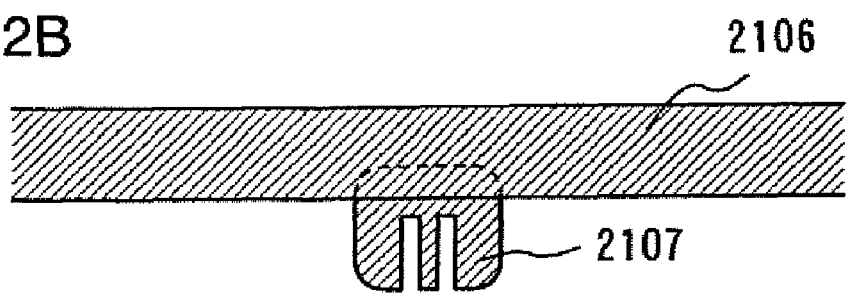

As shown in FIG. 42A, the gate electrode 2103 has an opening 2105. Moreover, a gate wiring 2106 is connected to the gate electrode 2103.

Since the gate electrode with the opening is connected at an end portion thereof, the resistivity of the film is almost uniform even when the thickness of the gate electrode is not uniform so that variation in characteristics of a TFT to be formed later can be reduced. Although two openings are provided in this embodiment mode, one opening or three or more openings may be provided. When the number of openings is increased, the electric field at a drain edge is reduced to enhance an advantageous effect of reducing off-current.

Since the first conductive film 102 can be etched by using the first mask pattern 2102 with the narrow opening, a multigate TFT can be formed without increasing the area of the TFT. Namely, a highly integrated semiconductor device can be manufactured.

The gate electrode may be a comb-shaped gate electrode 2107 shown in FIG. 42B.

Figure 40D:
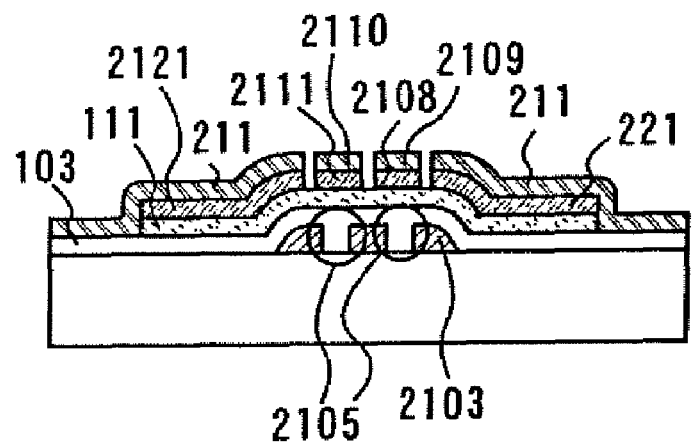

After that, as shown in FIG. 40D, a gate insulating film 103, a first semiconductor region 111, a second semiconductor region 2121, source and drain electrodes 211 are formed over the gate electrode 2103. The multi-gate TFT can be formed by forming the source and drain electrodes 211 so as to sandwich the opening 2105 of the gate electrode 2103. In addition, conductive layers 2108 to 2111 are formed so as to cover the opening and a portion of the gate electrode beside the opening. The conductive layers can be formed simultaneously with the second semiconductor region 2121, the source and drain electrodes 211.

In a TFT with this structure, the electric field at a drain edge is reduced to enhance the advantageous effect of reducing off-current. For this reason, when this TFT is used as a switching element of a liquid crystal display device, the contrast is improved. Moreover, since the multigate TFT occupying a small area can be formed, a highly integrated semiconductor device can be manufactured.

Next, a process for forming a multigate TFT by using a negative photosensitive resin will be described with reference to FIGS. 41A to 41D.

Figure 41A:
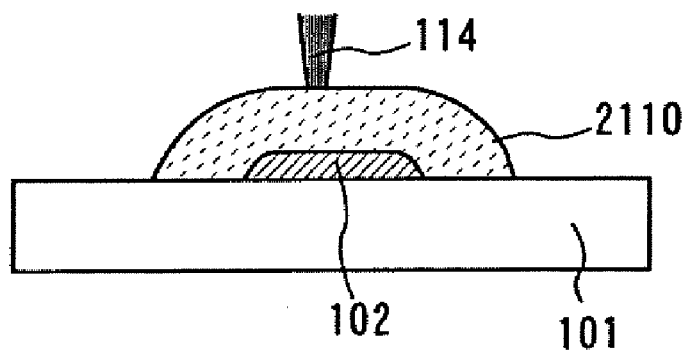
FIGS. 41A to 41D are cross-sectional views illustrating a process for manufacturing a semiconductor device according to the present invention.
Figure 41B:
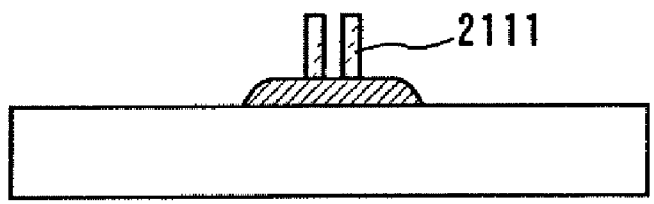

As shown in FIG. 41A, a photosensitive material 2110 is discharged or applied on a first conductive layer 102. Then, the photosensitive material 2110 is irradiated with laser light 114 for exposure, and the exposed photosensitive material is developed to form a first mask pattern 2111 as shown in FIG. 41B. Since the negative photosensitive resin is used as the photosensitive material 2110 here, a region to serve as a mask for forming a gate electrode later is irradiated with the laser light 114. Consequently, the region irradiated with the laser light serves as a mask pattern.

Figure 41C:
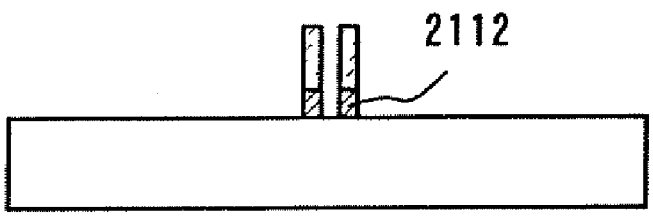

Next, as shown in FIG. 41C, the first conductive layer 102 is etched with the use of the first mask pattern 2111 to form a gate electrode 2112. After that, the mask pattern 2111 is removed, and a gate wiring is formed. A top view of the substrate at this stage is illustrated in FIGS. 42C and 42D.

Figure 42C:
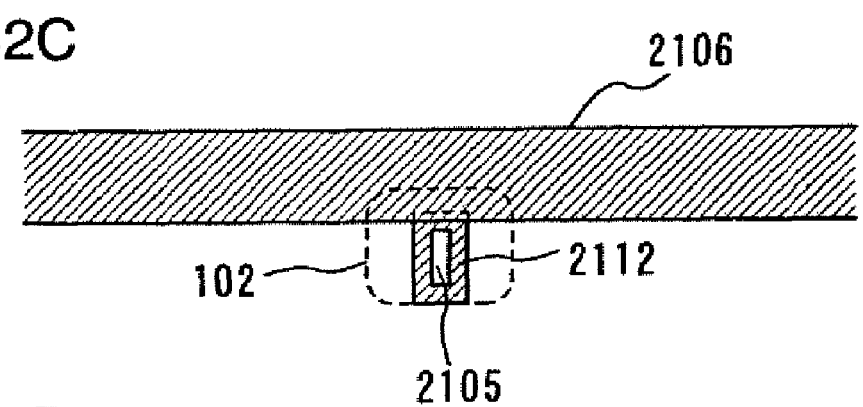

As shown in FIG. 42C, the gate electrode 2112 has an opening 2105 provided. Moreover, a gate wiring 2106 is connected to the gate electrode 2112. This structure has the same advantageous effect as that of the gate electrode 2103 shown in FIG. 42A. Moreover, Since the first conductive film 102 can be etched by using the first mask pattern 2112 with the narrow opening, a multigate TFT can be formed without increasing the area of the TFT. Namely, a highly integrated semiconductor device can be manufactured.

Figure 42D:
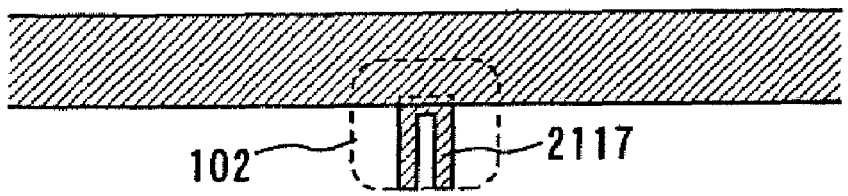

The gate electrode may be a comb-shaped gate electrode 2117 shown in FIG. 42D.

Figure 41D:
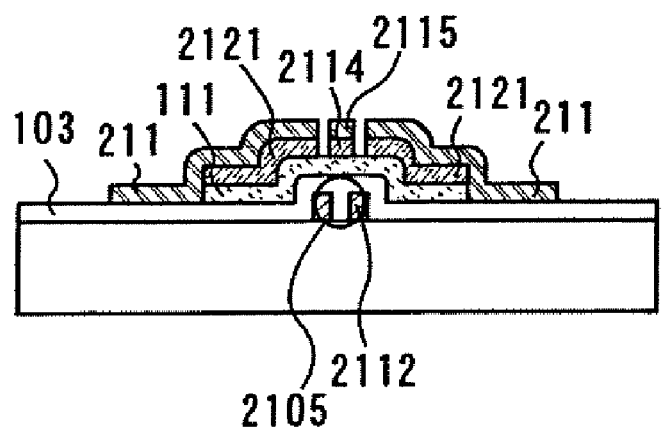

After that, as shown in FIG. 41D, a first insulating film 103 that serves as a gate insulating film, a first semiconductor region 111, a second semiconductor region 2121, source and drain electrodes 211 are formed over the gate electrode 2112. The multi-gate TFT can be formed by forming the source and drain electrodes 211 so as to sandwich the opening 2105 of the gate electrode 2103. In addition, conductive layers 2114 and 2115 are formed so as to cover the opening and a portion of the gate electrode beside the opening. The conductive layers can be formed simultaneously with the second semiconductor region 2121, the source and drain electrodes 211.

In a TFT with this structure, the electric field at a drain edge is reduced to enhance the advantageous effect of reducing off-current. For this reason, when this TFT is used as a switching element of a liquid crystal display device, the contrast is improved. Moreover, a TFT that has a gate electrode with a microscopic structure (that is, a TFT that has a short channel length) can be formed since the width of the gate electrode is almost the same as the beam width of the laser beam. Therefore, the driving ability of the TFT can be improved further.

Embodiment 1

Next, a method for manufacturing an active matrix substrate and a display panel having the active matrix substrate are described with reference to FIGS. 17A to 17E, FIGS. 18A to 18E, FIGS. 19A to 19C, and FIGS. 20 to 23. This embodiment mode is described using a liquid crystal display panel as a display panel. FIGS. 17A to 17E, FIGS. 18A to 18E, and FIGS. 19A to 19C schematically show longitudinal sectional structures of a pixel portion and a connection terminal portion, and FIGS. 20 to 23 show planar structures corresponding to lines A-B and C-D.

Figure 17A:
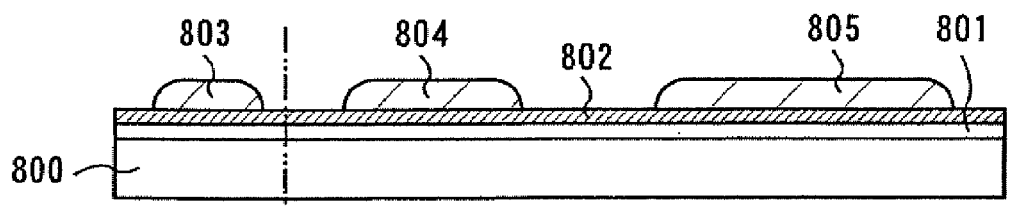
FIGS. 17A to 17E are cross-sectional views illustrating a process for manufacturing a semiconductor device according to the present invention.

As shown in FIG. 17A, a surface of a substrate 800 is oxidized at 400° C. to form an insulating film 801 having a 100 nm film thickness. This insulating film functions as an etching stopper film of a conductive layer to be formed later. Then, a first conductive layer 802 is formed over the insulating film 801, and first mask patterns 803 to 805 are formed over the first conductive layer by a droplet discharge. An AN 100 glass substrate manufactured by Asahi Glass Co., Ltd. is used as the substrate 800, and a tungsten film having a 100 nm film thickness is formed by using a tungsten target and an argon gas by a sputtering method as the first conductive layer 802. Polyimide is discharged by droplet discharge and baked by heating at 200° C. for 30 minutes as the first mask patterns. The first mask patterns are discharged to a gate wiring layer, a gate electrode layer, and a connection conductive layer which are to be formed later.

Figure 17B:
Figure 20:
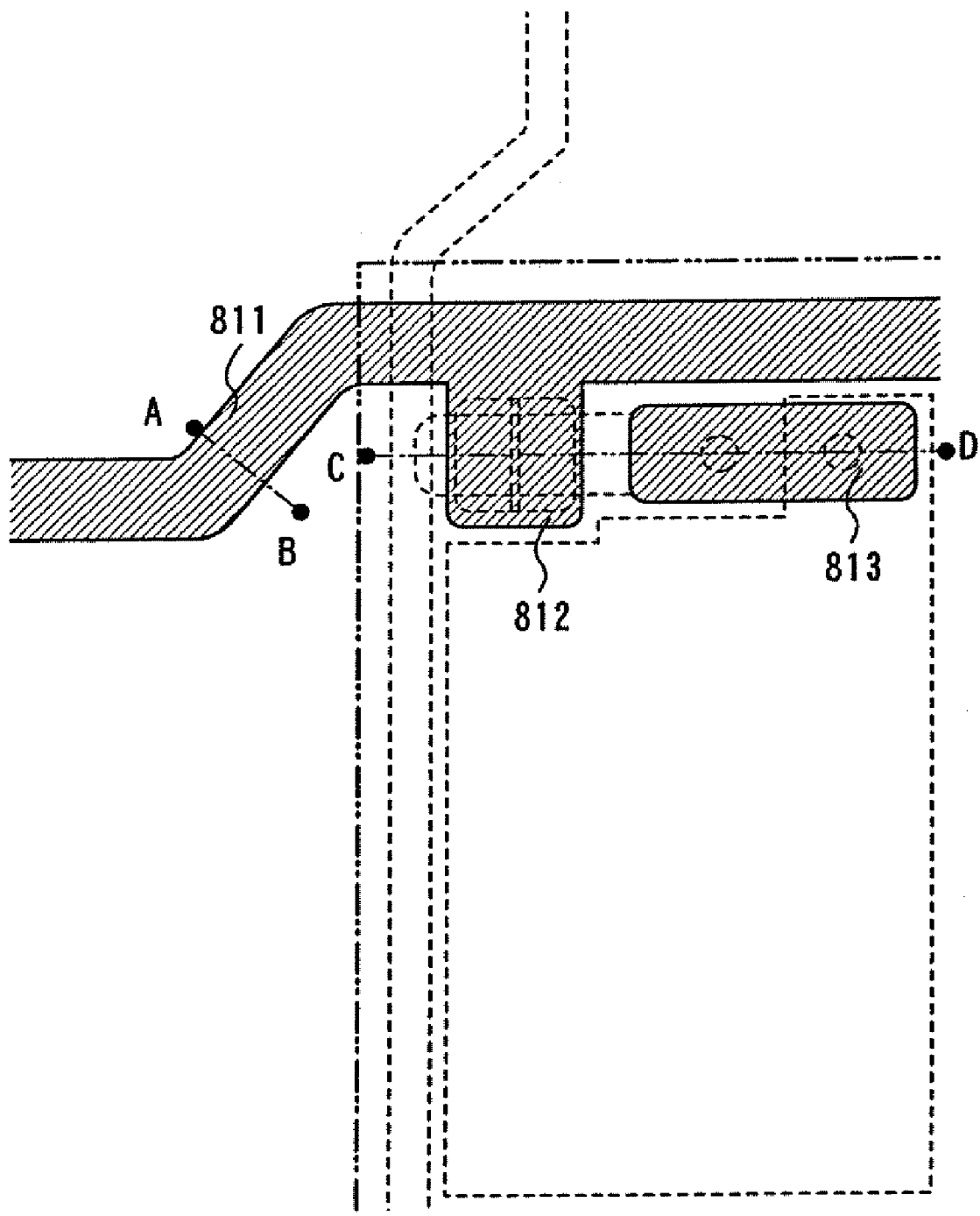
FIG. 20 is a top view of illustrating the process for manufacturing a semiconductor device according to the present invention.

Next, as shown in FIG. 17B, a part of the first conductive layer is etched by using the first mask patterns 803 to 805 to form a gate wiring layer 811, a gate electrode layer 812, and a connection conductive layer 813. Thereafter, the first mask patterns 803 to 805 are peeled by using a peeling solution. Note that FIG. 17B schematically shows a longitudinal sectional structure, and FIG. 20 shows a planar structure corresponding to lines A-B and C-D, and the figure is to be referred simultaneously.

Figure 17C:
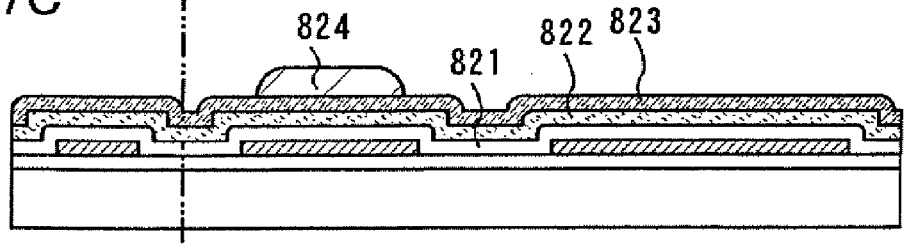

Next, as shown in FIG. 17C, a gate insulating film 821 is formed by a plasma CVD method. A silicon oxynitride film (H, 1.8%, N: 2.6%, O: 63.9%, and Si: 31.7%) having a 110 nm film thickness is formed as the gate insulating film 821 by a plasma CVD method using $SiH_4$ and $N_2O$ (a flow rate of $SiH_4$: $N_2O$=1:200) in a chamber heated at 400° C.

Next, a first semiconductor film 822 and a second semiconductor film 823 imparting n-type conductivity are formed. An amorphous silicon film having a 150 nm film thickness is formed by a plasma CVD method as the first semiconductor film 822. Then, an oxide film on the surface of the amorphous silicon film is removed. Thereafter, a semi-amorphous silicon film having a 50 nm film thickness is formed by using a silane gas and a phosphine gas as the second semiconductor film 823.

Next, a second mask pattern 824 is formed over the second semiconductor film. Polyimide is discharged over the second semiconductor film by droplet discharge and is heated at 200° C. for 30 minutes to form the second mask pattern. The second mask pattern 824 is discharged in a region where subsequent first and second semiconductor regions are formed.

Figure 17D:
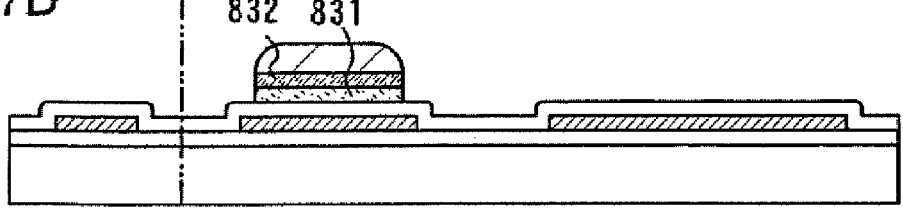
Figure 21:
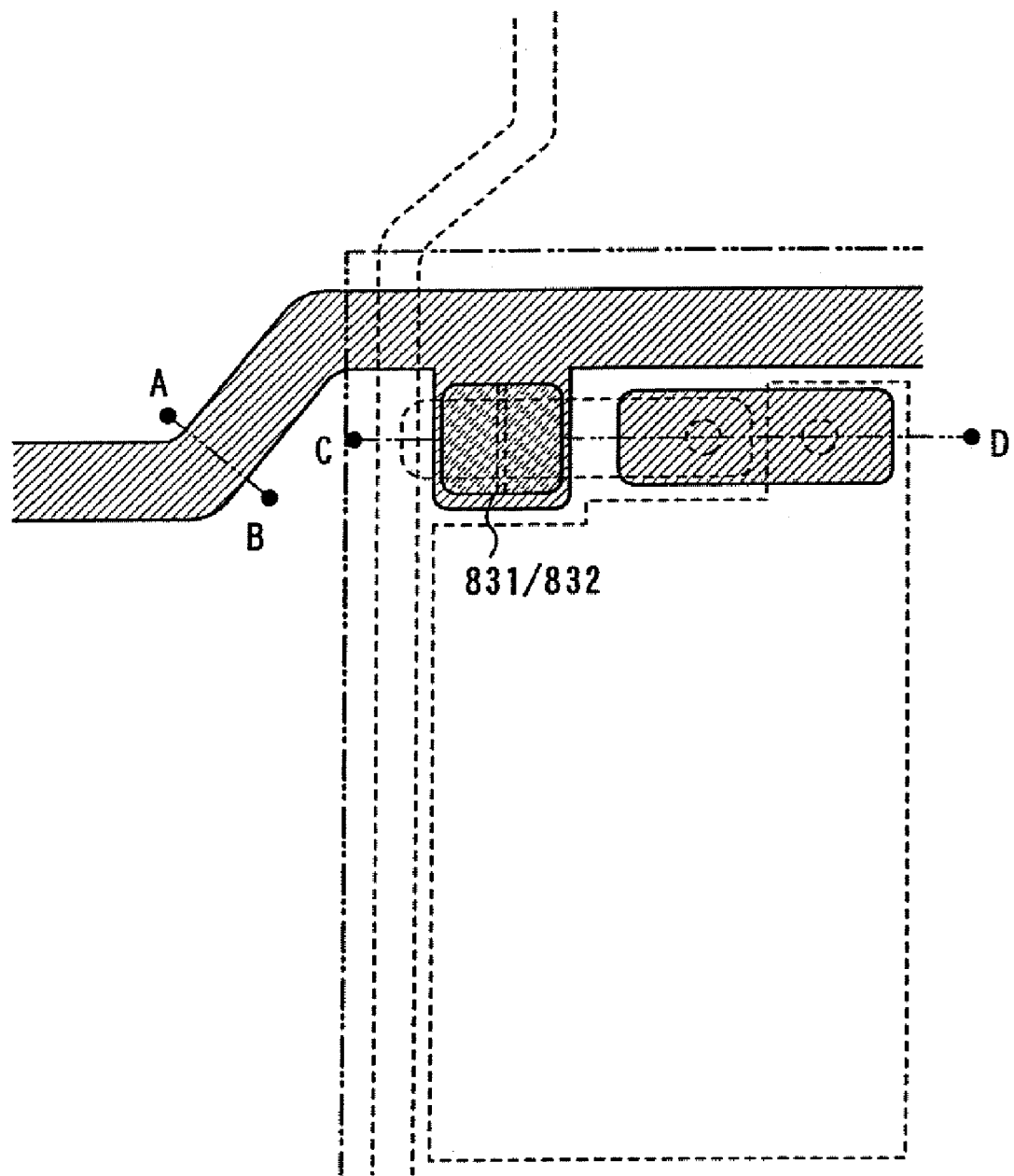
FIG. 21 is a top view of illustrating the process for manufacturing a semiconductor device according to the present invention.

Next, as shown in FIG. 17D, each of the first semiconductor film 822 and the second semiconductor film 823 is etched by using the second mask pattern to form a first semiconductor region 831 and a second semiconductor region 832. The first semiconductor film and the second semiconductor film are etched by using a mixed gas of which flow rate of $CF_4$:$O_2$ equals to 10:9. Thereafter, the second mask pattern 824 is peeled by using a peeling solution. Note that FIG. 21 shows a planar structure corresponding to lines A-B and C-D of a longitudinal sectional structure in FIG. 17D after peeling the second mask pattern, and the figure is to be referred simultaneously.

Figure 17E:
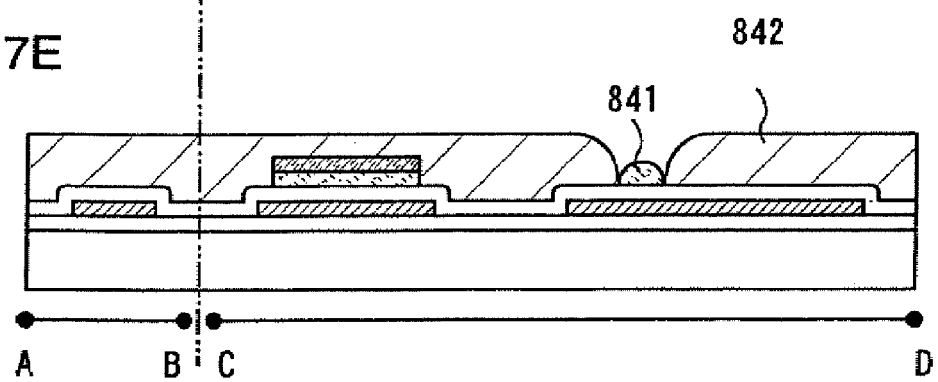

Next, as shown in FIG. 17E, a third mask pattern 841 is formed. A solution of a fluorine-based silane coupling agent dissolved in a solvent, which forms a liquid-repellent surface is discharged by droplet discharge as the third mask pattern to a region where the gate insulating film 821 and the connection conductive layer 813 superpose. Note that the third mask pattern 841 is a protective film for forming a fourth mask pattern to form a contact hole in a region where subsequent drain electrode and the connection conductive layer 813 are connected.

Next, a fourth mask pattern 842 is formed. The fourth mask pattern is a mask for forming a first contact hole, and polyimide is discharged by droplet discharge and heated at 200° C. for 30 minutes to form it. At this time, since the third mask pattern 841 is liquid-repellent and the fourth mask pattern 842 is lyophilic, the fourth mask pattern 842 is not formed in the region where the third mask pattern is formed.

Figure 18A:
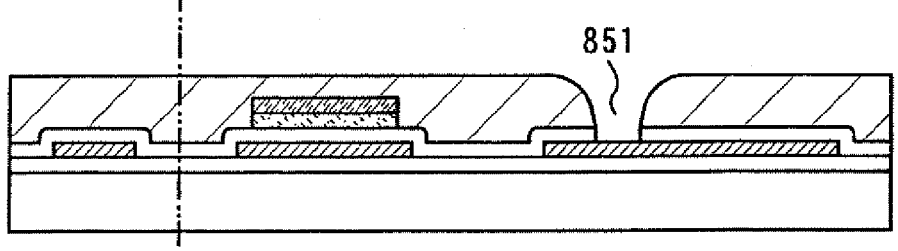
FIGS. 18A to 18E are cross-sectional views illustrating the process for manufacturing a semiconductor device according to the present invention.

As shown in FIG. 18A, the third mask pattern 841 is removed by oxygen ashing to expose a part of the gate insulating film. Then, the exposed gate insulating film is etched by using the fourth mask pattern 842. The gate insulating film is etched by using $CHF_3$ to form a contact hole 851. Thereafter, the fourth mask pattern is peeled by oxygen ashing and etching using a peeling solution.

Figure 18B:
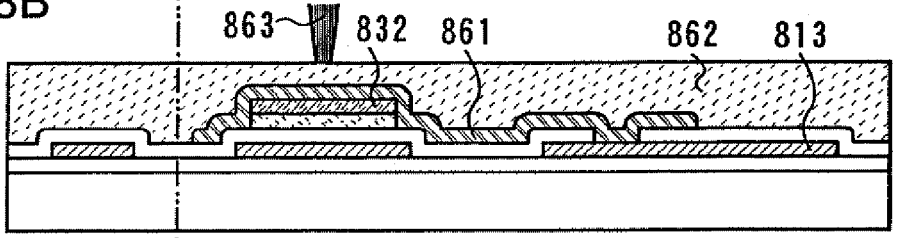

Next, as shown in FIG. 18B, a second conductive layer 861 is formed by droplet discharge. The second conductive layer is to be a subsequent source wiring layer and drain wiring layer. Here, the second conductive layer 861 is formed so that it is connected to the second semiconductor region 832 and the connection conductive layer 813. After an Ag (silver) particles dispersed solution is discharged and dried at 100° C. for 30 minutes as the second conductive layer 861, the solution is to be baked by beating at 230° C. for an hour in an atmosphere of which oxygen density is 10%.

Figure 18C:
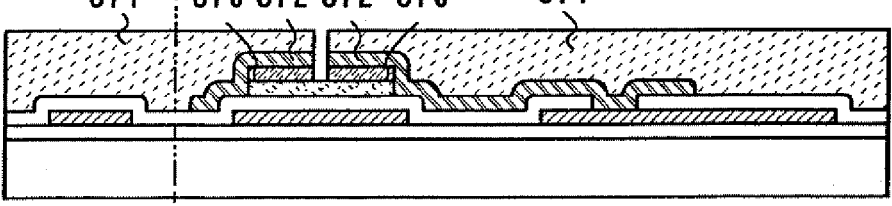

Next, a photopolymer 862 is applied over the substrate. Here, a positive type photopolymer is applied by a spin coating method, and pre-bake is performed after drying. Then, after irradiating the photopolymer 862 with laser light 863 emitted from an Nd:$YVO_4$ laser to be exposed, it is developed to form a fifth mask pattern 871 as shown in FIG. 18C. Since it is possible to control an irradiation region due to a scanning method of laser light, a mask pattern having a minute space can be formed.

Next, the second conductive layer 861 and the second semiconductor region 832 are etched by using the fifth mask pattern to form a third conductive layer (a source wiring layer and a drain wiring layer) 872 and a third semiconductor region (source and drain regions) 873. The second semiconductor region 832 is etched by using a mixed gas of which flow rate of $CF_4:O_2$ equals to 10:9. Since the fifth mask pattern has an opening portion with minute width, the width of the second semiconductor region is slightly etched, and as a result, the space between the source region and drain region is narrowed.

Figure 22:
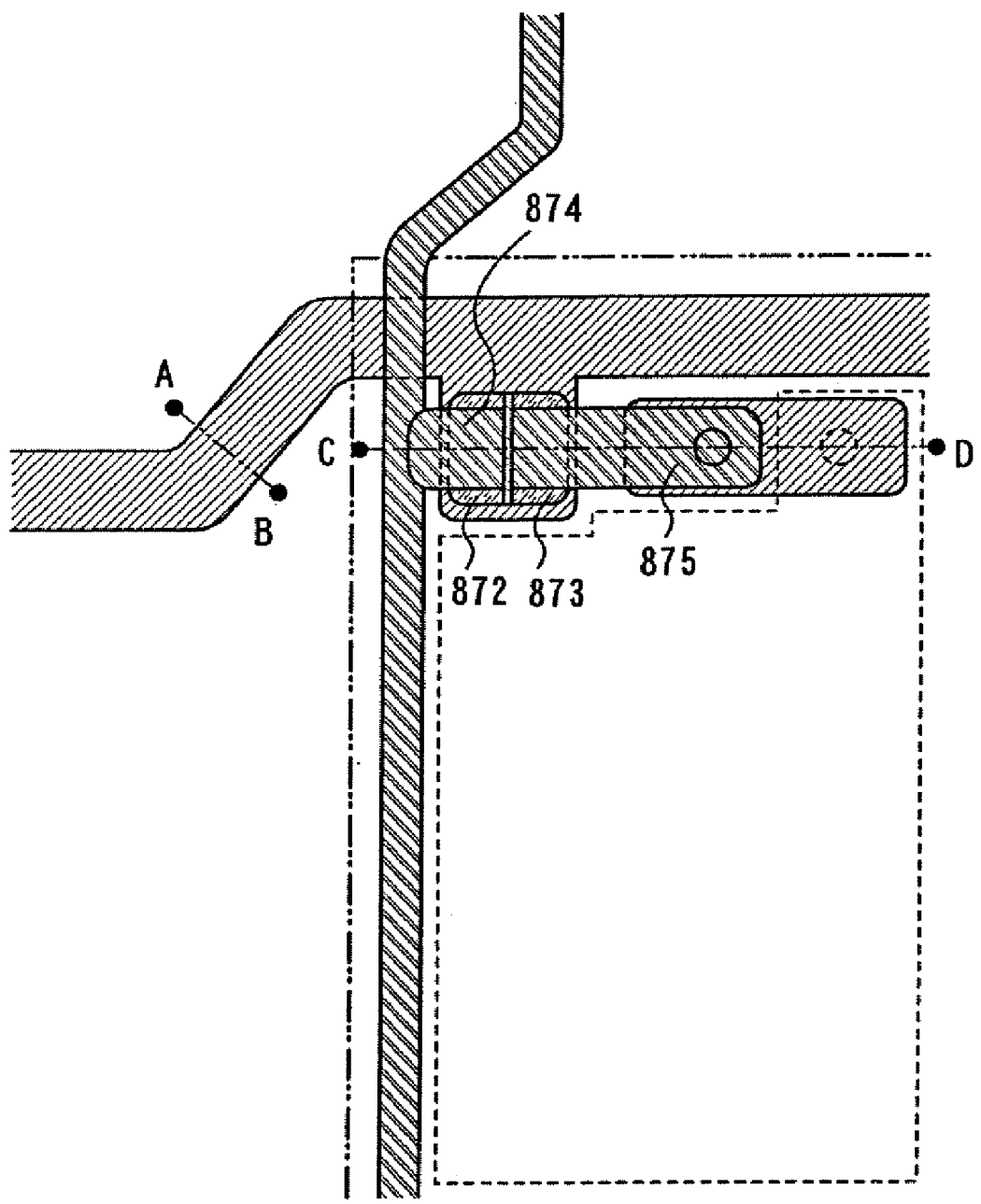
FIG. 22 is a top view of illustrating the process for manufacturing a semiconductor device according to the present invention.

Thereafter, the fifth mask pattern 871 is peeled by using a peeling solution. Note that FIG. 22 shows a planar structure corresponding to lines A-B and C-D of a longitudinal sectional structure in FIG. 18C after peeling the fifth mask pattern, and the figure is to be referred simultaneously.

Figure 18D:
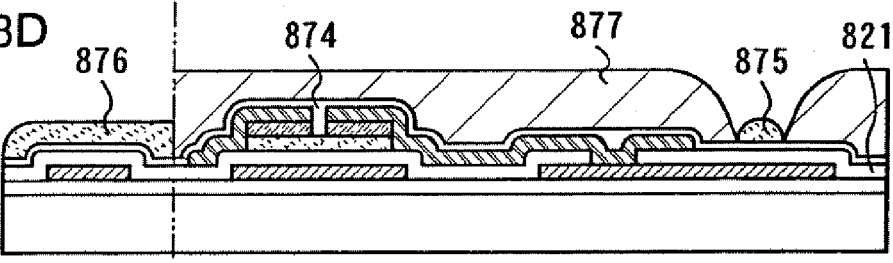

Next, as shown in FIG. 18D, a protective film 874 is formed. A silicon nitride film having a 100 nm film thickness is formed as the protective film by a sputtering method using a silicon target, and argon and nitrogen (a flow rate of Ar:$N_2$=1:1) as a sputtering gas.

Next, as shown in FIG. 18D, an interlayer insulating film 877 is formed after forming sixth mask patterns 875 and 876 in a region where the protective film 874 and the connection conductive layer 813 are superposed and in a region where the gate wiring layer and the source wiring layer are connected to connection terminals. The sixth mask patterns are masks for forming an interlayer insulating film to be formed later. A solution of a fluorine-based silane coupling agent dissolved in a solvent, which forms a liquid-repellent surface is discharged by droplet discharge as the sixth mask patterns, and polyimide is discharged by droplet discharge as the interlayer insulating film 877. Thereafter, both the sixth mask patterns 875 and 876 and the interlayer insulating film 877 are baked by heating at 200° C. for 30 minutes and heating at 300° C. for an hour.

Note that, an inorganic material, a low dielectric constant (low-k) material, silicon oxide, silicon nitride, silicon oxynitride, PSG (phosphorus glass), BPSG (phosphorus boron glass), alumina film, or the like can be used in addition to polyimide, acrylic, polyamide, or heat-resistant organic resin such as siloxane as the material of the sixth mask patterns.

Figure 18E:
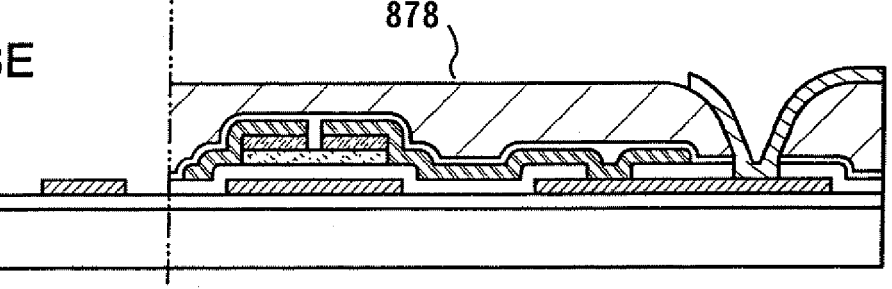

Next, as shown in FIG. 18E, the sixth mask patterns 875 and 876 are etched by using a mixed gas of $CF_4$, $O_2$, and He (a flow rate of $CF_4:O_2$:He=8:12:7). Thereafter, parts of the protective film 874 and the gate insulating film 821 are etched to form a second contact hole. In this etching step, the protective film 874 and the gate insulating film 821 in the region where the gate wiring layer and the source wiring layer are connected to the connection terminals are also etched.

A seventh mask pattern is formed after the third conductive layer is formed. Indium tin oxide (ITO) containing silicon oxide is formed by a sputtering method to have a 110 nm film thickness as the third conductive layer, and polyimide which is the seventh mask pattern is dropped by droplet discharge in a region where a pixel electrode is formed later to heat at 200° C. for 30 minutes.

In this embodiment, the third conductive layer is formed from ITO containing silicon oxide to manufacture a transmission type liquid crystal display panel. However, instead, the third conductive layer may be formed by forming and baking a predetermined pattern using a composition containing indium tin oxide (ITO), zinc oxide (ZnO), indium zinc oxide (IZO), zinc oxide (GZO) added with gallium, indium tin oxide containing silicon oxide, or the like. In addition, in the case of manufacturing a reflection type liquid crystal display panel, a composition mainly containing metal particles such as Ag (silver), Au (gold), Cu (copper), W (tungsten), or Al (aluminum) can be used.

Figure 23:
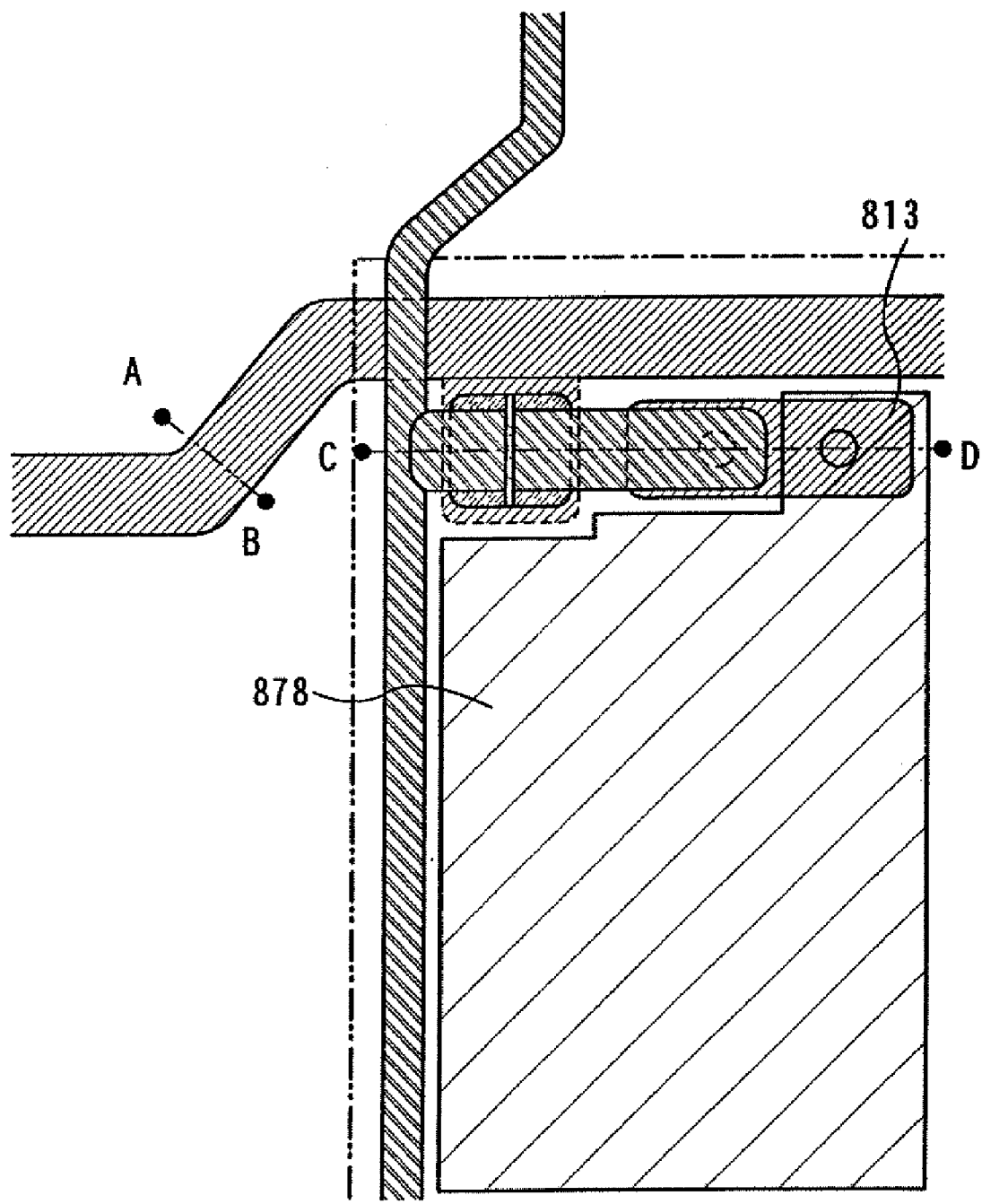
FIG. 23 is a top view of illustrating the process for manufacturing a semiconductor device according to the present invention.

Then, a pixel electrode 878 is formed by etching the third conductive layer using the seventh mask pattern. In this etching step, the third conductive layer formed in the region where the gate wiring layer and the source wiring layer are connected to the connection terminals is also etched. Thereafter, the seventh mask pattern is peeled by using a peeling solution. Note that FIG. 23 shows a planar view corresponding to lines A-B and C-D of FIG. 18E.

The pixel electrode 878 is connected to the connection conductive layer 813 in the second contact hole. Since the connection conductive layer 813 is connected to the drain wiring layer 872, the pixel electrode 878 and the drain wiring layer 872 are electrically connected. In this embodiment, although the drain wiring layer 872 is formed from silver (Ag) and the pixel electrode 878 is formed from ITO containing silicon oxide, the silver is not oxidized since the drain wiring layer and the pixel electrode are not directly connected.

Therefore, the both (drain wiring layer and the pixel electrode) can be electrically connected without increasing the contact resistance.

Alternatively, the pixel electrode can be formed without an etching step by selectively dropping a solution containing a conductive material by droplet discharge as another method for forming the pixel electrode. Furthermore, after forming a solution, which forms a liquid-repellent surface, in a region where the pixel electrode is later not formed as a mask pattern, the pixel electrode can be formed by discharging a conductive solution. In this case, the mask pattern can be removed by ashing using oxygen. Alternatively, the mask pattern may be left over without removing it.

Through the steps mentioned above, an active matrix substrate can be formed.

Figure 19A:
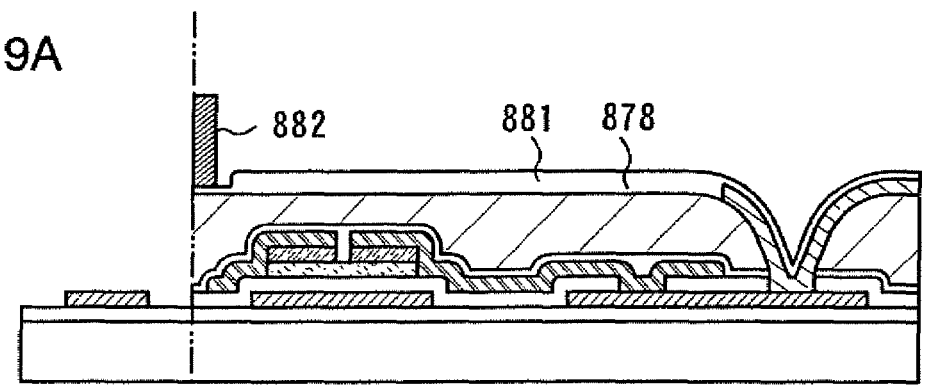
FIGS. 19A to 19C are cross-sectional views illustrating a process for manufacturing a semiconductor device according to the present invention.

Next, as shown in FIG. 19A, an insulating film is formed by a printing method or a spin-coating method to cover the first pixel electrode 878, and an alignment film 881 is formed by rubbing. Note that the alignment film 881 can be also formed by an oblique evaporation method.

Then, a sealant 882 having a closed-loop shape is formed by droplet discharge in a periphery region where a pixel is formed. A liquid crystal material is dropped inside the closed-loop formed with the sealant 882 by a dispenser method (drop method).

Figure 25A:
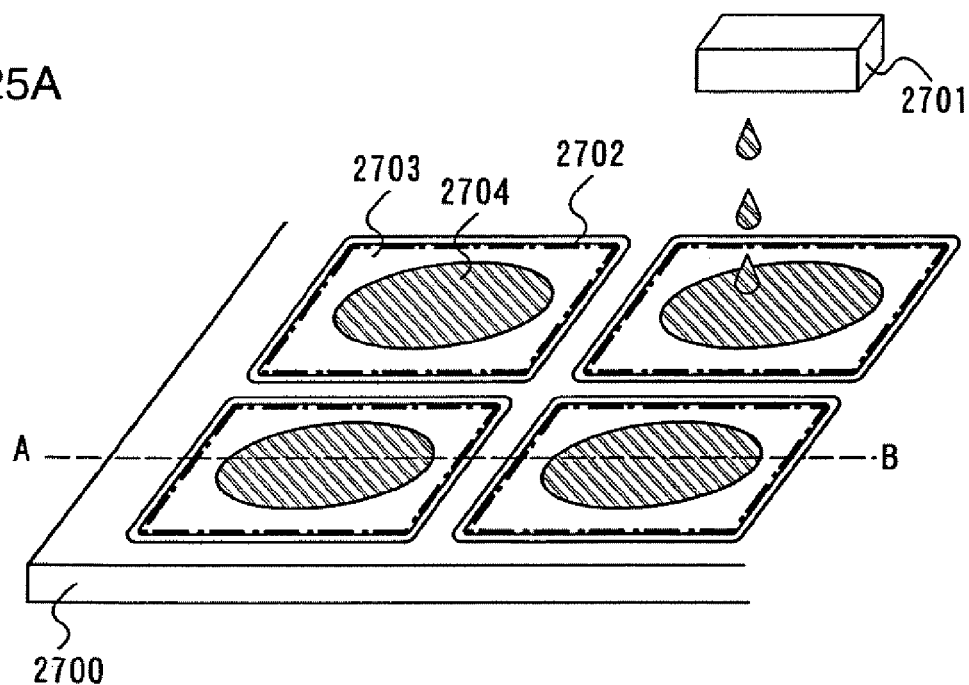
FIGS. 25A and 25B are diagrams illustrating a liquid-crystal dropping method that can be applied to the present invention.
Figure 25B:
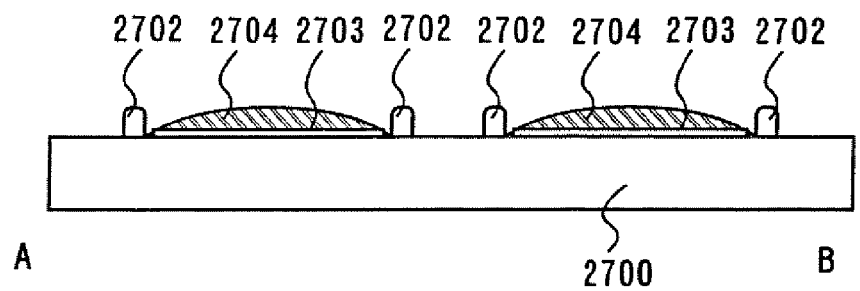

Here, a step of dropping the liquid-crystal material is shown with reference to FIGS. 25A and 25B. FIG. 25A is a perspective view of the step of dropping the liquid crystal material by a dispenser 2701, and FIG. 25B is a cross-sectional view taken along a line A-B of FIG. 25A.

A liquid crystal material 2704 is dropped or discharged from the dispenser 2701 to cover a pixel portion 2703 surrounded by a sealant 2702. A liquid crystal layer can be formed either by moving the dispenser 2701 or by fixing the dispenser 2701 and moving a substrate 2700. Alternatively, a liquid crystal material may be dropped at once by providing a plurality of dispensers 2701.

As shown in FIG. 25B, the liquid crystal material 2704 can be selectively dropped or discharged in a region surrounded by the sealant 2702.

Figure 19B:
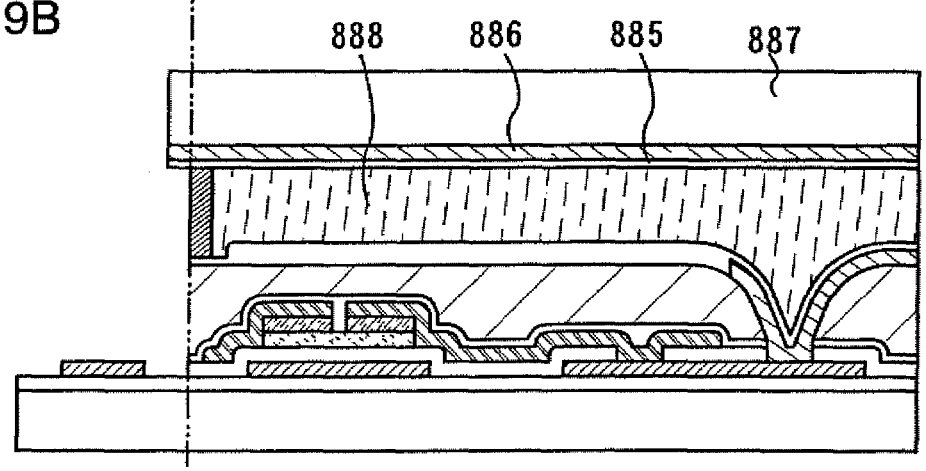

Next, as shown in FIG. 19B, in a vacuum, a liquid crystal layer 888 filled with the liquid crystal material is formed by attaching the substrate 800 to an opposite substrate 887 provided with an alignment film 885 and a second pixel electrode (opposite electrode) 886 and by performing ultraviolet curing.

The sealant 882 may be mixed with a filler, and further, a color filter, a shielding film (black matrix), or the like may be formed in the opposite substrate 887. In addition, a dipping method (pipe method) for injecting the liquid crystal material by using a capillary phenomenon after attaching the opposite substrate can be used instead of the dispenser method (drop method) as a method for forming the liquid crystal layer 888.

Furthermore, after forming the sealant 882 over the opposite substrate 887 and discharging the liquid crystal material in a region surrounded using the sealant 882 by the above method, the substrate 800 having the pixel portion and the opposite substrate 887 may be attached.

Figure 19C:
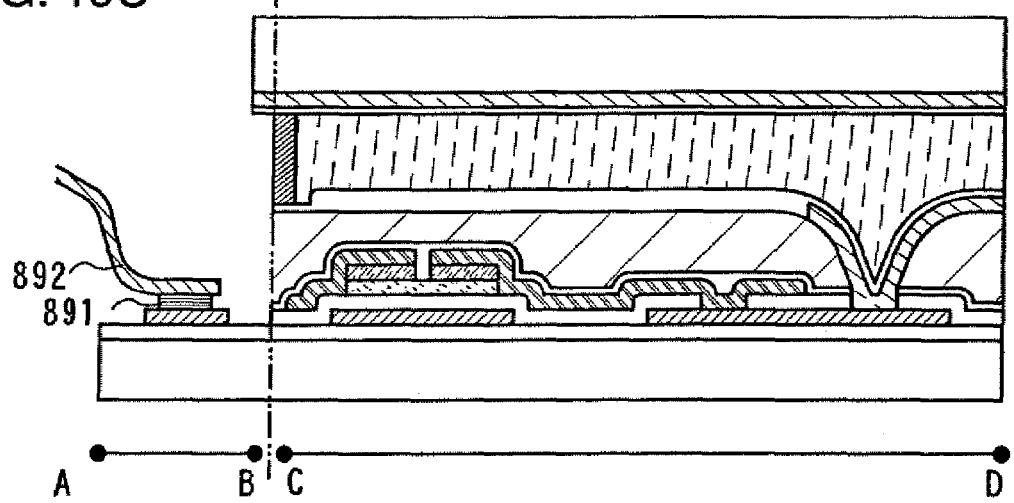

Next, as shown in FIG. 19C, when an insulating film is formed over each end portion of the gate wiring layer 811 and the source wiring layer (not shown), the insulating film is removed. Thereafter, a connection terminal 892 (a connection terminal connected to the gate wiring layer, and a connection terminal connected to the source wiring layer is not shown) is attached through an anisotropic conductive layer 891. Furthermore, it is preferable to seal connection portions of each wiring layer and connection terminal with the sealing resin.

According to this structure, moisture generated from a cross-sectional portion can be prevented from penetrating the pixel portion and deteriorating.

Through the steps mentioned above, a liquid crystal display panel can be manufactured. Note that, in order to preventing electrostatic discharge damage, a protective circuit typically a diode or the like may be used between the connection terminal and the source wiring (gate wiring) or in the pixel portion. In this case, the electrostatic discharge damage can be prevented by manufacturing in the same step as the above TFT and by connecting the gate wiring layer of the pixel portion to the drain or source wiring layer of the diode.

Note that any one of Embodiment Mode 1 to Embodiment Mode 10 can be applied to this embodiment.

Embodiment 2

In this embodiment, a method for manufacturing a light-emitting display panel as a display panel is described with reference to FIGS. 27A to 27C, FIGS. 28A to 28C, FIGS. 29A to 29C, FIGS. 30A and 30B, and FIGS. 31 to 34. FIGS. 27A to 27C, FIGS. 28A to 28C, FIGS. 29A to 29C, and FIGS. 30A and 30B schematically show longitudinal sectional structural views of a pixel portion and a connection terminal, and FIGS. 31 to 34 show planar structures corresponding to lines A-B and C-D.

As shown in FIG. 27A, as well as in Embodiment 1, a surface of a substrate 2000 is oxidized at 400° C. to form an insulating film 2001 having a 100 nm film thickness. Then, a first conductive layer is formed over the insulating film 2001, and first mask patterns 2003 to 2006 are formed over the first conductive layer by droplet discharge. An AN 100 glass substrate manufactured by Asahi Glass Co., Ltd. is used as the substrate 2000, and a tungsten film having a 100 nm film thickness is formed by a sputtering method as the first conductive layer. Polyimide is discharged by droplet discharge and baked by heating at 200° C. for 30 minutes as the first mask patterns. The first mask patterns are discharged over a gate wiring layer, a gate electrode layer, and a connection conductive layer which are formed later.

Figure 31:
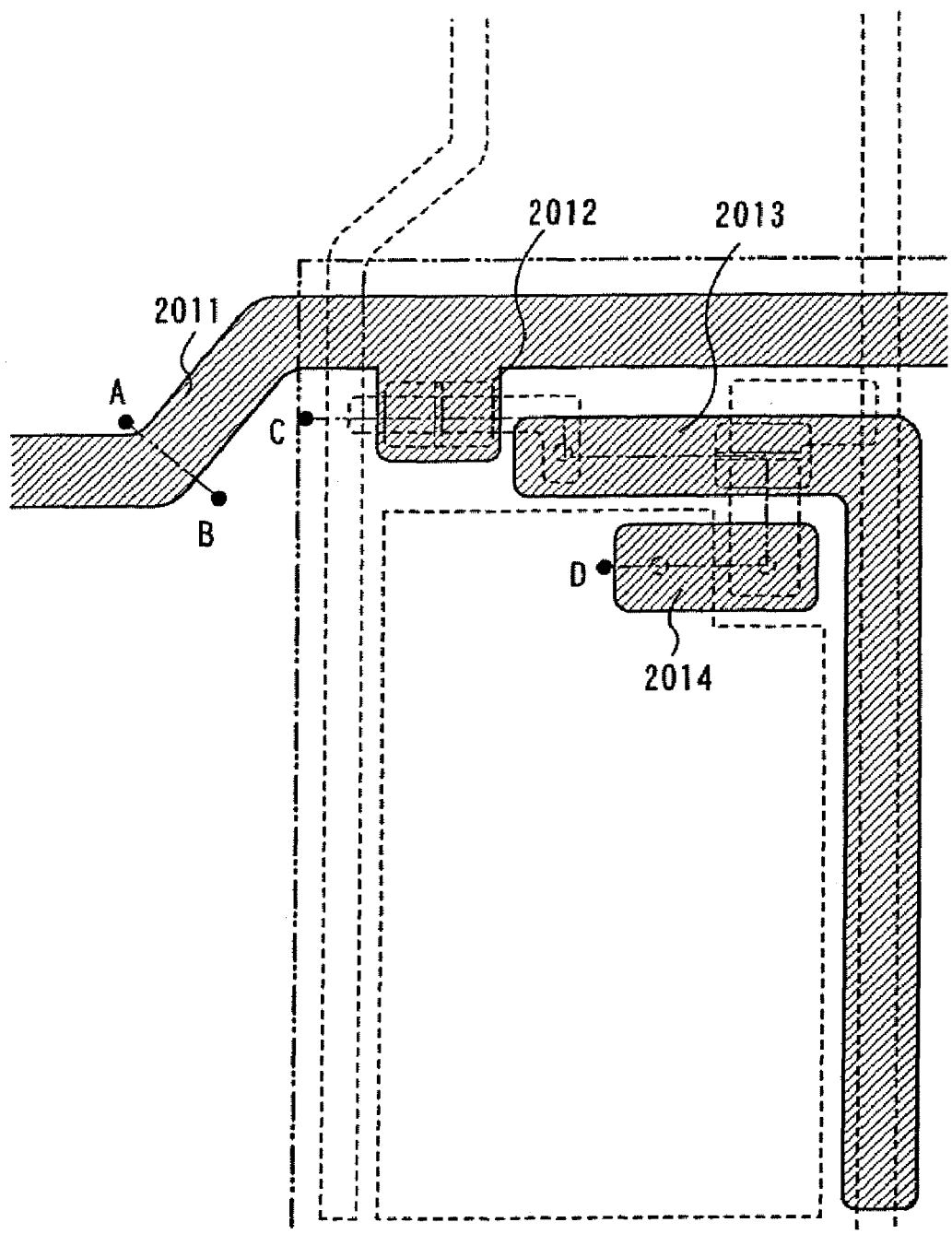
FIG. 31 is a top view of illustrating the process for manufacturing a semiconductor device according to the present invention.

Next, a part of the first conductive layer is etched by using the first mask patterns 2003 to 2006 to form a gate wiring layer 2011, gate electrode layers 2012 and 2013, and a connection conductive layer 2014. Thereafter, the first mask patterns 2003 to 2006 are peeled by using a peeling solution. Note that FIG. 27A schematically shows a longitudinal sectional structural view, and FIG. 31 shows a planar structure corresponding to lines A-B and C-D, and the figure is to be referred simultaneously.

Next, as shown in FIG. 27B, as well as in Embodiment 1, a gate insulating film 2015, a first semiconductor film 2016, and a second semiconductor film 2017 imparting n-type conductivity are formed by a plasma CVD method. A silicon oxynitride film (H, 1.8%, N: 2.6%, O: 63.9%, and Si: 31.7%) having a 110 nm film thickness is formed as the gate insulating film 2015. An amorphous silicon film is formed as the first semiconductor film 2016, and a semi-amorphous silicon film having a 50 nm film thickness is formed as the second semiconductor film 2017.

Next, as shown in FIG. 27B, second mask patterns 2018 and 2019 are formed over the second semiconductor film. Polyimide is discharged over the second semiconductor film by droplet discharge and heated at 200° C. for 30 minutes to form the second mask patterns. The second mask pattern 2018 is discharged in a region where first to fourth semiconductor regions are formed.

Figure 32:
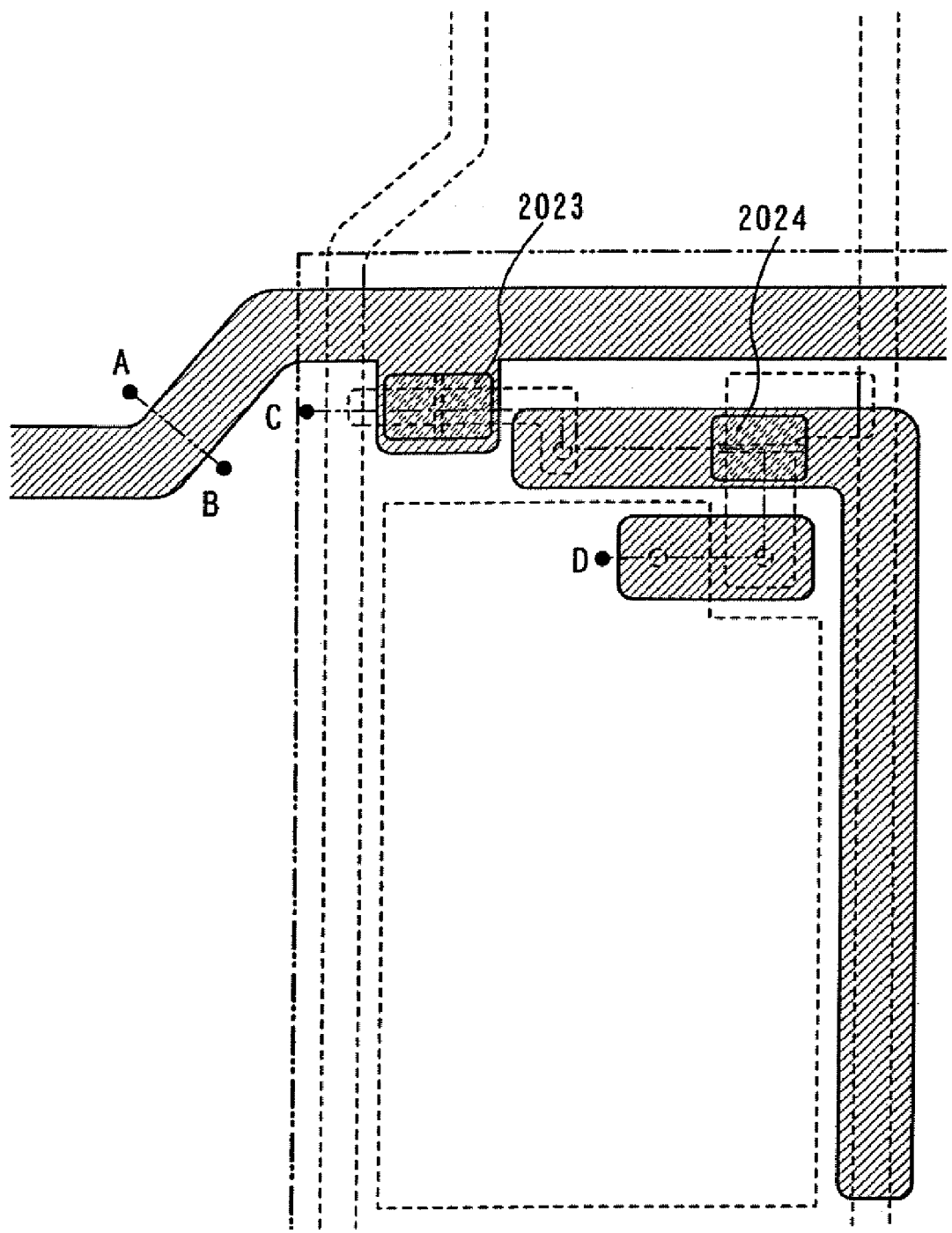
FIG. 32 is a top view of illustrating the process for manufacturing a semiconductor device according to the present invention.

Next, as shown in FIG. 27C, each of the first semiconductor film 2016 and the second semiconductor film 2017 is etched by using the second mask patterns 2018 and 2019 to form first semiconductor regions 2021 and 2022 and second semiconductor regions 2023 and 2024. Etching conditions of the first semiconductor film and the second semiconductor film are the same as in Embodiment 1. Thereafter, the second mask patterns 2018 and 2019 are peeled by using a peeling solution. Note that FIG. 32 shows a planar structure corresponding to lines A-B and C-D of a longitudinal sectional structure in FIG. 27C after peeling the second mask patterns, and the figure is to be referred simultaneously.

Next, as shown in FIG. 28A, third mask patterns 2031 and 2032 are formed.

A solution of a fluorine-based silane coupling agent dissolved in a solvent, which forms a liquid-repellent surface is discharged as the third mask patterns by droplet discharge in a region where the gate insulating film 2015 and the gate electrode layer 2013, the gate insulating film 2015 and the connection conductive layer 2014, each of which are superposed. Then, a fourth mask pattern 2033 is formed. The fourth mask pattern is a mask for forming a first contact hole, and polyimide is discharged by droplet discharge and heated at 200° C. for 30 minutes to form it. At this time, since the third mask patterns 2031 and 2032 are liquid-repellent and the fourth mask pattern 2033 is lyophilic, the fourth mask pattern 2033 is not formed in the region where the third mask patterns are formed.

As shown in FIG. 28B, the third mask patterns 2031 and 2032 are removed by oxygen ashing to expose a part of the gate insulating film. Then, the exposed gate insulating film is etched in the same manner as Embodiment 1 by using the fourth mask pattern 2033. Thereafter, the fourth mask pattern is peeled by oxygen ashing and etching using a peeling solution.

Next, second conductive layers 2041 and 2042 are formed by droplet discharge. The second conductive layers are to be subsequent source wiring layer and drain wiring layer. Here, the second conductive layer 2041 is formed to connect a second semiconductor region 2023 to the gate electrode layer 2013, and the second conductive layer 2042 is formed to connect a second semiconductor region 2024 to the connection conductive layer 2014.

Next, as shown in FIG. 28C, photopolymer 2051 is applied over the substrate. Here, positive-type photopolymer is applied by a spin-coating method and pre-baking is performed after drying. Then, the photopolymer 2051 is irradiated with laser light 2052 and 2053 emitted from an Nd:YVO$_4$ laser to expose and then developed to form a fifth mask pattern 2061 as shown in FIG. 29A.

Figure 33:
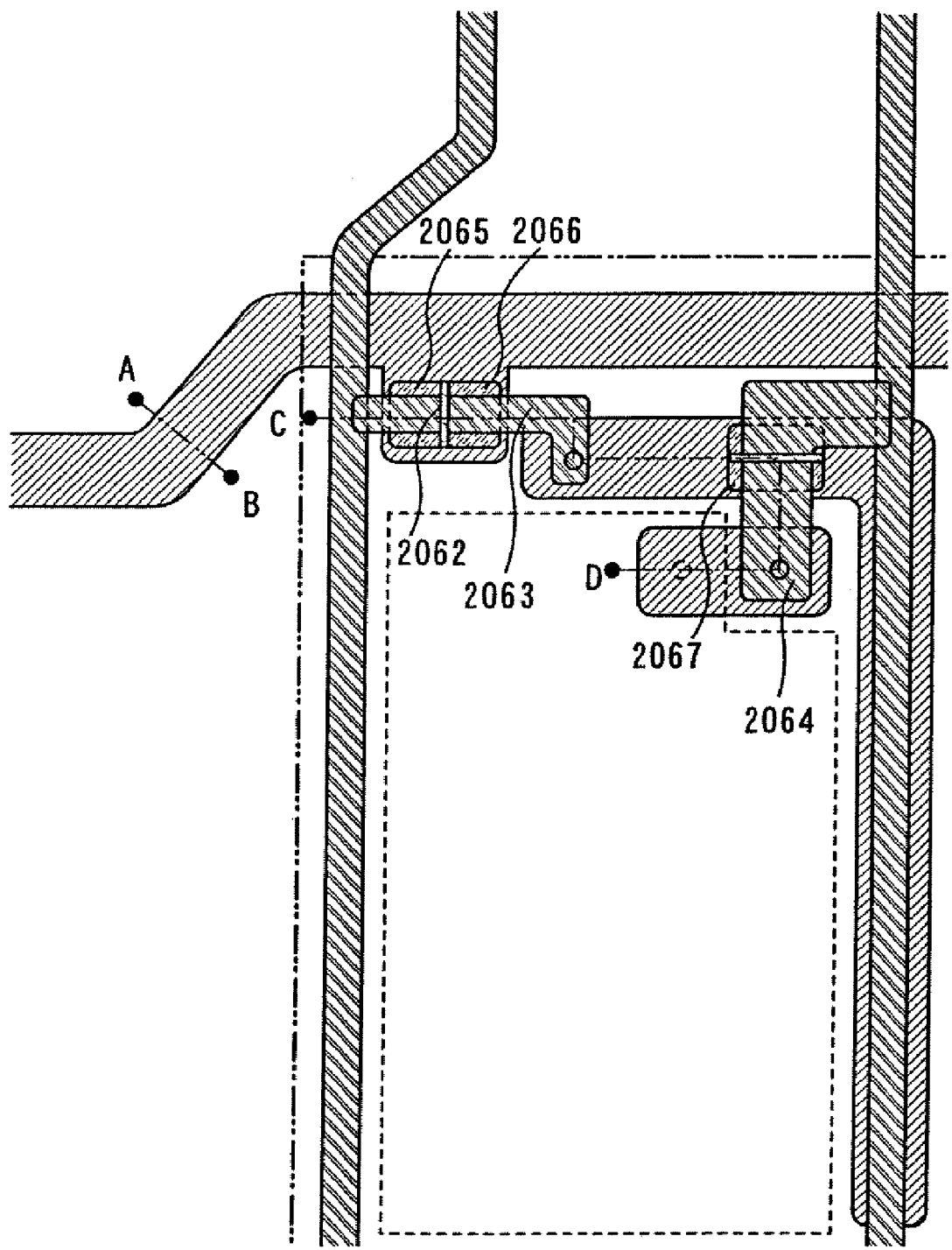
FIG. 33 is a top view of illustrating the process for manufacturing a semiconductor device according to the present invention.

Next, the second conductive layers 2041 and 2042 and the second semiconductor regions 2023 and 2024 are etched by using the fifth mask pattern to form third conductive layer (a source wiring layer and a drain wiring layer) 2062 to 2064 and third semiconductor regions (a source region and a drain region) 2065 to 2067 in the same manner as Embodiment 1. Thereafter, the fifth mask pattern 2061 is peeled by using a peeling solution. Note that FIG. 33 shows a planar structure corresponding to lines A-B and C-D of a longitudinal sectional structure in FIG. 29A after peeling the fifth mask pattern, and the figure is to be referred simultaneously.

Next, as shown in FIG. 29B, a protective film 2070 is formed in the same manner as Embodiment 1. An interlayer insulating film 2073 is formed after sixth mask patterns 2071 and 2072 are formed in a region where the protective film 2070 and the connection conductive layer 2014 are superposed and regions where the gate wiring layer 2011 and the source wiring layer are connected to connection terminals. A solution of a fluorine-based silane coupling agent dissolved in a solvent, which forms a liquid-repellent surface is discharged as the sixth mask patterns. Among a compound made from silicon, oxygen, and hydrogen formed from a siloxane-based material as a start material by droplet discharge, an insulating material of inorganic siloxane containing Si—O—Si bond or organic siloxane in which hydrogen connected to silicon is substituted by an organic group such as methyl or phenyl is discharged as the interlayer insulating film. Thereafter, both the sixth mask patterns 2071 and 2072, and the interlayer insulating film 2073 are baked by heating at 200° C. for 30 minutes and at 300° C. for an hour.

Next, as well as in Embodiment 1, a part of the protective film 2070 and the gate insulating film 2015 are etched after etching the sixth mask patterns 2071 and 2072 to form a second contact hole. In this etching step, the protective film 2070 and the gate insulating film 2015 in regions where the gate wiring layer and the source wiring layer are connected to the connection terminals are also etched.

Next, as shown in FIG. 29C, a seventh mask pattern is formed after forming the third conductive layer connected to the connection conductive layer 2014. As well as in Embodiment 1, indium tin oxide (ITO) containing silicon oxide having a 110 nm film thickness is formed and etched in a desired shape to form a pixel electrode 2081 as the third conductive layer. In this etching step, the third conductive layer formed in the regions where the gate wiring layer and the source wiring layer are connected to the connection terminals may be etched.

Alternatively, the pixel electrode can be formed without an etching step, using droplet discharge, by selectively dropping a solution containing a conductive material as another method for forming the pixel electrode. Furthermore, after forming a solution, which forms a liquid-repellent surface, as a mask pattern in a region where the pixel electrode is later not formed, the pixel electrode can be formed by discharging a conductive solution. In this case, the mask pattern can be removed by ashing using oxygen. Alternatively, the mask pattern may be left over without removing it.

Alternatively, instead thereof, indium tin oxide (ITO), zinc oxide (ZnO), indium zinc oxide (IZO), zinc oxide (GZO) added with gallium, indium tin oxide containing silicon oxide may be used as the material of the pixel electrode.

Since this embodiment relates to the structure in which emitted light is radiated in the direction of the substrate 2000, in other words, the transmission type light-emitting display panel, the pixel electrode is formed from the light-transmitting conducive film. However, in the case of a structure in which emitted light is radiated in the opposite direction of the substrate 2000, in other words, manufacturing a reflection type light-emitting display panel, a composition mainly containing metal particles such as Ag (silver), Au (gold), Cu (copper), W (tungsten), or Al (aluminum) can be used. In this case, the sixth mask patterns can be formed from an insulating film containing a color pigment, resist, or the like. Since the sixth mask patterns function as a shielding film, the contrast of a display device, which is formed later, is enhanced.

Figure 34:
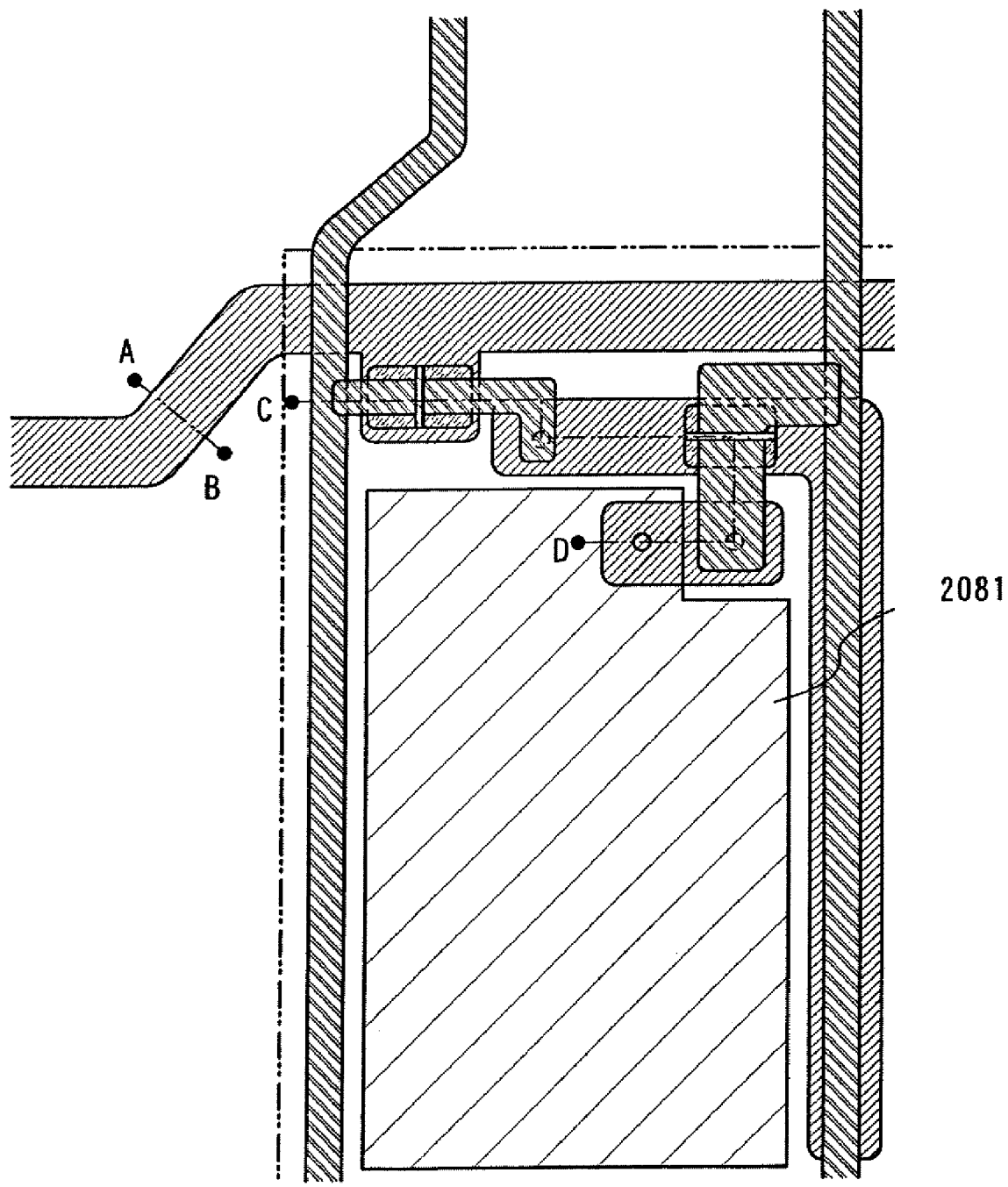
FIG. 34 is a top view of illustrating the process for manufacturing a semiconductor device according to the present invention.

Thereafter, the seventh mask pattern is peeled by using a peeling solution. Note that FIG. 34 shows a planar view corresponding to lines A-B and C-D of FIG. 29C.

The pixel electrode 2081 is connected to the connection conductive layer 2014 in the second contact hole. Since the connection conductive layer 2014 is connected to the drain wiring layer 2064, the pixel electrode 2081 and the drain wiring layer 2064 are electrically connected. In this embodiment, although the drain wiring layer 2064 is formed from silver (Ag) and the pixel electrode 2081 is formed from ITO containing silicon oxide, the silver is not oxidized since the drain wiring layer and the pixel electrode are not directly connected. Therefore, the both (drain wiring layer and the pixel electrode) can be electrically connected without increasing the contact resistance.

Through the steps mentioned above, an active matrix substrate having a switching TFT 2082 and a driving TFT 2083 can be formed.

Figures 30A, 30B:
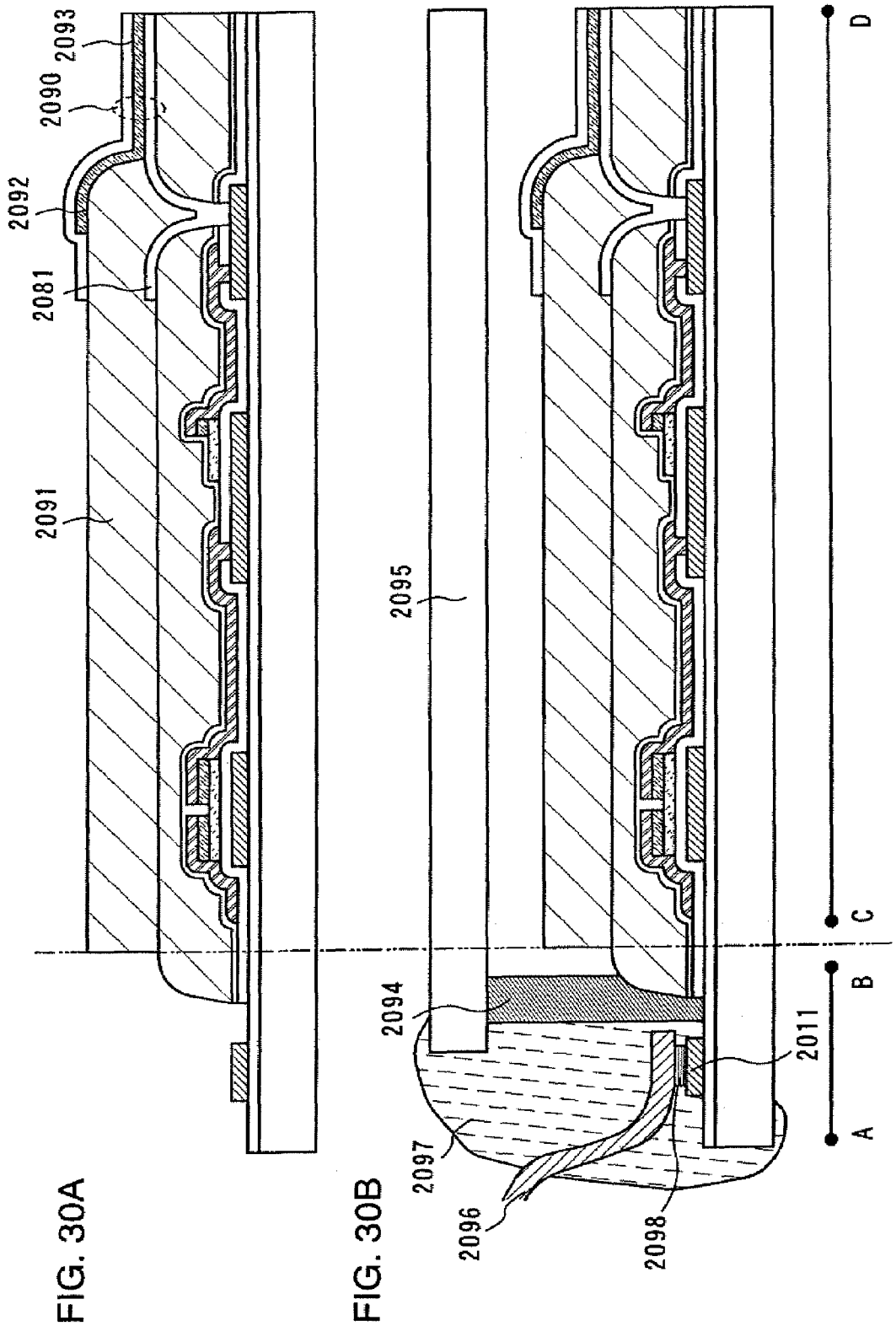
FIGS. 30A and 30B are cross-sectional views illustrating the process for manufacturing a semiconductor device according to the present invention.

Next, a protective layer of silicon nitride or silicon nitride oxide, and an insulating layer 2091 are formed over the entire surface. Then, after forming the insulating layer over the entire surface by a spin-coating method or a dipping method, an opening is formed by an etching process as shown in FIG. 30A as the insulating layer 2091. This etching is processed to expose the first pixel electrode 2081 by etching simultaneously with the protective layer which is in the lower layer of the insulating layer 2091. In addition, when the insulating layer 2091 is formed by droplet discharge, the etching process is not necessarily needed.

The insulating layer 2091 is formed providing an opening having a through hole in accordance with a position where a pixel is formed corresponding to the first electrode 2081. This insulating layer 2091 can be formed from an inorganic insulating material such as silicon oxide, silicon nitride, silicon oxynitride, aluminum oxide, aluminum nitride, aluminum oxynitride, or the like; acrylic acid, methacrylic acid, and a derivative thereof; a high molecular weight material which is heat resistant such as polyimide, aromatic polyamide, or polybenzimidazole; an inorganic siloxane insulating material including a Si—O—Si bond, among the compound made from silicon, oxygen, and hydrogen, formed by using a siloxane-based material as a start material; or an organic siloxane insulating material in which hydrogen connected to silicon is substituted by an organic group such as methyl or phenyl. When the insulating layer 2091 is formed from a photosensitive material or a non-photosensitive material such as acrylic or polyimide, it is preferable since the edge thereof has a shape in which a curvature radius changes continuously and a thin film in the upper layer is formed without a step disconnection.

Next, after forming a light-emitting substance containing layer 2092 by an evaporation method or an application such as a spin-coating method and ink-jet, a second pixel electrode 2093 is formed and then a light-emitting element 2090 is formed. This light-emitting element 2090 is connected to the driving TFT 2083 in its structure. Thereafter, a protective laminated layer is formed to seal the light-emitting element 2090. The protective laminated layer includes lamination of a first inorganic insulating film, a stress relaxation film, and a second inorganic insulating film.

Note that, before forming the light-emitting substance containing layer 2092, moisture adsorbed in the insulating layer 2091 or on the surface thereof is to be removed at heat treatment of 200° C. in an atmospheric pressure. In addition, it is preferable to perform beat treatment at temperatures from 200° C. to 400° C., preferably temperatures from 250° C. to 350° C. under a low pressure to form the light-emitting substance containing layer 2092 by a vacuum evaporation method or droplet discharge under a low pressure without exposing it to an atmosphere.

Additionally, surface treatment may be added by exposing the surface of the first pixel electrode 2081 to oxygen plasma or irradiating the surface thereof with ultraviolet radiation light.

The light-emitting substance containing layer 2092 is formed from a charge injection transport substance and a light-emitting material containing an organic compound or an inorganic compound. The light-emitting substance containing layer 2092 includes one or a plurality of layers selected from a low molecular weight organic compound, a middle molecular weight organic compound typified by oligomer, dendrimer, or the like, and a high molecular weight organic compound. Alternatively, an inorganic compound having electron injection transportability or hole injection transportability may be combined.

The following metal complex or the like having a quinoline skeleton or a benzoquinoline skeleton can be given especially as an example of a substance having high electron transportability among the charge injection transport substance: tris(8-quinolinolato)aluminum (abbreviated as $Alq_3$), tris(4-methyl-8-quinolinolato)aluminum (abbreviated as $Almq_3$), bis(10-hydroxybenzo[h]-quinolinato)beryllium (abbreviated as $BeBq_2$), bis(2-methyl-8-quinolinolato)(4-phenylphenolato) aluminum (abbreviated as BAlq), or the like.

In addition, the following aromatic amine-based compound (that is, a compound having a benzene ring-nitrogen bond) can be given as an example of a substance having high hole transportability: 4,4'-bis[N-(1-naphthyl)-N-phenyl-amino]-biphenyl (abbreviated as α-NPD), 4,4'-bis[N-(3-methylphenyl)-N-phenyl-amino]biphenyl (abbreviated as TPD) 4,4',4''-tris(N,N-diphenyl-amino)-triphenylamine (abbreviated as TDATA), 4,4',4''-tris[N-(3-methylphenyl)-N-phenyl-amino]-triphenylamine (abbreviated as MTDATA), or the like.

In addition, a compound of an alkaline metal or an alkaline earth metal such as lithium fluoride (LiF), cesium fluoride (CsF), or calcium fluoride ($CaF_2$) can be given especially as an example of a substance having high electron injectability among the charge injection transport substance. Additionally, a mixture of a substance having high electron transportability such as $Alq_3$ and an alkaline earth metal such as magnesium (Mg) may be also applied.

The following metal oxide can be given as an example of a substance having high hole injectability among the charge injection transport substance: molybdenum oxide ($MoO_x$)), vanadium oxide ($VO_x$), ruthenium oxide ($RuO_x$), tungsten oxide ($WO_x$), manganese oxide ($MnO_x$), or the like. Additionally, a phthalocyanine-based compound such as phthalocyanine (abbreviated as $H_2Pc$) or copper phthalocyanine (CuPc) can be given as an example.

A light-emitting layer may have a structure performing a color display by forming a light-emitting layer having different emission wavelength ranges per pixel. Typically, a light-emitting layer corresponding to each color of R (red), G (green), and B (blue) is formed in this case, color purity can be also improved and a mirror surface of a pixel portion can be prevented by having a structure provided with a filter (colored layer) in which light in the emission wavelength range is transmitted in the direction of light radiation of the pixel. It is possible to skip providing a circular polarizing plate or the like which is conventionally necessary by providing the filter (colored layer), and this can prevent loss of light radiated from the light-emitting layer. Furthermore, there can be less variation of color tone generated in the case of obliquely seeing the pixel portion (a display screen).

There are various light-emitting material which forms the light-emitting layer. The following can be used as a low molecular weight organic light-emitting material: 4-dicyanomethylene-2-methyl-6-[2-(1,1,7,7-tetramethyljulolidine-9-yl)ethenyl]-4H-pyran (abbreviated as DCJT), 4-dicyanomethylene-2-t-butyl-6-[2-(1,1,7,7-tetramethyljulolidine-9-yl) ethenyl]-4H-pyran, periflanthen, 2,5-dicyano-1,4-bis[2-(10-methoxy-1,1,7,7-tetramethyljulolidine-9-yl)ethenyl]

benzene, N,N'-dimethylquinacridon (abbreviated as DMQd), coumarin6, coumarin545T, tris(8-quinolinolato)aluminum (abbreviated as $Alq_3$), 9,9'bianthryl, 9,10-diphenylanthracene (abbreviated as DPA), 9,10-bis(2-naphthyl)anthracene (abbreviated as DNA), or the like. Alternatively, another substance may be used.

On the other hand, a high molecular weight organic light-emitting material has higher physical intensity and higher durability of an element compared with the low molecular weight organic light emitting material. In addition, manufacturing the element is comparatively easy since the deposition by application is possible. The structure of a light-emitting element using the high molecular weight organic light-emitting material is same as in the case of using the low molecular weight organic light-emitting material, which is to be cathode/light-emitting substance containing layer/anode. However, when the light-emitting substance containing layer using the high molecular weight organic light-emitting material is formed, it is difficult to form a laminated structure as in the case of using the low molecular weight organic light-emitting material. Thus, a double-layered structure is formed in many cases, which is specifically a structure of cathode/light-emitting layer/hole transport layer/anode.

Since luminescence color depends on materials which form the light-emitting layer, a light-emitting element that shows a desired luminescence by selecting these materials can be formed. Polyparaphenylene vinylene based, polyparaphenylene based, polythiophene based, and polyfluorene based light-emitting materials are given as an example of a high molecular weight light-emitting material which can be used to form the light-emitting layer.

The following can be given as an example of the polyparaphenylene vinylene based light-emitting material: a derivative of poly(paraphenylenevinylene) [PPV], poly(2,5-dialkoxy-1,4-phenylenevinylene) [RO—PPV], poly(2-(2'-ethyl-hexoxy)-5-methoxy-1,4-phenylenevinylene) [MEH-PPV], poly(2-(dialkoxyphenyl)-1,4-phenylenevinylene) [ROPh-PPV], or the like. The following can be given as an example of the polyparaphenylene based light-emitting material: a derivative of polyparaphenylene [PPP], poly(2,5-dialkoxy-1,4-phenylene) [RO—PPP], poly(2,5-dihexoxy-1,4-phenylene), or the like. The following can be given as an example of the polythiophene based light-emitting material: a derivative of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2,2bithiophene] [PTOPT], or the like. The following can be given as an example of the polyfluorene based light-emitting material: a derivative of polyfluorene [PF], poly(9,9-dialkylfluorene) [PDAF], poly(9,9-dioctylfluorene) [PDOF], or the like.

Note that the hole injectability from an anode can be enhanced when a high molecular weight organic light-emitting material having hole transportability is sandwiched between the anode and a high molecular weight organic light-emitting material having light-emitting properties. Generally, a solution in which an acceptor material is dissolved in water is applied by a spin-coating method or the like. In addition, the light-emitting material having light-emitting properties mentioned above can be laminated therewith since the acceptor material is insoluble in an organic solvent. A mixture of PEDOT and camphor sulfonic acid (CSA) as an acceptor material, a mixture of polyaniline [PANI] and polystyrenesulphonic [PSS] as an acceptor material, or the like can be given as an example of the high molecular weight organic light-emitting material having hole transportability.

In addition, the light-emitting layer can have a structure emitting monochromatic or white light emission. Using a white light-emitting material enables a color display by constituting a structure in which a filter (a colored layer) transmitting light having a particular wavelength on the side where light from a pixel is radiated.

In order to form a light-emitting layer having white light emission, for example, $Alq_3$, $Alq_3$ partially doped with Nile Red, which is a red light emitting pigment, p-EtTAZ, and TPD (aromatic diamine) are sequentially laminated by an evaporation method. In addition, in the case of forming the light-emitting layer by an application using spin coating, the light-emitting layer is preferably baked by vacuum heating after the application. For example, a poly (ethylenedioxythiophene)/poly (styrenesulfonic acid) solution (PEDOT/PSS) may be applied to an entire surface and baked to form a film that serves as a hole injection layer. Thereafter, a polyvinyl carbazole (PVK) solution doped with luminescent center pigment (such as 1,1,4,4-tetraphenyl-1,3-butadiene (TPB), 4-dicyanomethylene-2-methyl-6-(p-dimethylaminostyryl)-4H-pyran (DCM1), Nile red, or coumarin 6) may be applied to the entire surface and baked in order to form a film that serves as a light emitting layer.

The light-emitting layer can be formed in a single-layer, and a 1,3,4-oxadiazole derivative (PBD) having electron transportability may be dispersed in polyvinyl carbazole (PVK) having hole transportability. In addition, white light emission can be obtained by dispersing PBD for 30 wt % as an electron transport agent and dispersing appropriated doses of four kinds of dyes (TPB, coumarin6, DCM1, and Nile Red). In addition to the light-emitting element with which white light emission is obtained, as shown here, a light-emitting element that can obtain red light emission, green light emission, or blue light emission can be manufactured by appropriately selecting the materials of the light-emitting layer.

Furthermore, a triplet excited light-emitting material including a metal complex or the like may be used for the light-emitting layer in addition to a singlet excited light-emitting material. For example, among a pixel having red light-emitting properties, a pixel having green light-emitting properties, and a pixel having blue light-emitting properties, the pixel having red light-emitting properties with comparatively short half reduced luminescence time is formed from a triplet excited light-emitting material, and other pixels are formed from a singlet excited light-emitting material. Since the triplet excited light-emitting material has superior luminous efficiency, there is a feature that less power consumption is required to obtain the same luminance. In other words, in the case of applying the triplet excited light-emitting material to a red pixel, a few amount of current flown to a light-emitting element is required; therefore, the reliability can be enhanced. The pixel having red light-emitting properties and the pixel having green light-emitting properties may be formed from a triplet excited light-emitting material and the pixel having blue light-emitting properties may be formed from a singlet excited light-emitting material to reduce the power consumption. Further low power consumption can be realized by also forming the green light-emitting element, which has high human spectral luminous efficacy, from a triplet excited light-emitting material.

A metal complex used as a dopant, and a metal complex in which platinum, which is a third transition series element, serves as a center metal, a metal complex in which iridium serves as a center metal, or the like is known as an example of a triplet excited light-emitting material. The triplet excited light-emitting material is not limited to these compounds, and it is also possible to use a compound having the above structure and having an element belonging to Groups 8 to 10 of a periodic table for a center metal.

The substance mentioned above that forms the light-emitting layer containing substance is just an example, and a light-emitting element can be formed by appropriately laminating each functional layer such as a hole injection transport layer, a hole transport layer, an electron injection transport layer, an electron transport layer, a light-emitting layer, an electron block layer, or a hole block layer. In addition, a mixed layer or a mixed junction may be formed with the combination of each layer. The layer structure of the light-emitting layer can be varied. Instead of not equipping a particular electron injection region or light-emitting region, the variation of providing an electrode entirely for this purpose or providing a light-emitting material by dispersing can be permitted under the scope not departing the content of the present invention.

The light-emitting element formed by using the material mentioned above is emitted by having bias in the forward direction. A pixel of a display device formed by using the light-emitting element can be driven by a simple matrix system or an active matrix system. In either system, each pixel is emitted by applying bias in the forward direction at particular timing; however, the pixel is in non-luminescent state within the specified period. The reliability of the light-emitting element can be enhanced by applying bias in the opposite direction during non-luminescent time. The light-emitting element becomes a decline mode when light-emitting intensity is deteriorated under a certain driving condition or when luminance is apparently deteriorated due to the expansion of non-luminescent region in a pixel. However, the deterioration can be delayed and the reliability of a display device can be enhanced by alternating current driving.

Next, as shown in FIG. 30B, a sealant 2094 is formed to seal the substrate 2000 using a sealing substrate 2095. Thereafter, a connection terminal 2096 (a connection terminal connected to the gate wiring layer, and a connection terminal connected to the source wiring layer is not shown) is attached to each end portion of the gate wiring layer 2011 and the source wiring layer (not shown) through an anisotropic conductive layer 2098. Furthermore, it is preferable to seal connection portions of each wiring layer and the connection terminals with a sealing resin 2097. According to this structure, moisture generated from a cross-sectional portion can be prevented from penetrating the pixel portion and deteriorating.

Through the steps mentioned above, a light-emitting display panel can be manufactured. Note that a protective circuit for preventing electrostatic discharge damage, typically a diode or the like, may be provided between the connection terminal and the source wiring (gate wiring) or in the pixel portion. In this case, the electrostatic discharge damage can be prevented by manufacturing in the same step as the above TFT and by connecting the gate wiring layer of the pixel portion and the drain or source wiring layer of the diode.

Note that any one of Embodiment Mode 1 to Embodiment Mode 10 can be applied to this embodiment. In addition, although methods for manufacturing a liquid crystal display panel and a light-emitting display panel as display panels are shown, Embodiments 1 and 2 are not limited thereto. Embodiments 1 and 2 can be appropriately applied to an active-type display panel such as a DMD (Digital Micromirror Device), a PDP (Plasma Display Panel), an FED (Field Emission Display), or an electrophoresis display device (an electronic paper).

Embodiment 3

With reference to FIGS. 36A to 36D, light-emitting elements that are applicable in the embodiments described above will be described.

Figure 36A:
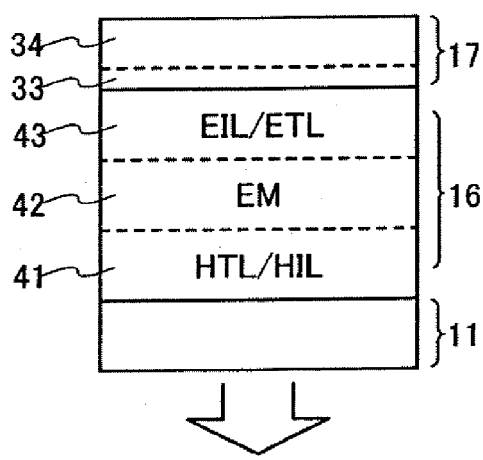
FIGS. 36A to 36D are diagrams each illustrating a structure of a light-emitting element that can be applied to the present invention.

FIG. 36A illustrates an example where a first pixel electrode 11 is formed of a light-transmitting conductive oxide material containing silicon oxide at a concentration of 1 to 15 atomic %. On the pixel electrode 11, a light-emitting substance containing layer 16 is formed, which has a lamination of a hole transport/injection layer 41, a light-emitting layer 42 and an electron injection/transport layer 43. On the layer 16, a second pixel electrode 17 is formed, which has a lamination of a first electrode layer 33 containing an alkali metal or an alkali earth metal such as LiF or MgAg and a second electrode layer 34 formed by using a metal material such as aluminum. This pixel structure allows light to be emitted from the first pixel electrode 11 side as shown by the arrow in the figure.

Figure 36B:
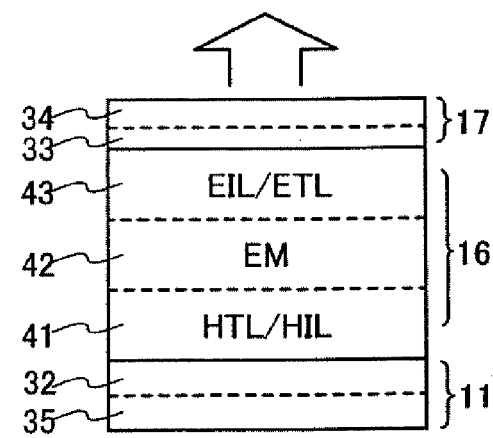

FIG. 36B illustrates an example where light is emitted from a second pixel electrode 17, and a first pixel electrode 11 has a lamination of a first electrode layer 35 formed by using a metal such as aluminum or titanium or a metal material containing the metal and nitrogen at a stoichiometric composition ratio or less, and a second electrode layer 32 formed by using a conductive oxide material containing silicon oxide at a concentration of 1 to 15 atomic % or less. On the first pixel electrode 11, a light-emitting substance containing layer 16 is formed, which has a lamination of a hole transport/injection layer 41, a light-emitting layer 42 and an electron injection/transport layer 43. On the layer 16, a second pixel electrode 17 is formed, which has a lamination of a third electrode layer 33 containing an alkali metal or an alkali earth metal such as LiF or CaF and a fourth electrode layer 34 formed by using a metal material such as aluminum. By forming each layer to have a thickness of 100 nm or less so as to transmit light, light can be emitted from the second pixel electrode 17.

In the case where light is emitted from the both directions, namely from the first pixel electrode and the second pixel electrode, in the light-emitting element that has the structure shown in FIG. 36A or FIG. 36B, a light-transmitting conductive film that has a larger work function is used as the first pixel electrode 11 while a light-transmitting conductive film that has a smaller work function is used as the second pixel electrode 17. Typically, the first pixel electrode 11 may be formed by using a conductive oxide material containing silicon oxide at a concentration of 1 to 15 atomic %, and the second pixel electrode 17 may be formed by using the third electrode layer 33 containing an alkali metal or an alkali earth metal such as LiF or CaF and the fourth electrode layer 34 formed by using a metal material such as aluminum so that each layer has a thickness of 100 nm or less.

Figure 36C:
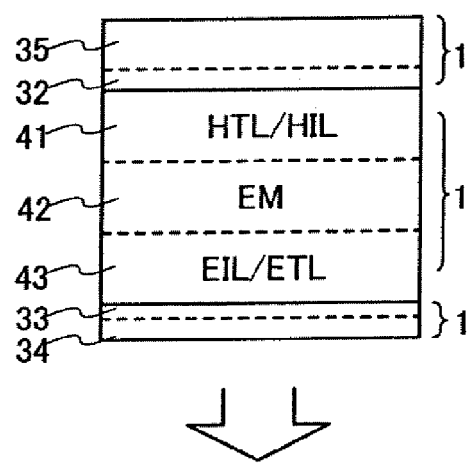

FIG. 36C illustrates an example where light is emitted from a first pixel electrode 11, and a light-emitting substance containing layer 16 has a lamination of an electron injection/transport layer 43, a light-emitting layer 42 and a hole transport/injection layer 41 in this order. On the light-emitting substance containing layer 16, a second pixel electrode 17 is formed, which has a lamination of a second electrode layer 32 formed by using a conducive oxide material containing silicon oxide at a concentration of 1 to 15 atomic % or less and a first electrode layer 35 formed by using a metal such as aluminum or titanium or a metal material containing the metal and nitrogen at a stoichiometric composition ratio or less in this order. A second pixel electrode 17 is formed to have a lamination of a third electrode layer 33 containing an alkali metal or an alkali earth metal such as LiF or CaF and a fourth electrode layer 34 formed by using a metal material such as aluminum. By forming each layer to have a thickness of 100 nm or less so as to transmit light, light can be emitted from the first pixel electrode 11.

Figure 36D:
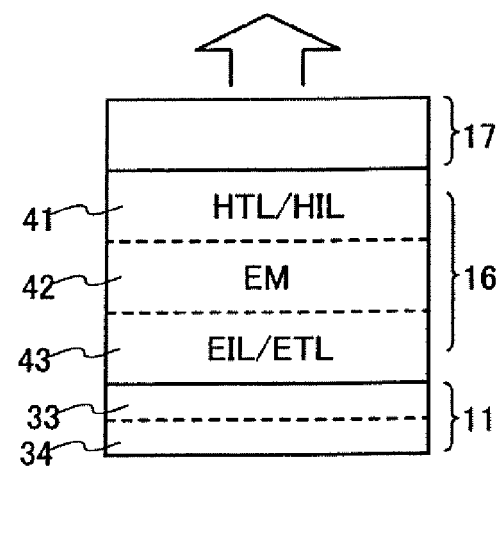

FIG. 36D illustrates an example where light is emitted from a second pixel electrode 17, and a light-emitting substance containing layer 16 has a lamination of an electron injection/transport layer 43, a light-emitting layer 42 and a hole transport/injection layer 41 in this order. A first electrode 11 has the same structure as FIG. 36C, and is formed thick enough to reflect light emitted in the light-emitting substance containing layer 16. A second pixel electrode 17 is formed by using a conductive oxide material containing silicon oxide at a concentration of 1 to 15 atomic %. In the structure, by forming the hole transport/injection layer 41 with the use of a metal oxide that is an inorganic substance (typically, molybdenum oxide or vanadium oxide), oxygen to be introduced during formation of the second electrode layer 32 is supplied to improve the hole injecting property so that a driving voltage can be reduced.

In the case where light is emitted from the both directions, namely from the first pixel electrode and the second pixel electrode, in the light-emitting element that has the structure shown in FIG. 36C or FIG. 36D, a light-transmitting conductive film that has a smaller work function is used as the first pixel electrode 11 while a light-transmitting conductive film that has a larger smaller work function is used as the second pixel electrode 17. Typically, the first pixel electrode 11 may be formed by using the third electrode layer 33 containing an alkali metal or an alkali earth metal such as LiF or CaF and the fourth electrode layer 34 formed by using a metal material such as aluminum so that each layer has a thickness of 100 mm or less, and the second pixel electrode 17 may be formed by using a conductive oxide material containing silicon oxide at a concentration of 1 to 15 atomic %.

Embodiment 4

With reference to FIGS. 37A to 37F, the pixel circuit of the light-emitting display panel shown in embodiment described above and the operation system thereof will be described.

Figure 37A:
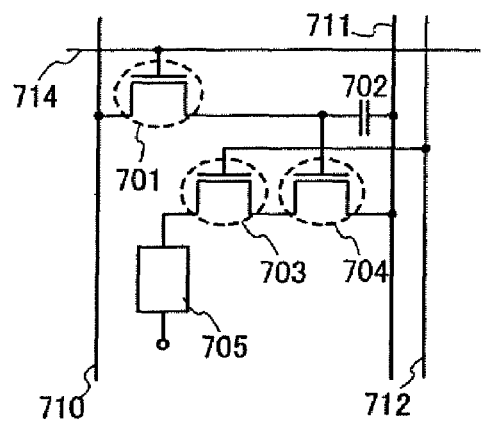
FIGS. 37A to 37F are diagrams each illustrating a pixel structure that can be applied to a light-emitting display panel according to the present invention.

In the pixel shown in FIG. 37A, a signal line 710, power supply lines 711 and 712 are arranged in a column direction, and a scan line 714 is arranged in a row direction. The pixel also includes a switching TFT 701, a driving TFT 703, a current controlling TFT 704, a capacitor 702 and a light-emitting element 705.

Figure 37B:
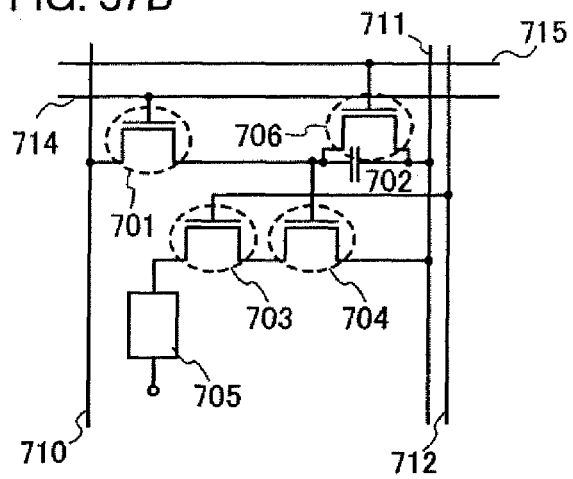
Figure 37C:
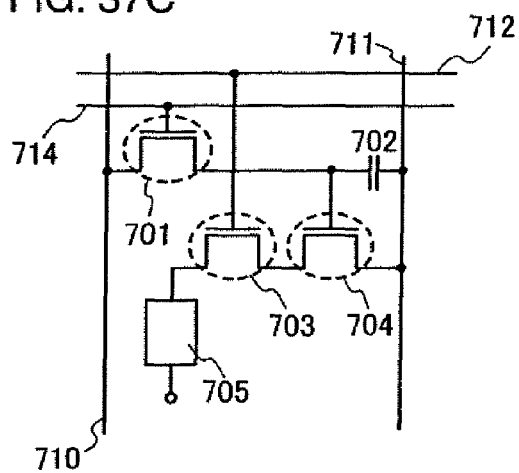
Figure 37D:
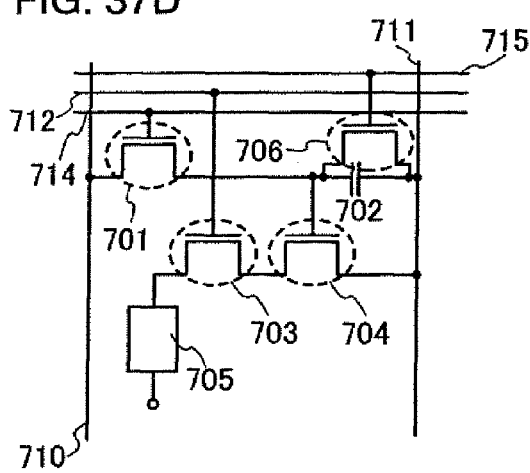

The pixel shown in FIG. 37C, which basically has the same structure as the pixel shown in FIG. 37A, is different only in that a gate electrode of a TFT 703 is connected to a power supply line 712 arranged in a row direction. That is to say, each of FIGS. 37A and 37C illustrates the same equivalent circuit diagram. However, compared to the case where the power supply line 712 is arranged in the column direction (FIG. 37A) to the case where the power supply line 712 is arranged in the row direction (FIG. 37C), each of the power supply lines is formed by using a conductive film of a different layer. In the present embodiment, attention is given to the wiring connected to the gate electrode of the driving TFT 703, and FIGS. 37A and 37C are separately illustrated to indicate that the layers for forming these wirings are different from each other.

In each of the pixels shown in FIGS. 37A and 37C, the TFTs 703 and 704 are connected in series. It is preferable that the channel length L (703) and channel width W (703) of the TFT 703 and the channel width L (704) and channel width W (704) of the TFT 704 satisfy L (703)/W (703):L (704)/W (704)=5 to 6000:1.

Note that the TFT 703 operates in the saturation region and functions to control a current value supplied to the light-emitting element 705 while the TFT 704 operates in the linear region and functions to control current supply to the light-emitting element 705. Both of the TFTs preferably have the same conductivity type in the light of the manufacturing steps, and N-channel TFTs are employed in the embodiment. The TFT 703 may be a depletion mode TFT as well as an enhancement mode TFT. According to the invention, which has the structure described above, the TFT 704 operates in the linear region. Therefore, slight fluctuation in Vgs of the TFT 704 has no influence on a current value supplied to the light-emitting element 705, Namely, a current value supplied to the light-emitting element 705 can be determined by the TFT 703, which operates in the saturation region. The structure described above makes it possible to improve luminance unevenness of light-emitting elements due to variations in characteristics of TFTs so that a display device with enhanced image quality can be provided.

In each of the pixels shown in FIGS. 37A to 37D, the TFT 701 controls an input of a video signal to the pixel. When the TFT 701 is turned ON, a video signal is input to the pixel. Then, the voltage of the video signal is held in the capacitor 702. Although each of FIGS. 37A and 37C illustrates a structure in which the capacitor 702 is provided, the invention is not limited to this. The capacitor 702 may be omitted when a gate capacitance or the like can substitute for the capacitor for holding a video signal.

The pixel shown in FIG. 37B, which basically has the same pixel structure as FIG. 37A, is different only in that a TFT 706 and a scan line 715 are additionally provided. Similarly, the pixel shown in FIG. 37D has the same pixel configuration as FIG. 37C, but only different in that the TFT 706 and a scan line 715 are additionally provided.

The switching (ON/OFF) of the TFT 706 is controlled by the scan line 715 provided additionally. When the TFT 706 is turned ON, a charge held in the capacitor 702 is discharged to turn OFF the TFT 704. Namely, the arrangement of the TFT 706 makes it possible to bring the light-emitting element 705 forcibly into a state where no current flows thereto. Therefore, the TFT 706 can be referred to as an erasing TFT. Thus, in the structures shown in FIGS. 37B and 37D, an emission period can be started simultaneously with or immediately after a writing period without awaiting completion of writing signals to all pixels, thereby improving the duty ratio.

Figure 37E:
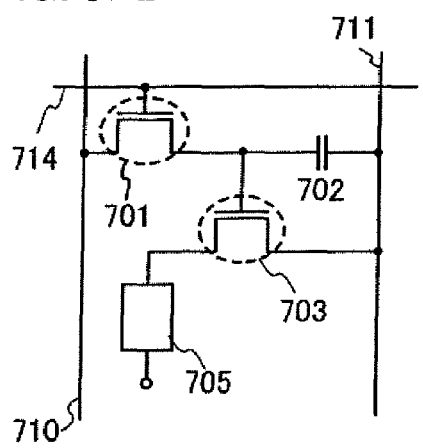

In the pixel shown in FIG. 37E, a signal line 710 and a power supply line 711 are arranged in a column direction, and a scan line 714 is arranged in a row direction. The pixel also includes a switching TFT 701, a driving TFT 703, a capacitor 702 and a light-emitting element 705. The pixel shown in FIG. 37F, which has the same pixel structure as FIG. 37E, is different only in that a TFT 706 and a scan line 715 are additionally provided. Also in the structure shown in FIG. 37F, the arrangement of the TFT 706 makes it possible to improve the duty ratio.

Figure 37F:
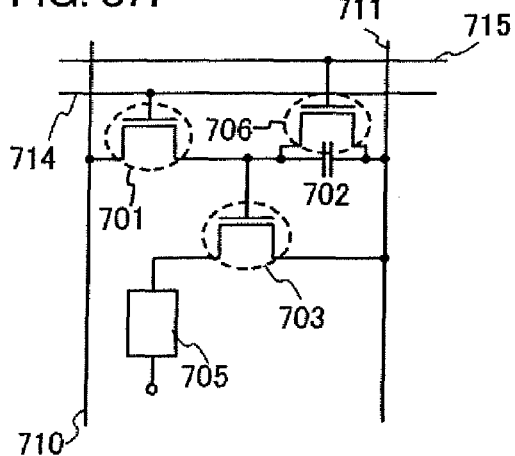

In particular, when a thin film transistor including an amorphous semiconductor or the like is formed as in the embodiment described above, the area occupied by the semiconductor film of the driving TFT is preferably made larger. Therefore, considering the aperture ratio, FIG. 37E or 37F is preferably employed as the number of TFTs is smaller.

Such an active matrix light-emitting device is advantageous in the case of increasing the pixel density since TFTs provided in each pixel enables low voltage driving. On the other hand, a passive matrix display device where a TFT is provided per column can be formed as well. The passive matrix display device, which has no TFT in each pixel, has a higher aperture ratio.

In the display device according to the invention, the driving method for an image display is not specifically limited. For example, a dot-sequential driving method, a line sequential driving method, or a frame-sequential driving method may be employed. Typically, the line-sequential driving method is employed, where a time-division gray scale driving method or an area gray scale driving method may be appropriately employed. An image signal input to a source line of the display device may be either an analog signal or a digital signal. In addition, a driver circuit of the display device may be designed appropriately in accordance with the image signal.

As for a display device using a digital video signal, there are a display device in which a video signal with a constant voltage (CV) is input to a pixel and a display device in which a video signal with a constant current (CC) is input to a pixel. The display device using a video signal with a constant voltage (CV) includes a display device in which a constant voltage is applied to a light-emitting element (CVCV) and a display device in which a constant current is applied to a light-emitting element (CVCC). In addition, the display device using a video signal with a constant current (CC) includes a display device in which a constant voltage is applied to a light-emitting element (CCCV) and a display device in which a constant current is applied to a light-emitting element (CCCC).

As described above, various circuit structures may be adopted.

Embodiment 5

In the present embodiment, a method for mounting driver circuits (signal line driver circuit 1402 and scan line driver circuits 1403a and 1403b) over the display panel shown in the embodiment described above will be described with reference to FIGS. 9A to 9C.

Figure 9A:
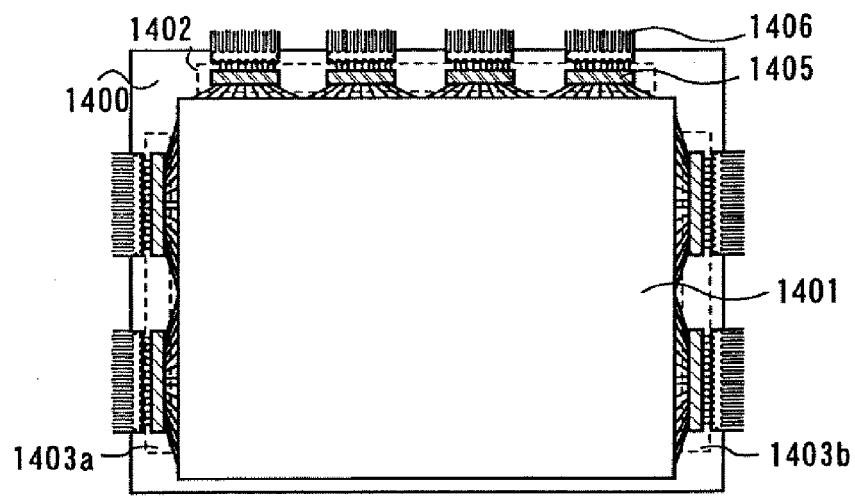
FIGS. 9A to 9C are top views each illustrating a mounting method of a driver circuit of a display device according to the present invention.

As shown in FIG. 9A, the signal line driver circuit 1402 and the scan line driver circuits 1403a and 1493b are mounted on the periphery of a pixel portion 1401. In FIG. 9A, IC chips 1405 are mounted over a substrate 1400 by COG bonding as the signal line driver circuit 1402 and the scan line driver circuits 1403a and 1403b, and the like. Each of the IC chips is connected to an external circuit through an FPC (Flexible Printed Circuit) 1406.

Figure 9B:
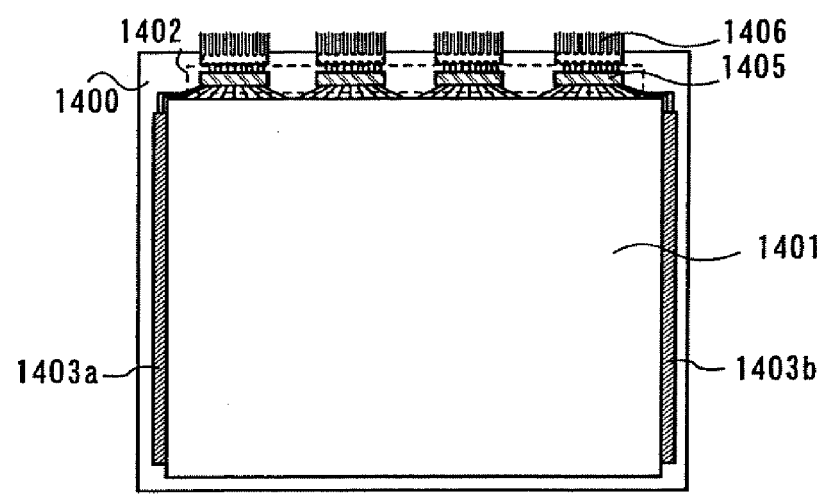

In the case of forming a TFT by using SAS or a crystalline semiconductor as shown in FIG. 9B, a pixel portion 1401 and scan line driver circuits 1403a and 1403b, and the like may be integrally formed over a substrate 1400 while mounting a signal line driver circuit 1402 and the like as separate IC chips. In FIG. 9B, IC chips 1405 are mounted over a substrate 1400 by COG as the signal line driver circuit 1402. Each of the IC chips is connected to an external circuit through the FPC 1406.

Figure 9C:
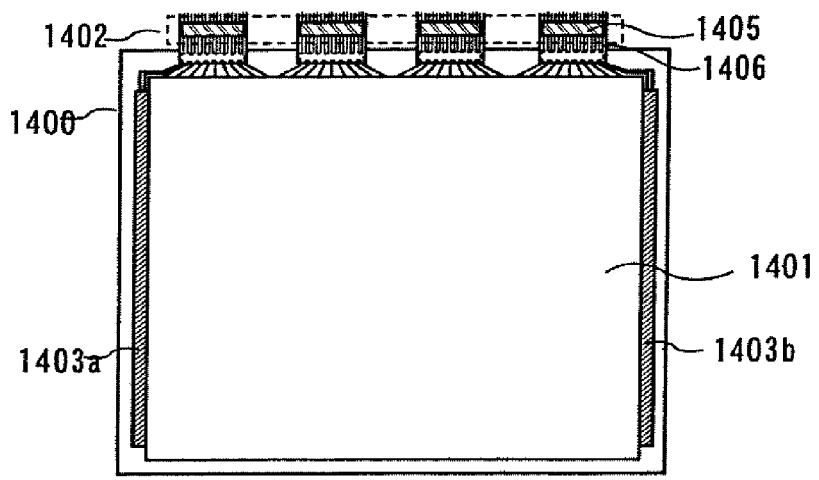

Further, as shown in FIG. 9C, a signal line driver circuit 1402 and the like may be mounted by TAB instead of COG. Each of IC chips 1405 is connected to an external circuit through the FPC 1406. In FIG. 9C, the signal line driver circuit is mounted by TAB, however, a scan line driver circuit may be mounted by TAB as well.

When the IC chips are mounted by TAB, a larger pixel portion can be provided with respect to the substrate so that a narrower frame can be achieved.

Although an IC chip is formed by using a silicon wafer, an IC formed over a glass substrate (hereinafter, referred to as a driver IC) may be provided instead of the IC chip. Since the IC chip is taken out of a circular silicon wafer, the shape of its motherboard is limited. On the other hand, the motherboard of the driver IC is glass, and there is no restriction on its shape. Therefore, higher productivity can be achieved. Therefore, the shape and size of the driver IC can be designed freely. For example, when forming the IC driver of its long side to have 15 to 80 nm, the number of driver ICs can be reduced as compared to the case of mounting IC chips. As a result, the number of connection terminals can be reduced, leading to a higher production yield.

A driver IC can be formed by using a crystalline semiconductor formed over a substrate, and the crystalline semiconductor is preferably formed by irradiating continuous wave laser light. A semiconductor film obtained by irradiation with continuous wave laser light have few crystal defects and have large crystal grains. Consequently, a transistor that has the semiconductor film described above is superior in mobility and speed of response to enable a high-speed driving. Thus, the transistor is suitable for driver ICs.

Embodiment 6

In the present embodiment, a method for mounting driver circuits (the signal line driver circuit 1402 and the scan line driver circuits 1403a and 1403b) on the display panel shown in the embodiment described above will be described with reference to FIGS. 10A to 10D. As the mounting method, a method such as a connection method using an anisotropic conducive material or a wire bonding may be employed, and some of the examples will be described here with reference to FIGS. 10A to 10D. Note that a case of using driver ICs for the signal line driver circuit 1402 and the scan line driver circuits 1403a and 1403b will be described in the embodiment. Instead of the driver ICS, IC chips may be employed appropriately.

Figure 10A:
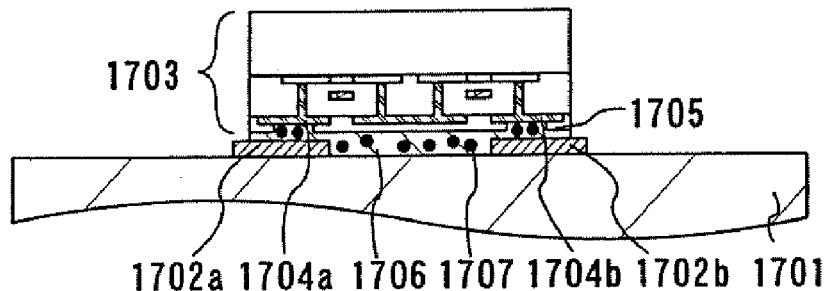
FIGS. 10A to 10D are cross-sectional views each illustrating a mounting method of a driver circuit of a display device according to the invention.

FIG. 10A illustrates an example where a driver IC 1703 is mounted on an active matrix substrate 1701 using an anisotropic conductive material. On the active matrix substrate 1701, wirings (not shown) such as a source wiring and a gate wiring, and electrode pads 1702a and 1702b as extraction electrodes of the wirings are formed.

On a surface of the driver IC 1703, connection terminals 1704a and 1704b are provided, and a protective insulating film 1705 is formed on the periphery thereof.

The driver IC 1703 is fixed on the active matrix substrate 1701 with an anisotropic conductive adhesive material 1706, and the connection terminals 1704a and 1704b are electrically connected respectively to the electrode pads 1702a and 1702b with conductive particles 1707 contained in the anisotropic conductive adhesive material 1706. The anisotropic conductive adhesive material 1706 is an adhesive resin containing dispersed conductive particles (grain diameter of about several to several hundreds μm), which typically includes an epoxy resin, a phenol resin. In addition, the conductive particles (grain diameter of about several to several hundreds μm) are formed by using one element selected from gold, silver, copper, palladium and platinum, or alloy particles containing a plurality of elements. Alternatively, particles that have a multilayer structure of these elements may be employed. Further, resin particles coated with one element selected from gold, silver, copper, palladium and platinum, or with an alloy containing a plurality of elements may be employed.

Instead of the anisotropic conductive adhesive material, an anisotropic conductive film formed in the form of a film on a base film may be transferred and used. The anisotropic conductive film also has conductive particles dispersed, which are the same as those in the anisotropic conductive adhesive material. By optimizing the size and density of the conductive particles 1707 mixed in the anisotropic conductive adhesive material 1706, the driver IC can be mounted on the active matrix substrate in this form. This mounting method is suitable for mounting the driver ICs in FIGS. 9A and 9B.

Figure 10B:
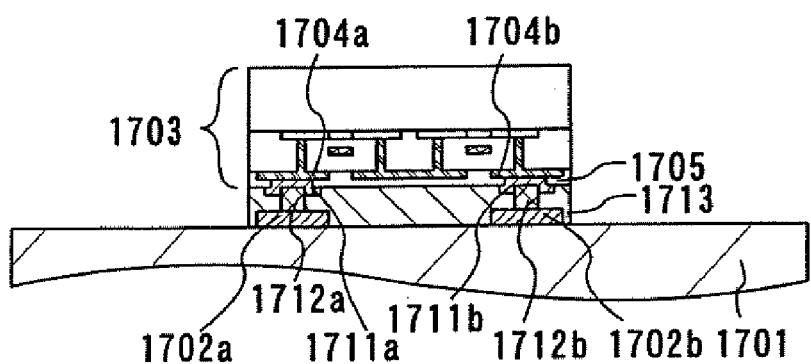

FIG. 10B illustrates an example of a mounting method utilizing contractive force of an organic resin, where buffer layers 1711a and 1711b are formed respectively on the surfaces of connection terminals 1704a and 1704b of a driver IC 1703 by using, for example, Ta or Ti, and bumps 1712a and 1712b are formed thereon by using Au with a thickness of about 20 μm by electroless plating or the like. A photo-curable insulating resin 1713 is interposed between the driver IC 1703 and an active matrix substrate 1701, and contractive force of the photo-curable resin is utilized to weld the electrodes with pressure so that the driver IC can be mounted. This mounting method is suitable for mounting the driver ICs in FIGS. 9A and 9B.

Figure 10C:
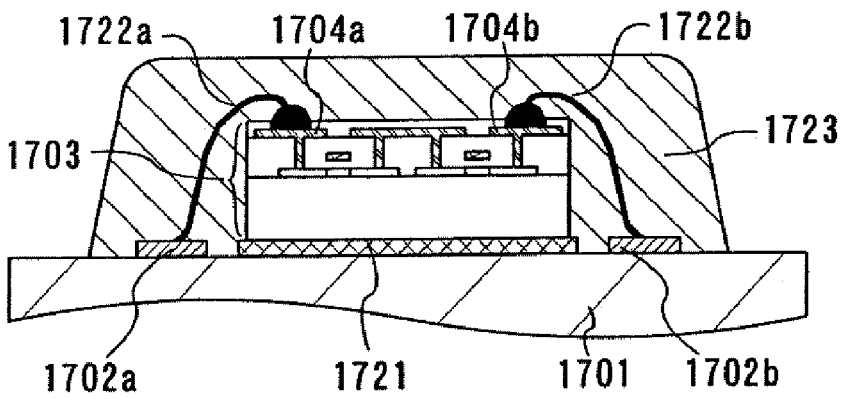

Alternatively, as shown in FIG. 10C, when a driver IC 1703 is fixed on an active matrix substrate 1701 with an adhesive material 1721, connection terminals 1704a and 1704b of a CPU may be connected to electrode pads 1702a and 1702b on the active matrix substrate through wirings 1722a and 1722b, respectively. Then, the panel is sealed with an organic resin 1723. This mounting method is suitable for the mounting method of the driver ICs in FIGS. 9A and 9B.

Figure 10D:
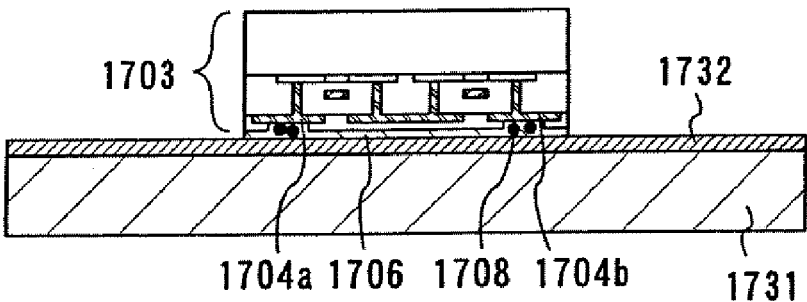

Alternatively, as shown in FIG. 10D, a driver IC 1703 may be provided over a wiring 1732 on an FPC (Flexible Printed Circuit) 1731 by interposing an anisotropic conductive adhesive material 1706 containing conductive particles 1708. This structure can be quite effectively applied to an electronic device such as a portable terminal that has a frame body limited in size. This mounting method is suitable for mounting the driver IC shown in FIG. 9C.

Note that the mounting method of an driver IC is not specifically limited, and known COG bonding, wire bonding, TAB, or reflow soldering using a solder bump may be employed. In the case of carrying out the reflow soldering, as a substrate to be used for a driver IC or an active matrix substrate, it is preferable to use a highly heat-resistant plastic, typically, a polyimide substrate, an HT substrate (manufactured by Nippon Steel Chemical Co., Ltd.), or ARTON (manufactured by JSR Corporation) comprising a norbornene resin having a polar group.

Embodiment 7

A driver circuit will be described, where a scan line driver circuit is formed over a substrate 1400, as shown in FIGS. 9B and 9C, by forming a semiconductor layer comprising SAS in the light-emitting display panel shown in Embodiment 5.

Figure 14:
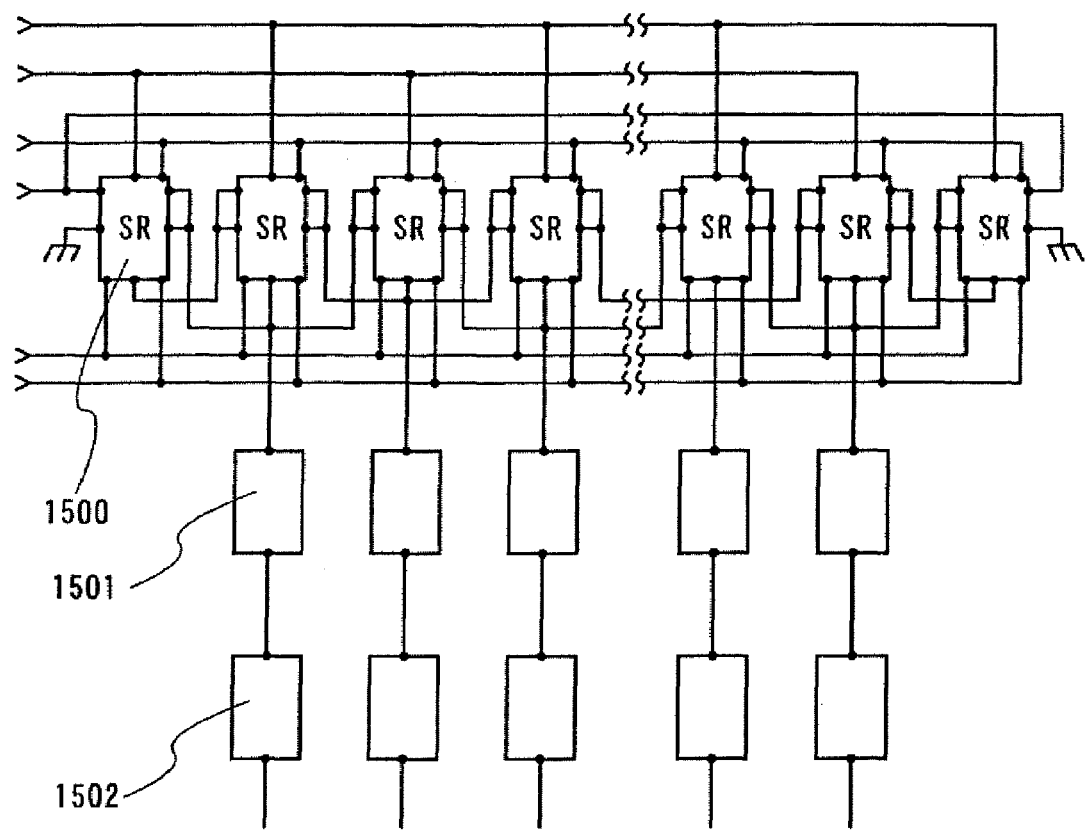
FIG. 14 is a diagram showing a circuit configuration in the case where a scan line driver circuit is formed by using TFTs in a liquid crystal display panel according to the present invention.

FIG. 14 is a block diagram illustrating a scan line driver circuit including n-channel TFTs using SAS that shows a field effect mobility of 1 to 15 cm$^2$/V·sec.

In FIG. 14, a block denoted by 1500 corresponds to a pulse output circuit that outputs sampling pulses of one stage, and a shift register includes n pulse output circuits. The output end of buffer circuits 1501 and 1502 is connected to a pixel.

Figure 15:
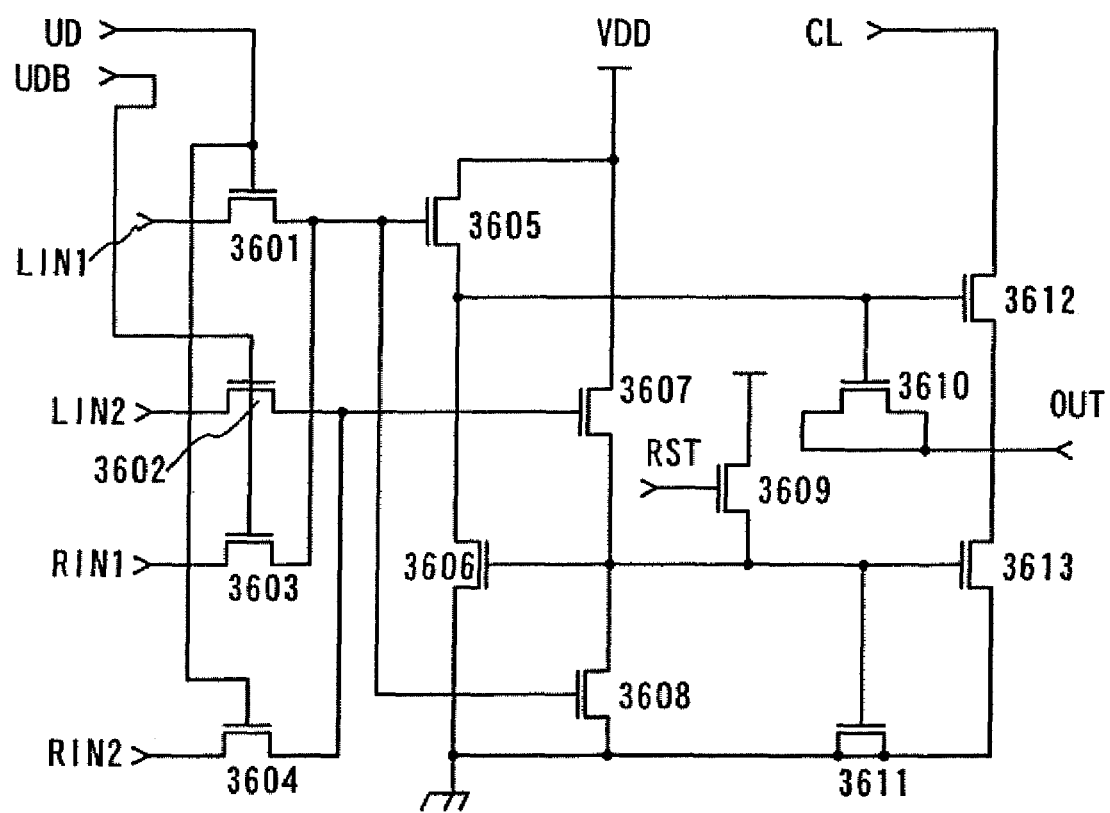
FIG. 15 is a diagram showing a circuit configuration in the case where a scan line driver circuit is formed by using TFTs in a liquid crystal display panel according to the present invention (shift register circuit)

FIG. 15 illustrates a specific configuration of the pulse output circuit 1500, which includes N-channel TFTs 3601 to 3613. The size of the TFTs may be determined in consideration of operating characteristics of the n-channel TFTs using SAS. For example, when the channel length is made to be 8 μm, the channel width can be made within the range of 10 to 80 μm.

Figure 16:
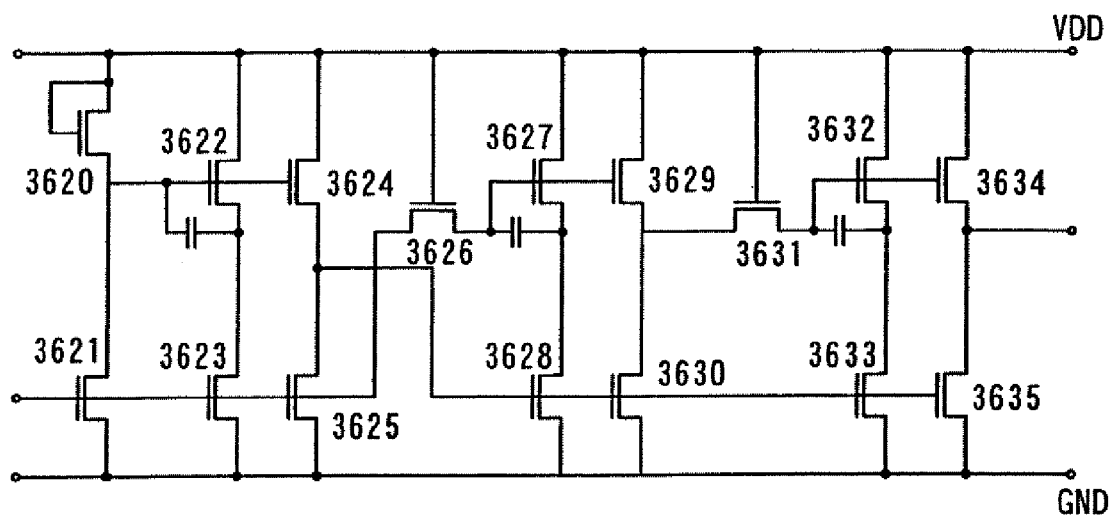
FIG. 16 is a diagram showing a circuit configuration in the case where a scan line driver circuit is formed by using TFTs in a liquid crystal display panel according to the invention (buffer circuit)

FIG. 16 illustrates a specific configuration of the buffer circuit 1501. The buffer circuit also includes n-channel TFTs 3620 to 3635. The size of the TFTs may be determined in consideration of operating characteristics of the n-channel TFTs using SAS. For example, when the channel length is made to be 10 μm, the channel width may be made within the range of 10 to 1800 μm.

Embodiment 8

Figure 26:
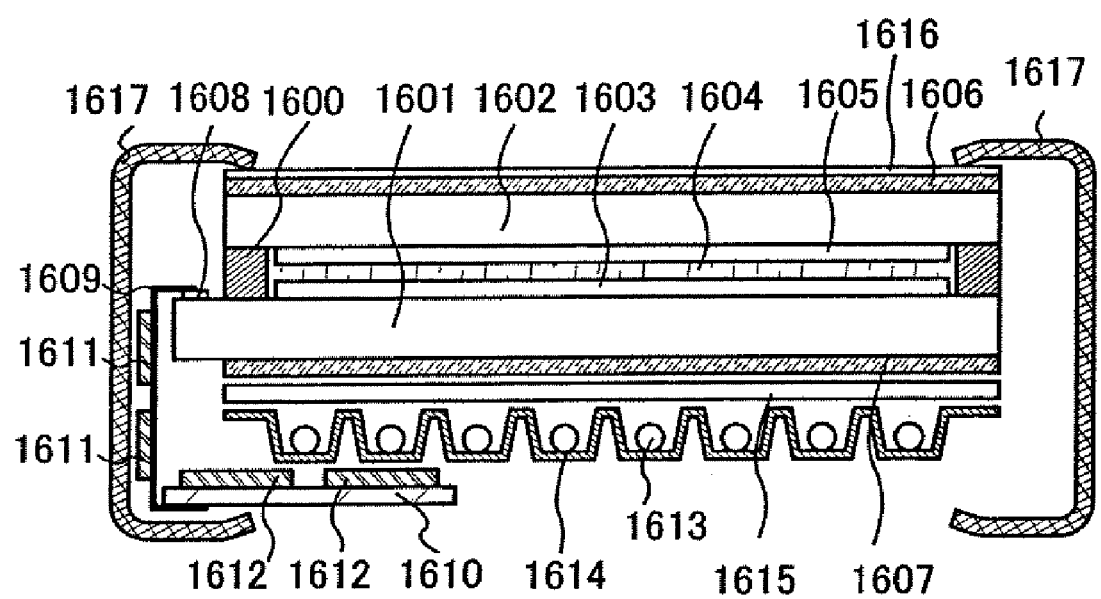
FIG. 26 is a diagram illustrating the structure of a liquid crystal display module according to the present invention.

In the present embodiment, a display module will be described. A liquid crystal module will be shown as an example of the display module with reference to FIG. 26.

An active matrix substrate 1601 is bonded to an opposed substrate 1602 with a sealing agent 1600, and a pixel portion 1603 and a liquid crystal layer 1604 are provided therebetween to form a display region.

A coloring layer 1605 is required for performing a color display. In the case of RGB, coloring layers corresponding to red, green and blue are provided to correspond respective pixels. On the outside of the active matrix substrate 1601 and the opposed substrate 1602, polarizing plates 1607 and 1606 are provided, respectively. In addition, a protective film 1616 is formed on the surface of the polarizing plate 1606 to reduce external shocks.

A connection terminal 1608 provided on the active matrix substrate 1601 is connected to a wiring board 1610 through an FPC 1609. The FPC (or connecting wiring) is provided with pixel driver circuits (for example, IC chips or driver ICs) 1611 while the wiring board 1610 is provided with incorporated external circuits 1612 such as a control circuit and a power supply circuit.

Each of a cold cathode tube 1613, a reflecting plate 1614 and an optical film 1615 is a backlight unit, and these serve as a light source to project light to the liquid crystal display panel. The liquid crystal panel, the light source, the wiring board, the FPC and the like are maintained and protected by bezels 1617.

Note that any of Embodiment Modes 1 to 10 can be applied to the embodiment.

Embodiment 9

In the present embodiment, as an example of a display module, a cross-sectional view of a light-emitting display module will be described with reference to FIGS. 35A to 35C.

Figure 35A:
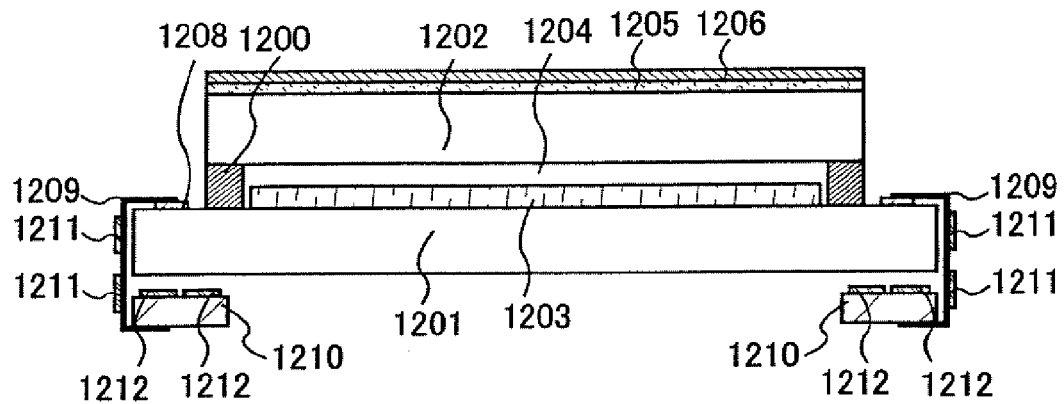
FIGS. 35A to 35C are diagrams each illustrating the structure of a light-emitting display module according to the present invention.

FIG. 35A illustrates a cross section of a light-emitting display module where an active matrix substrate 1201 is bonded to an opposed substrate 1202 with a sealing agent 1200, and a pixel portion 1203 is provided therebetween to form a display region.

Between the opposed substrate 1202 and the pixel portion 1203, a space 1204 is formed. The space may be filled with an inert gas such as a nitrogen gas or with a highly water-absorbing light-transmitting resin formed so as to further prevent penetration of moisture and oxygen. The light-transmitting resin makes it possible to form the module without decreasing the light transmissivity even when light emitted from light-emitting elements is extracted to the opposed substrate side.

In addition, in order to enhance the contrast, at least the pixel portion of the module is preferably provided with a polarizing plate or a circularly polarizing plate (polarizing plate, ¼ λ plate and ½λ plate). In the case of recognizing a displayed image from the opposed substrate 1202 side, a ¼ λ plate and ½ λ plate 1205 and a polarizing plate 1206 are preferably provided in this order on the opposed substrate 1202. Further, an anti-reflective film may be provided on the polarizing plate.

In the case of recognizing a displayed image from the both sides of the opposed substrate 1202 and the active matrix substrate 1201, it is preferable to provide a ¼ λ plate and ½ λ plate and a polarizing plate 1206 similarly also on the surface thereof.

A connection terminal 1208 provided on the active matrix substrate 1202 is connected to a wiring board 1210 through an FPC 1209. The FPC (or connecting wiring) is provided with pixel driver circuits (for example, IC chips or driver ICs) 1211 while the wiring board 1210 is provided with incorporated external circuits 1212 such as a control circuit and a power supply circuit.

Figure 35B:
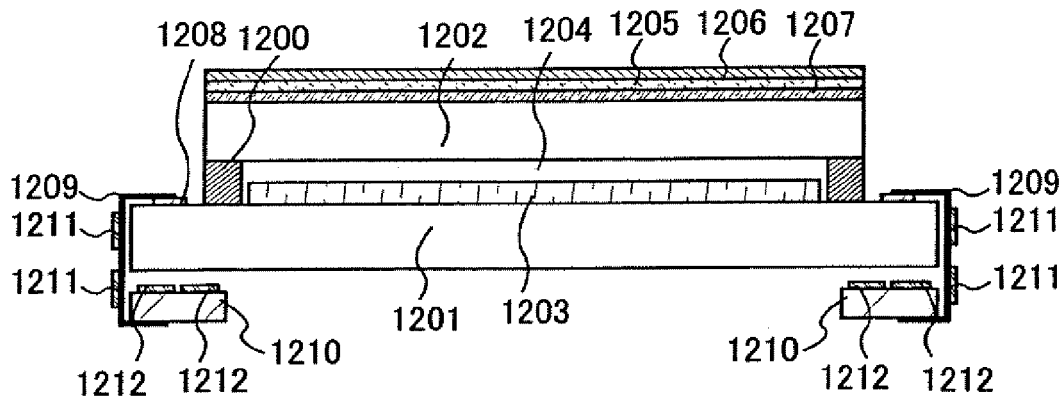

Alternatively, as shown in FIG. 35B, a coloring layer 1207 may be provided between a pixel portion 1203 and a polarizing plate or between the pixel portion and a circularly polarizing plate. In this case, by providing light-emitting elements capable of emitting white light in the pixel portion and separately providing coloring layers showing RGB, full-color display can be performed. Alternatively, by providing light-emitting elements capable of emitting blue light in the pixel portion and separately providing a layer such as a color conversion layer, full-color display can be performed. In addition, coloring layers may be used in combination with light-emitting elements that respectively show red, green and blue light emissions in the pixel portion. The display module described above has a high color purity with respect to each of RGB and thus is capable of display with high resolution.

Figure 35C:
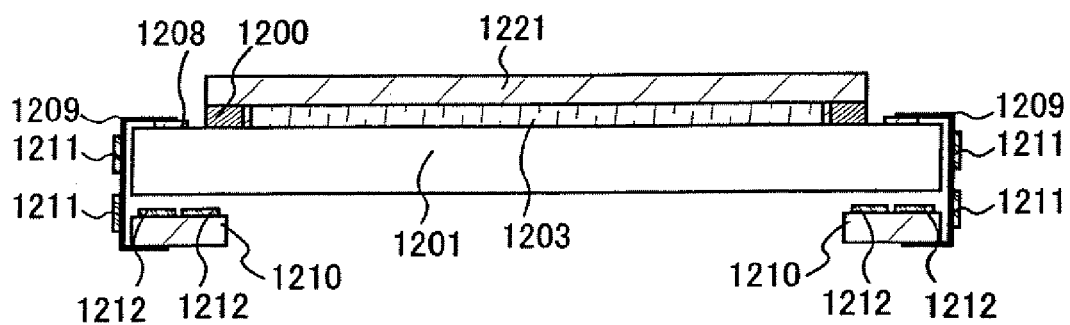

FIG. 35C illustrates an example where a protective film 1221 such as a film and a resin is used for sealing of an active matrix substrate and light-emitting elements without using an opposed substrate unlike in FIG. 35A. The protective film 1221 is provided to cover a second pixel electrode of a pixel portion 1203. For forming the protective film 1221, organic materials such as an epoxy resin, a urethane resin a silicone resin and the like can be used. The protective film 1221 may be formed by dropping a polymer material by droplet discharge. In the embodiment, an epoxy resin is discharged with the use of a dispenser, and then dried. Further, an opposed substrate may be provided on the protective film 1221. The other structure is similar to FIG. 35A.

When sealing is performed in this manner without using an opposed substrate, a display device can be more reduced in weight, size, and thickness.

In each module in the embodiment, the wiring board 1210 is mounted by using the FPC 1209. However, the invention is not limited to this structure. The pixel driver circuits 1211 and the external circuits 1212 may be directly mounted onto the substrate by COG (Chip on Glass) bonding.

Note that any of Embodiment Modes 1 to 10 may be applied to the embodiment. The liquid crystal display module and the light-emitting display module are illustrated as examples of the display module in the embodiment. However, the display module is not limited to these. For example, the invention can be appropriately applied to display modules such as a DMD (Digital Micromirror Device), a PDP (Plasma Display Panel), an EFD (Field Emission Display) and an electrophoresis display device (electronic paper).

Embodiment 10

In the present embodiment, a drying agent for the display panel shown in the embodiment described above will be described with reference to FIGS. 38A to 38C.

Figure 38A:
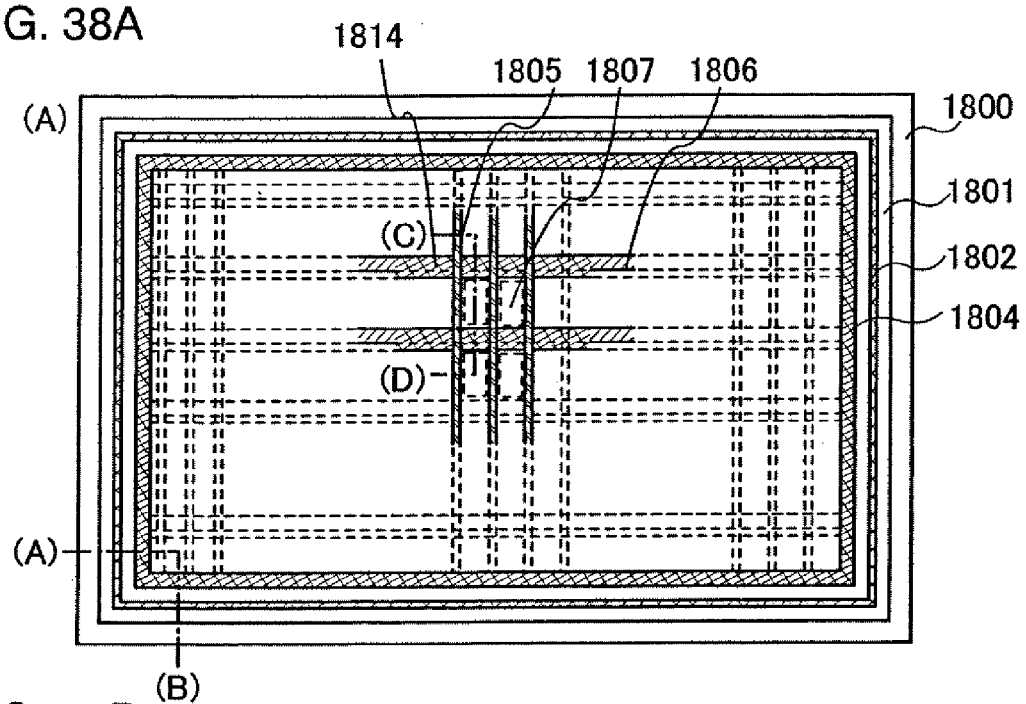
FIGS. 38A to 38C are diagrams illustrating a structure of a light-emitting display panel according to the present invention.
Figure 38B:
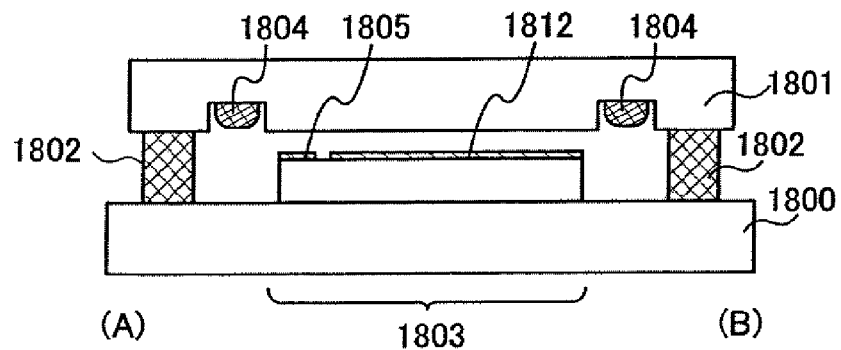
Figure 38C:
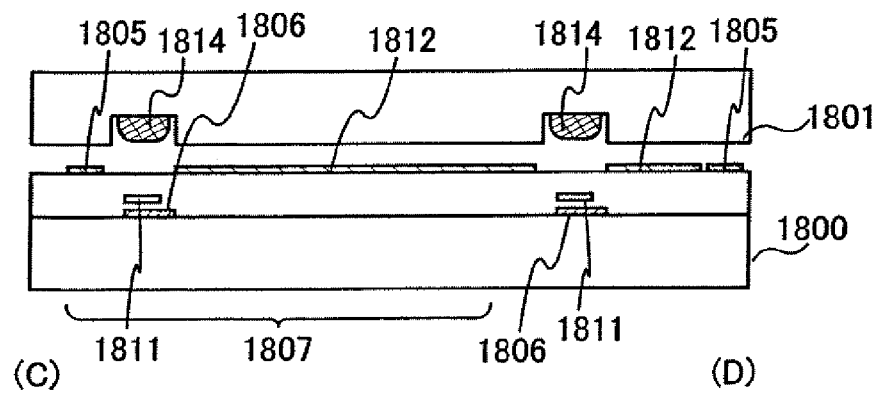

FIG. 38A illustrates a top plan view of a display panel. FIG. 38B illustrates a cross-sectional view of FIG. 38A along the line (A) to (B). FIG. 38C illustrates a cross-sectional view of FIG. 38A along the line (C)-(D).

As shown in FIG. 38A, an active matrix substrate 1800 and an opposed substrate 1801 are bonded to each other with a sealing agent 1802. Between the active matrix substrate 1800 and the counter substrate 1801, a pixel region is provided. In the pixel region, a pixel 1807 is formed in a region where a source wiring 1805 and a gate wiring 1806 cross each other. Between the pixel region and the sealing agent 1802, a drying agent 1804 is provided. Also in the pixel region, a drying agent 1814 is provided over the gate wiring 1806 or the source wiring 1805. Note that the drying agent 1814 is provided over the gate wiring 1806 here. However, the drying agent 1814 may be provided over both the gate wiring and the source wiring.

As the drying agent 1804, a substance that absorbs water ($H_2O$) by chemical absorption, for example, an oxide of an alkali earth metal such as calcium oxide (CaO) or barium oxide (BaO), is preferably used. However, the drying agent 1804 is not limited to this. A substance that absorbs water by physical absorption, such as zeolite or silica gel, may be used.

The drying agent contained in a highly moisture-permeable resin as a particulate substance may be fixed on the substrate. The highly moisture-permeable resin includes acrylic resins such as ester acrylate, ether acrylate, ester urethane acrylate, ether urethane acrylate, butadiene urethane acrylate, special urethane acrylate, epoxy acrylate, amino resin acrylate, and acrylic resin acrylate. In addition, epoxy resins can be used, such as bisphenol A liquid resin, bisphenol A hard resin, bromine-containing epoxy resin, bisphenol F resin, bisphenol AD resin, phenol resin, cresol resin, novolac resin, cycloaliphatic epoxy resin, Epi-Bis type (Epichlorohydrin-Bisphenol) epoxy resin, glycidyl ester resin, glycidyl amine resin, heterocyclic epoxy resin, and modified epoxy resin. Another substances may be employed as well. For example, an inorganic substance such as siloxane may be used.

Further, as the substance that absorbs water, a solidified composition in which molecules capable of absorbing water by chemical absorption are mixed with an organic solvent can be used as well.

Note that it is preferable to select a substance that has higher moisture permeability than the substance used as the sealing material as the highly moisture-permeable resin or inorganic substance preferably described above.

As described above, in the light-emitting device according to the invention, water penetration into the light-emitting device can be absorbed before reaching an area where light-emitting elements are formed. As a result, degradation of an element provided in a pixel, typically the light-emitting element, due to water can be suppressed.

As shown in FIG. 38B, at the peripheral portion of display panel, the drying agents 1804 are provided between the sealing agent 1802 and the pixel region 1803. In addition, by forming a depressed portion in the opposed substrate 1801 or the active matrix substrate 1800 to provide the drying agents 1804, a thinner display panel can be provided.

In addition, as shown in FIG. 38C, in the pixel 1807, a semiconductor region 1811 that is a portion of a semiconductor element for driving a display element, the gate wiring 1806, the source wiring 1805, and a pixel electrode 1812 are formed. In the pixel portion of the display panel, the drying agent 1814 in the opposed substrate 1801 is provided so as to overlap the gate wiring 1806. The gate wiring is twice to four times as wide as the source wiring. Therefore, by providing the drying agent 1814 over the gate wiring 1806 that is a non-display area, penetration of moisture into the display element and degradation due to the moisture can be suppressed without reducing the aperture ratio. Further, by forming a depressed portion in the opposed substrate 1801 to provide the drying agent 1814, a thinner display panel can be provided.

Embodiment 11

According to the invention, it is possible to form a circuit comprising highly integrated semiconductor elements that has a fine structure, typically a semiconductor device such as a signal line driver circuit, a controller, a CPU, a converter of a sound processing circuit, a power supply circuit, a transmitting/receiving circuit, a memory, or an amplifier of a sound processing circuit. Further, a system-on-chip capable of high-speed driving with high reliability and low power consumption can be provided, where circuits constituting one system (functional circuit) such as an MPU (micro processor unit), a memory, and an I/O interface are mounted to be monolithic.

Embodiment 12

Figure 12:
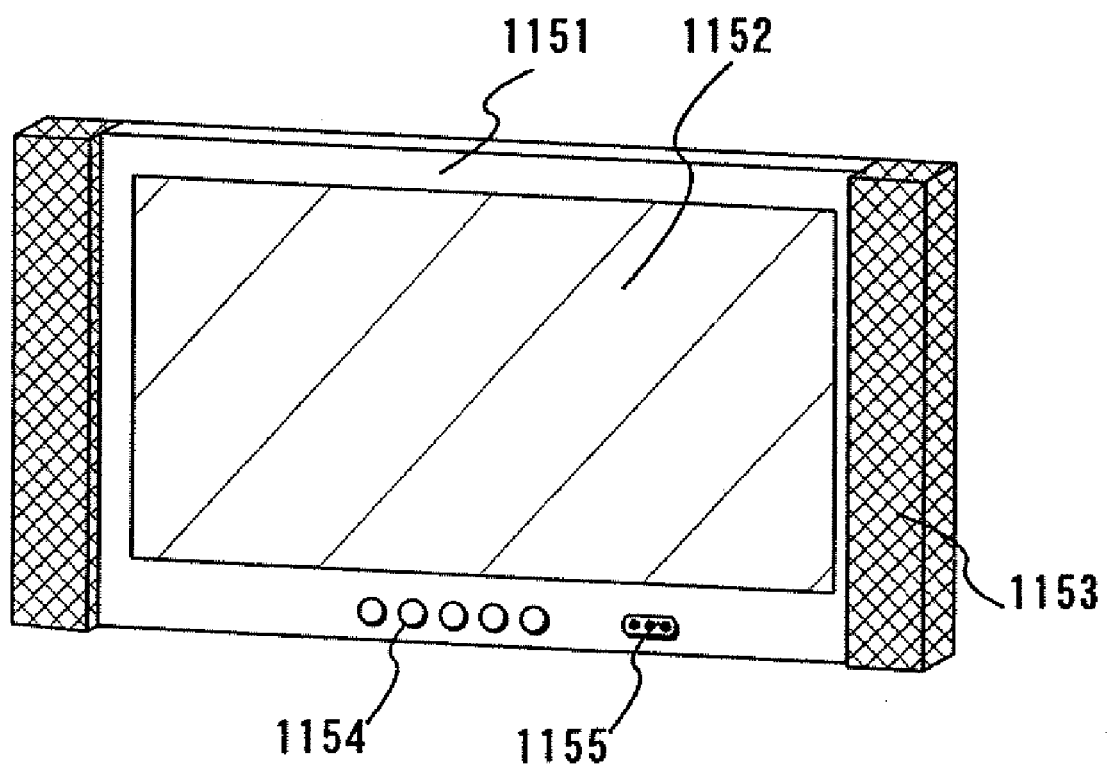
FIG. 12 is a diagram illustrating an example of an electronic device.
Figure 13A:
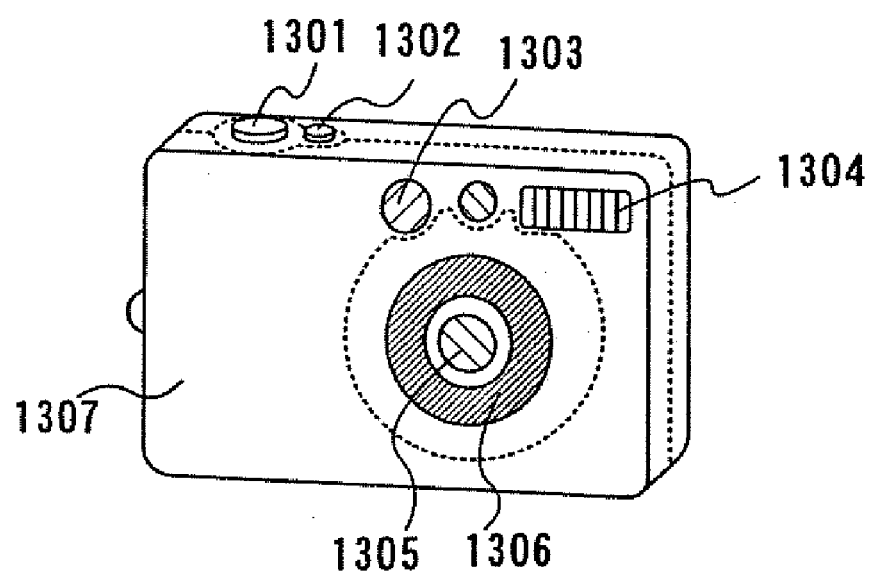
FIGS. 13A and 13B are views illustrating an example of an electronic device.
Figure 13B:
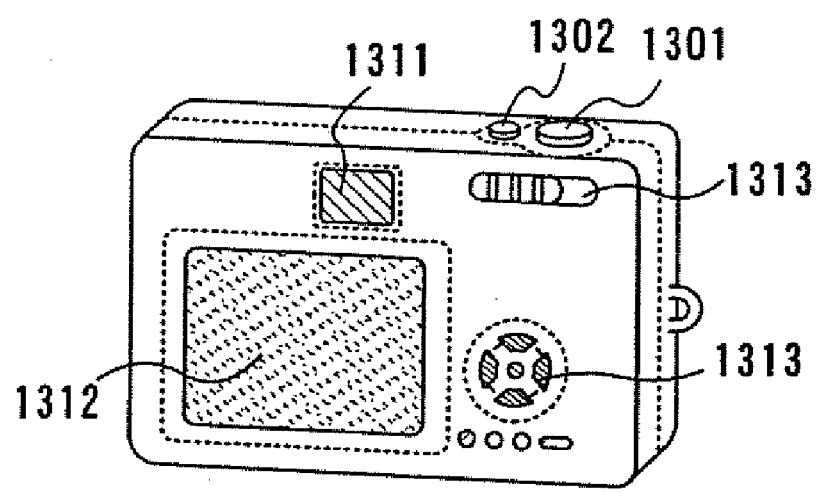

By incorporating the semiconductor device described in the embodiment described above into a housing, various electronic devices can be manufactured. The electronic devices include television systems, video cameras, digital cameras, goggle type displays (head mounted displays), navigation systems, sound reproducing devices (for example, a car audio and a component stereo set), laptop personal computers, game machines, portable information terminals (for example, mobile computers, portable phones, portable game machines, electronic books), an image reproducing device provided with a recording medium (specifically, a device capable of reproducing a recording medium such as a DVD, Digital Versatile Disc, which has a display portion capable of displaying the reproduced image). As typical examples of these electronic devices, FIGS. 11 and 12 illustrate a television system and a block diagram thereof, and FIGS. 13A and 13B illustrate a digital camera.

Figure 11:
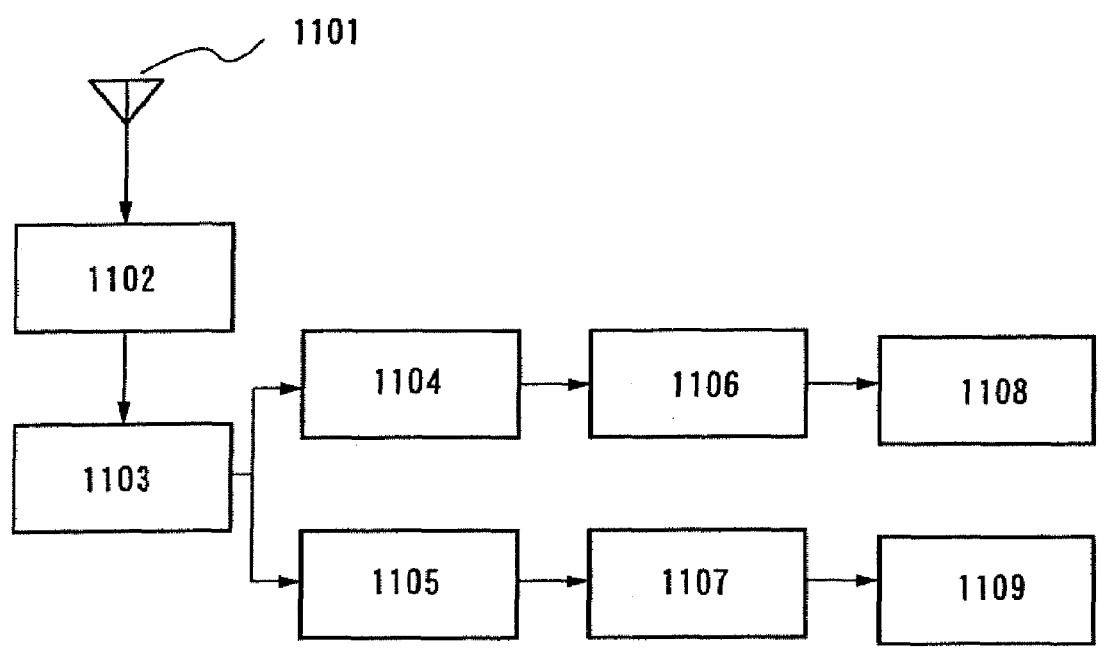
FIG. 11 is a block diagram illustrating the configuration of an electronic device.

FIG. 11 illustrates a diagram illustrating a typical configuration of a television system for receiving analog television broadcast. In FIG. 11, a radio wave received by an antenna 1101 for television broadcast is input to a tuner 1102. The tuner 1102 mixes the high frequency television signal input from the antenna 1101 with a signal with a local oscillation frequency controlled in accordance with a desired receiver frequency so as to generate and output an intermediate frequency (IF) signal.

The IF signal output from the tuner 1102 is amplified to a required voltage by an intermediate frequency amplifier (IF amplifier) 1103, and then detected for an image by an image detection circuit 1104 while detected for a sound by a sound detection circuit 1105. The image signal output from the image detection circuit 1104 is divided into a luminance signal and a color signal by an image signal processing circuit 1106, further subjected to a predetermined image signal processing to become an image signal, and output to an image signal output portion 1108 of a display device using the semiconductor device according to the invention, typically such as a liquid crystal display device, a light-emitting display device, a DMD (Digital Micromirror Device), a PDP (Plasma Display Panel), an FED (Field Emission Display), or an electrophoresis display device (electronic paper). Note that the television system is a liquid crystal television system when a liquid crystal display device is used as the display device while the television system is an EL television system when a light-emitting display device is used. The same applies to the case of using the other display devices.

The signal output from the sound detection circuit 1105 is processed (for example, FM modulation) by a sound signal processing circuit 1107 to be a sound signal, and the sound signal is appropriately amplified and output to a sound signal output portion 1109 such as a speaker.

Note that the television system using the invention is not limited to a television system for analog broadcasting such as ground-based broadcasting using a VHF bandwidth, an UHF bandwidth and the like, cable television broadcasting, or BS broadcasting, but can be a television system for digitalized terrestrial broadcasting, cable digital broadcasting, or BS digital broadcasting.

FIG. 12 illustrates a perspective view seen from the front of the television system, which includes a housing 1151, a display portion 1152, a speaker portion 1153, an operating portion 1154, and a video input terminal 1155, and has the configuration as shown in FIG. 11.

The display portion 1152 is an example of the image signal output portion 1108 in FIG. 11 for displaying images.

The speaker 1153 is an example of the sound signal output portion in FIG. 11 for outputting sound.

The operating portion 1154 includes a power switch, a volume switch, a channel select switch, a tuner switch, and a selection switch. By pushing the buttons, power ON/OFF of the television system, image selection, sound control, tuner selection and the like are performed. Note that, although not shown, the operations described above can also be preformed by a remote controller.

The video input terminal 1155 is a terminal for inputting image signals from an outside such as a VTR, a DVD or a game machine.

When the television system shown in the present embodiment is a wall-hung television system, a lifting hook is provided on the back of the main body.

By using a display device as an example of the semiconductor device according to the invention for a display portion of a television system, the television system can be manufactured at low cost with high throughput and yield. In addition, by using the semiconductor device according to the invention for a CPU that controls an image detection circuit, an image signal processing circuit, a sound detection circuit and a sound processing circuit of a television system, the television system can be manufactured at low cost with high throughput and yield. Thus, the invention can be applied to various fields, particularly to large-area display mediums, such as a wall-hung television system, an information display board at the train station or the airport and an advertising board on the street.

FIGS. 13A and 13B are diagrams illustrating an example of digital cameras. FIG. 13A is a perspective view of the digital camera seen from the front while FIG. 13B is a perspective view thereof seen from the back. The digital camera shown in FIG. 13A includes a release button 1301, a main switch 1302, a finder window 1303, a stroboscope 1304, a lens 1305, a camera cone 1306 and a housing 1307.

In addition, as shown in FIG. 13B, the digital camera includes a finder eyepiece window 1311, a monitor 1312 and operating buttons 1313.

When the release button 1301 is pressed to the half position, a focus adjusting assembly and an exposure adjusting assembly operate, and a shutter opens when the release button 1301 is pressed to the bottom position.

By pressing or rotating the main switch 1302, power ON/OFF of the digital camera is switched.

The finder window 1303 is disposed at a portion upper than the lens 1305 on the front of the digital camera, and used for checking a shooting range and a focus position from the finder eyepiece window 1311 shown in FIG. 13B.

The stroboscope 1304 is disposed at an upper front portion of the digital camera. When the luminance of a subject is low, fill light is radiated while the release button 1301 is pressed to open the shutter.

The lens 1305 is disposed on the front of the digital camera. The lens includes a focusing lens and a zoom lens to constitute a shooting optical system along with the shutter and an aperture that are not shown. In addition, an image sensor such as a CCD (Charge Coupled Device) is provided posteriorly in the lens.

The camera corn 1306 is provided to move the lens for adjusting the focus of the focusing lens, the zoom lens, and the like. When shooting an image, the lens 1305 is moved forward by sending out the camera cone 1306. When carried, the lens 1305 is stowed for compactness. In this embodiment, the configuration is employed, where a subject can be shot by zooming with the camera cone being sent out. However, the digital camera is not limited to this configuration. The invention may be applied to a digital camera capable of shooting an image by zooming according to the structure of the shooting optical system in the housing 1307 without sending out the camera.

The finder eyepiece window 1311 is provided on an upper back portion of the digital camera, and used for looking into when a shooting range and a focus position are checked.

The operating buttons 1313 are multifunctional buttons provided on the back of the digital camera, which include a set-up button, a menu button, a display button, a function button, and a selection button.

By using a display device for a monitor as one embodiment of the semiconductor device according to the invention, a digital camera can be manufactured at low cost with high throughput and yield. In addition, a digital camera can be manufactured at low cost with high throughput and high yield by using the semiconductor device according to the invention for a CPU that performs processing in conjunction with input by operation of a multifunctional button, a main switch, a release button, and the like, and a CPU that controls a circuit that performs auto focusing operation and auto focus adjusting operation, a timing control circuit that controls driving of stroboscopic light and CCD, an image pick-up circuit that generates a image signal from a signal photoelectrically converted by an image sensor such as a CCD, an A/D converter circuit that converts a image signal generated in an image pick-up circuit into a digital signal, and a memory interface that writes image data in a memory and reads image data from a memory, and the like.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method for manufacturing a semiconductor device, comprising the steps of:
    forming a semiconductor film over a substrate;
        forming a film with a liquid-repellent surface over the semiconductor film;
        forming a first region with a liquid-attracting surface and a second region with a liquid-repellent surface by irradiating the film with the liquid-repellent surface with laser light; and
        forming an insulating film over the region with the liquid-attracting surface.

2. A method for manufacturing a semiconductor device, comprising the steps of:
    forming a first conductive layer over a substrate;
    forming a gate insulating film over the first conductive layer;
    forming a semiconductor film over the first semiconductor film;
        forming a film with a liquid-repellent surface over the semiconductor film;
        forming first regions with liquid-attracting surfaces and a second region with a liquid-repellent surface by irradiating the film with the liquid-repellent surface with laser light;
        forming a mask pattern over the first regions with the liquid-attracting surfaces; and
    etching the semiconductor film and the second region with the liquid-repellent surface by using the mask pattern as a mask.

3. A method for manufacturing a semiconductor device, comprising the steps of:
    forming a first conductive layer over a substrate;
    forming a first insulating film over the first conductive layer;
    forming a semiconductor film over the first semiconductor film;
        forming a film with a liquid-repellent surface over the semiconductor film;
        forming first regions with liquid-attracting surfaces and a second region with a liquid-repellent surface by irradiating the film with the liquid-repellent surface with laser light; and
    forming a second insulating film over the region with the liquid-attracting surface,
    wherein the second region with the liquid-repellent surface is formed between the first regions with the liquid-attracting surfaces, and
    wherein the second region with the liquid-repellent surface repels the second insulating film.

4. The method for manufacturing a semiconductor device according to claim 1, wherein the film with the liquid-repellent surface comprises a silane coupling agent.

5. The method for manufacturing a semiconductor device according to claim 2, wherein the film with the liquid-repellent surface comprises a silane coupling agent.

6. The method for manufacturing a semiconductor device according to claim 3, wherein the film with the liquid-repellent surface comprises a silane coupling agent.

7. The method for manufacturing a semiconductor device according to claim 1, further comprising:
    washing the film with the liquid-repellent surface by using ethanol.

8. The method for manufacturing a semiconductor device according to claim 2, further comprising:
    washing the film with the liquid-repellent surface by using ethanol.

9. The method for manufacturing a semiconductor device according to claim 3, further comprising:
washing the film with the liquid-repellent surface by using ethanol.

10. The method for manufacturing a semiconductor device according to claim 1, wherein the insulating film comprises a heat-resistant polymer material.

11. The method for manufacturing a semiconductor device according to claim 2, wherein the mask pattern comprises a heat-resistant polymer material.

12. The method for manufacturing a semiconductor device according to claim 3, wherein the second insulating film comprises a heat-resistant polymer material.

13. The method for manufacturing a semiconductor device according to claim 1, wherein the semiconductor device is a channel etch type TFT.

14. The method for manufacturing a semiconductor device according to claim 2, wherein the semiconductor device is a channel etch type TFT.

15. The method for manufacturing a semiconductor device according to claim 3, wherein the semiconductor device is a channel etch type TFT.

* * * * *

UNITED STATES PATENT AND TRADEMARK OFFICE
CERTIFICATE OF CORRECTION

PATENT NO. : 7,776,667 B2
APPLICATION NO. : 12/044658
DATED : August 17, 2010
INVENTOR(S) : Shunpei Yamazaki et al.

It is certified that error appears in the above-identified patent and that said Letters Patent is hereby corrected as shown below:

In the Specification,

Col. 8, line 33, "diameter is 0.1 μm or less be composition" should read "diameter is 0.1 μm or less. The composition"

Col. 23, line 29, "the beads 1903a" should read "the heads 1903a"

Col. 26, line 40, "(H, 1.8%, N:2.6%, O:63.9%" should read "(H: 1.8%, N:2.6%, O:63.9%"

Col. 27, line 37, "baked by beating at 230°C" should read "baked by heating at 230°C"

Col. 30, line 55, "oxynitride film (H, 1.8%, N: 2.6%" should read "oxynitride film (H: 1.8%, N: 2.6%"

Col. 33, line 56, "perform beat treatment at temperatures" should read "perform heat treatment at temperatures"

Col. 34, line 24, "(abbreviated as TPD)" should read "(abbreviated as TPD),"

Col. 34, lines 49, "B (blue) is formed in this case, color purity can be" should read "B (blue) is formed. In this case, color purity can be"

Col. 39, lines 31-32, "each layer has thickness of 100 mm or less" should read "each layer has thickness of 100 nm or less"

Col. 40, lines 12-13, "light-emitting element 705, Namely, a current value" should read "light-emitting element 705. Namely, a current value"

Col. 42, line 35, "Instead of the driver ICS" should read "Instead of the driver ICs"

Signed and Sealed this
Third Day of July, 2012

David J. Kappos
*Director of the United States Patent and Trademark Office*

Col. 46, lines 55-56, "drying agents 1804 are provided between the scaling agent 1802" should read
"drying agents 1804 are provided between the sealing agent 1802"